(12) United States Patent
Yamazaki et al.

(10) Patent No.: US 7,807,483 B2
(45) Date of Patent: Oct. 5, 2010

(54) METHOD FOR MANUFACTURING DISPLAY DEVICE

(75) Inventors: Shunpei Yamazaki, Tokyo (JP); Koichiro Tanaka, Kanagawa (JP); Hironobu Shoji, Tokyo (JP); Hirotada Oishi, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 559 days.

(21) Appl. No.: 11/880,948

(22) Filed: Jul. 25, 2007

(65) Prior Publication Data

US 2008/0227232 A1    Sep. 18, 2008

(30) Foreign Application Priority Data

Jul. 28, 2006    (JP)    .............. 2006-205716

(51) Int. Cl.
    *H01L 21/00*    (2006.01)
(52) U.S. Cl. .................. 438/29; 438/30; 438/642
(58) Field of Classification Search .................. 438/29, 438/30, 642, 652, 637, 636
    See application file for complete search history.

(56) References Cited

U.S. PATENT DOCUMENTS

| | | | |
|---|---|---|---|
| 4,594,471 A | 6/1986 | Yamazaki | |
| 4,603,470 A | 8/1986 | Yamazaki | |
| 4,861,964 A | 8/1989 | Sinohara | |
| 5,708,252 A | 1/1998 | Shinohara et al. | |
| 6,149,988 A | 11/2000 | Shinohara et al. | |
| 6,261,856 B1 | 7/2001 | Shinohara et al. | |
| 7,176,069 B2 | 2/2007 | Yamazaki et al. | |
| 7,199,516 B2 | 4/2007 | Seo et al. | |
| 7,202,155 B2 | 4/2007 | Fukuchi | |
| 7,226,819 B2 | 6/2007 | Maekawa et al. | |
| 7,462,514 B2 | 12/2008 | Shiroguchi et al. | |
| 2005/0043186 A1 | 2/2005 | Maekawa et al. | |

(Continued)

FOREIGN PATENT DOCUMENTS

| | | |
|---|---|---|
| CN | 1700417 A | 11/2005 |
| CN | 1797717 A | 7/2006 |
| JP | 2000-133636 | 5/2000 |
| JP | 2002-164591 | 6/2002 |

OTHER PUBLICATIONS

Office Action re Chinese application No. CN 200710137129.7, dated Mar. 5, 2010 (with English translation).

*Primary Examiner*—Kevin M Picardat
(74) *Attorney, Agent, or Firm*—Husch Blackwell Sanders LLP

(57) ABSTRACT

An object is to provide a display device that can be manufactured by improvement of use efficiency of a material and simplification of a manufacturing process. A light absorbing layer is formed, an insulating layer is formed over the light absorbing layer, the light absorbing layer and the insulating layer are selectively irradiated with laser light, an irradiated region in the insulating layer is removed to form an opening in the insulating layer, and a conductive film is formed in the opening so as to be in contact with the light absorbing layer. The conductive film is formed in the opening so as to be in contact with the light absorbing layer, which is exposed, so that the light absorbing layer and the conductive layer can be electrically connected with the insulating layer interposed therebetween.

14 Claims, 33 Drawing Sheets

U.S. PATENT DOCUMENTS

| | | |
|---|---|---|
| 2006/0116000 A1 | 6/2006 | Yamamoto |
| 2006/0158482 A1 | 7/2006 | Nakamura et al. |
| 2006/0270175 A1 | 11/2006 | Aoki et al. |
| 2007/0007515 A1* | 1/2007 | Suh et al. .................. 257/40 |
| 2007/0051952 A1 | 3/2007 | Yamazaki et al. |
| 2009/0114922 A1 | 5/2009 | Shiroguchi et al. |

* cited by examiner 720  722  721

723

727a  725  727b

726

700, 702, 709, 701

703

707a, 705, 707b

706

300 302 309a 309b 309c 301

L1
303

307a  305  307b
L2

306

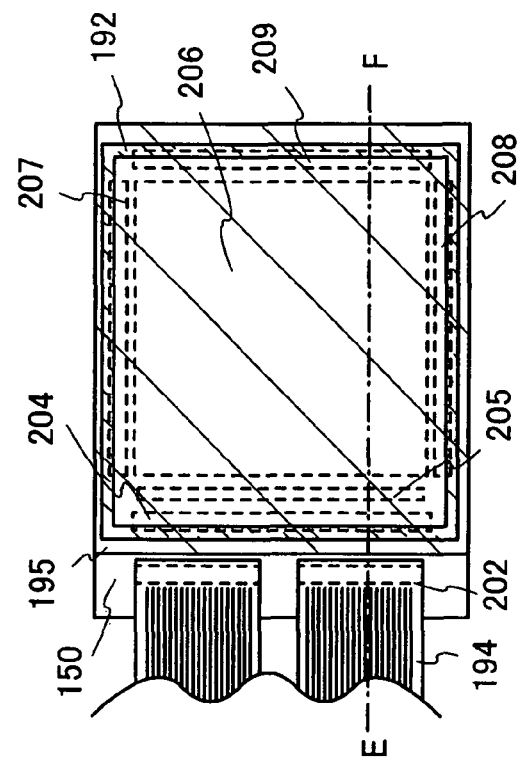
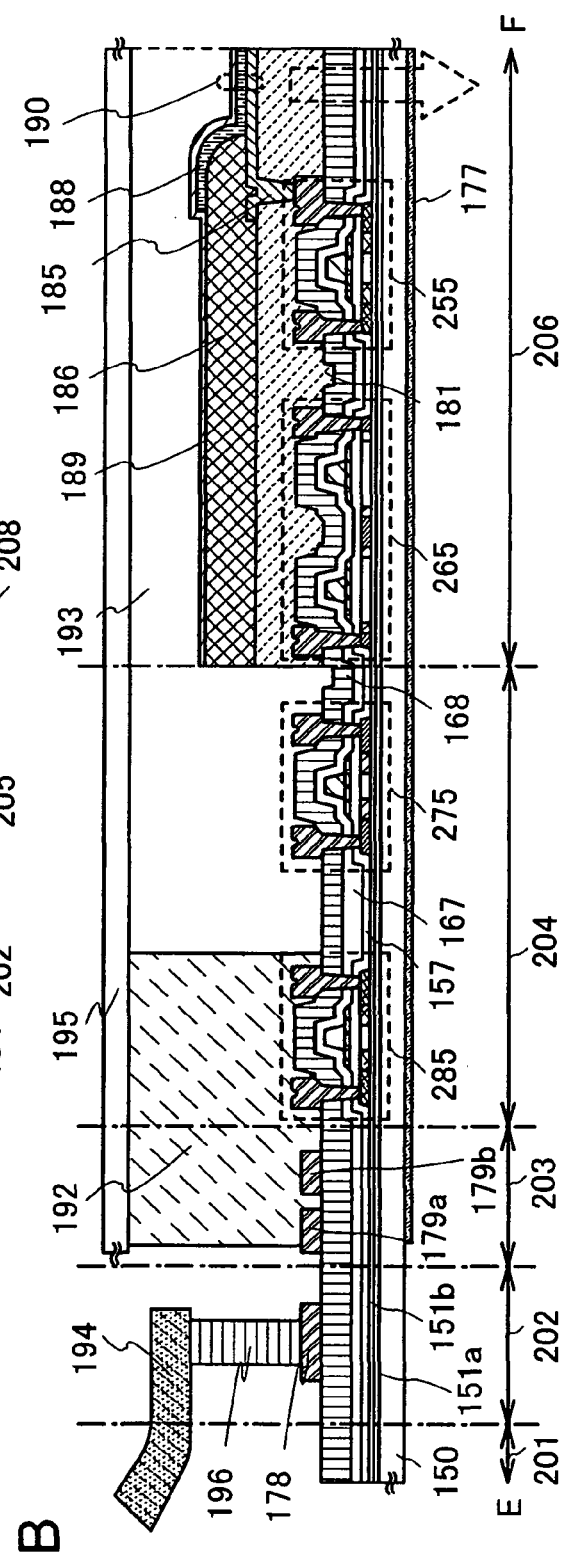
FIG. 15A
FIG. 15B

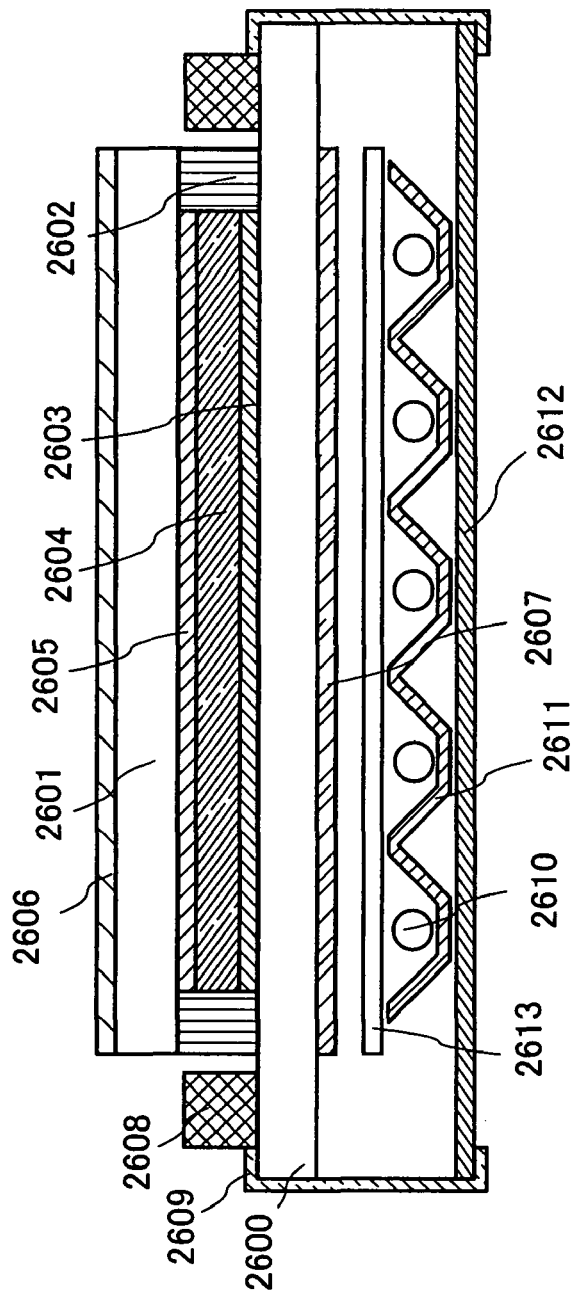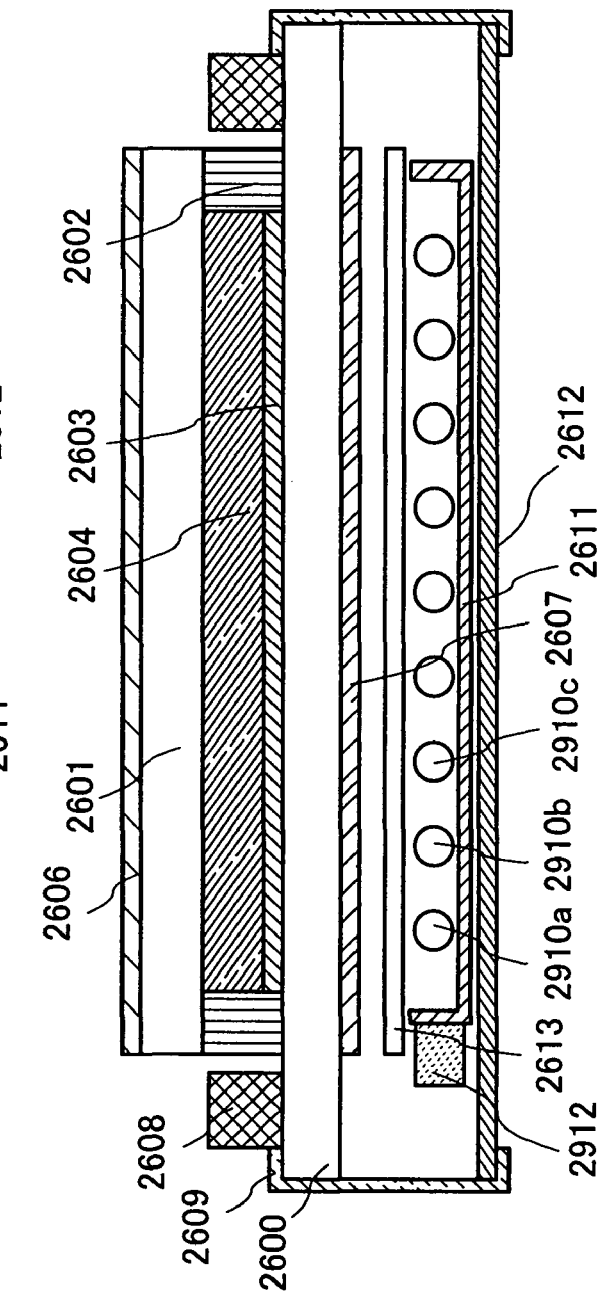

METHOD FOR MANUFACTURING DISPLAY DEVICE

BACKGROUND OF THE INVENTION

1. Field of the Invention

The present invention relates to a method for manufacturing a display device having a stacked-layer structure of thin films, and specifically relates to a processing step of forming a hole in a thin film in a process of manufacturing a display device.

2. Description of the Related Art

Thin film transistors (hereinafter also referred to as TFTs) and an electronic circuit using a thin film transistor are manufactured by stacking of thin films such as semiconductor films, insulating films, or conductive films over a substrate and forming a predetermined pattern as appropriate by a photolithography technique. A photolithography technique is a technique for transferring a pattern of a circuit or the like, which is formed from a light-blocking material on a surface of a transparent planar plate, which is called a photomask, onto a target substrate by utilization of light, and it has been generally used in manufacturing processes for a semiconductor integrated circuit and the like.

A conventional manufacturing process using a photolithography technique requires multiple steps such as exposure, development, baking, and removing even just for processing a mask pattern which is formed with the use of a photosensitive organic resin material that is referred to as a photoresist. Therefore, as the number of the photolithography steps increases, the manufacturing cost inevitably increases. In order to solve this problem, attempts have been made to manufacture TFTs using a smaller number of photolithography steps (for example, see Patent Document 1: Japanese Published Patent Application No. 2000-133636). In Patent Document 1, after a resist mask formed by photolithography steps is used once, it is swelled so that its volume expands and then used again as a resist mask having a different shape.

SUMMARY OF THE INVENTION

It is an object of the present invention to provide a technique of manufacturing a TFT, an electronic circuit using the TFT, or a display device formed using the TFT, in which the number of photolithography steps is reduced and thereby the manufacturing process is simplified, so that manufacture with a high yield at low cost is possible, even when a large substrate having a side of longer than 1 meter is used.

In the present invention, in the case where thin films (conductive layers or semiconductor layers) stacked with an insulating layer interposed therebetween are electrically connected to each other, an opening (which serves as a so-called contact hole) is formed in the insulating layer. In this case, a mask layer is not formed over the insulating layer, and an opening is selectively formed by irradiation with laser light. After a light absorbing layer having a function of absorbing irradiation light is formed and an insulating layer is stacked over the light absorbing layer, a region of a stack including the light absorbing layer and the insulating layer, in which an opening is to be formed, is selectively irradiated with laser light from the insulating layer side. Although laser light transmits through the insulating layer, it is absorbed by the light absorbing layer. The light absorbing layer is heated by energy of the absorbed laser light and damages the insulating layer stacked thereover. Accordingly, an opening is formed in the insulating layer, and the light absorbing layer below the insulating layer at the bottom of the opening is exposed.

In the case where the light absorbing layer is formed using a conductive material such as a conductive layer using a conductive material or a semiconductor layer using a semiconductor material, by formation of a conductive layer in the opening so as to be in contact with the exposed light absorbing layer, the light absorbing layer and the conductive layer can be electrically connected to each other with the insulating layer interposed therebetween. Specifically, in the present invention, an opening is formed in the insulating layer over a region irradiated with laser light of the light absorbing layer by irradiating the light absorbing layer functioning as a conductive layer or a semiconductor layer with laser light, thereby causing laser ablation.

Since the opening can be selectively formed by laser light, it is not necessary to form a mask layer; therefore, the steps and materials can be reduced. In addition, there are advantages that an insulating layer to be processed can be formed into a predetermined shape with high precision since the laser light can be condensed into an extremely small spot, and the regions other than the processing region is not necessary to be heated substantially since heating is performed instantaneously and for a short time.

Further, a conductive layer, a semiconductor layer, or the like used in processing a thin film into a predetermined pattern is selectively formed so as to have a predetermined shape without the use of a photolithography process. A light absorbing film such as a conductive film or a semiconductor film is formed over a light-transmitting transfer substrate and laser light is selectively irradiated from the transfer substrate side, so that the light absorbing film corresponding a region irradiated with laser light is transferred to a substrate to which a light absorbing layer is transferred and the conductive layer or the semiconductor layer which is the light absorbing layer is formed into a desired shape (pattern). In this specification, a transfer substrate refers to a substrate over which a conductive film or a semiconductor film which is a light absorbing film is formed in a first step and then laser light is irradiated, and a substrate to which a light absorbing layer is transferred refers to a substrate over which a conductive layer or a semiconductor layer which is a light absorbing layer is selectively formed in a last step. A conductive layer, a semiconductor layer, or the like can be selectively formed so as to have a desired shape without using a photolithography process. Therefore, simplification of the process, cost reduction, and the like can be achieved.

According to one mode of a method for manufacturing a display device of the present invention, a light absorbing layer is formed, an insulating layer is formed over the light absorbing layer, the light absorbing layer and the insulating layer are selectively irradiated with laser light, an irradiated region in the insulating layer is removed to form an opening in the insulating layer, and a conductive film is formed in the opening so as to be in contact with the light absorbing layer.

According to one mode of a method for manufacturing a display device of the present invention, a conductive layer is formed, a light absorbing layer is formed over the conductive layer, an insulating layer is formed over the light absorbing layer, the light absorbing layer and the insulating layer are selectively irradiated with laser light, an irradiated region in the insulating layer is removed to form an opening in the insulating layer, and a conductive film is formed in the opening so as to be in contact with the light absorbing layer.

The light absorbing layer formed in the above description is only necessary to absorb irradiation laser light. It can be a conductive layer in the case of using a conductive material and can be a semiconductor layer in the case of using a semiconductor material. The light absorbing layer can be used as any conductive layer or semiconductor layer included in the display device. For example, the conductive layer can be used for a wiring layer, a gate electrode layer, a source electrode layer, a drain electrode layer, a pixel electrode layer, or the like.

In the above structure, a conductive material may be used as the light absorbing layer. For example, one or a plurality of chromium, tantalum, silver, molybdenum, nickel, titanium, cobalt, copper, and aluminum can be used to form the light absorbing layer. Alternatively, a semiconductor material may be used as the light absorbing layer. For example, an inorganic semiconductor material such as silicon, germanium, silicon germanium, gallium arsenic, molybdenum oxide, tin oxide, bismuth oxide, vanadium oxide, nickel oxide, zinc oxide, gallium arsenide, gallium nitride, indium oxide, indium phosphide, indium nitride, cadmium sulfide, cadmium telluride, or strontium titanate may be used. Hydrogen or an inert gas (helium (He), argon (Ar), krypton (Kr), neon (Ne), xenon (Xe), or the like) may be added to the light absorbing layer. The insulating layer in which an opening is formed can be formed using a laser light-transmitting material such as an inorganic insulating material having a light-transmitting property or an organic resin.

The present invention can also be applied to a display device that is a device having a display function. A display device using the present invention may be a light-emitting display device in which a light-emitting element including a layer containing an organic material, an inorganic material, or a mixture of an organic material and an inorganic material which produces light emission called electroluminescence (hereinafter also referred to as EL) between electrodes is connected to a TFT; a liquid crystal display device using a liquid crystal element containing a liquid crystal material as a display element; or the like. In the present invention, a display device corresponds to a device including a display element (a liquid crystal element, a light-emitting element, or the like). It is to be noted that a display device may be a main body of a display panel in which a plurality of pixels including display elements such as liquid crystal elements or EL elements and a peripheral driver circuits for driving the pixels are formed over a substrate. Further, a display device may be the one provided with a flexible printed circuit (FPC) or a printed wiring board (PWB) (an IC, a resistor, a capacitor, an inductor, a transistor, or the like). Moreover, a display device may include an optical sheet such as a polarizing plate or a retardation film. In addition, a backlight (such as a light guide plate, a prism sheet, a diffusion sheet, a reflection sheet, a light source (an LED, a cold-cathode tube, or the like)) may be included.

Note that various modes can be applied to a display element and a display device, and they can have various elements. For example, a display medium in which contrast is changed by an electromagnetic effect can be used, such as an EL element (for example, an organic EL element, an inorganic EL element, an EL element containing an organic material and an inorganic material), an electron discharging element, a liquid crystal element, an electron ink, a grating light valve (GLV), a plasma display (PDP), a digital micromirror device (DMD), a piezoelectric ceramic display, or a carbon nanotube. It is to be noted that a display device using an EL element may be an EL display; a display device using an electron discharging element may be a field emission display (FED), an SED type flat panel display (Surface-conduction Electron-emitter Display), or the like; a display device using a liquid crystal element may be a liquid crystal display, a transmissive liquid crystal display, a semi-transmissive liquid crystal display, or a reflective liquid crystal display; and a display device using an electron ink may be electronic paper.

With the use of the present invention, a device having a circuit including semiconductor elements (such as transistors, memory elements, or diodes) or a semiconductor device such as a chip including a processor circuit can be manufactured. It is to be noted that in the present invention, a semiconductor device refers to a device which can function by utilizing the semiconductor characteristics.

By the present invention, components such as a wiring included in a display device or the like and a contact hole for electrically connecting the components through an insulating layer can be formed with a reduced number of complicated photolithography steps. A display device can be manufactured through a simplified process. Therefore, there is not much loss of materials and the cost can be reduced. Accordingly, high performance and highly reliable display devices can be manufactured with a high yield.

BRIEF DESCRIPTION OF DRAWINGS

FIGS. 15A and 15B are views showing a display device of the present invention.

FIGS. 20A and 20B are cross-sectional views each showing a structural example of a display module of the present invention.

DETAILED DESCRIPTION OF THE INVENTION

Figure 1A:
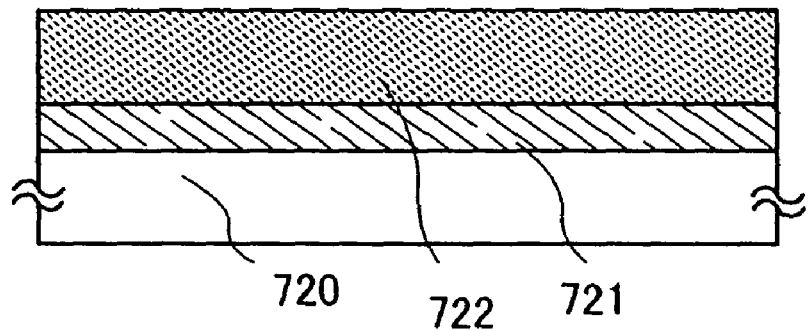
FIGS. 1A to 1D are schematic views showing the present invention.

Although the invention will be fully described by way of embodiment modes and an embodiment with reference to the accompanying drawings, it is to be understood by those skilled in the art that various changes and modifications can be made without departing from the spirit and scope of the invention. Therefore, the present invention should not be construed as being limited to the description in the following embodiment modes. Note that common portions and portions having a similar function are denoted by the same reference numerals in all diagrams for describing embodiment modes, and repetitive description thereof is omitted.

Embodiment Mode 1

In this embodiment mode, a method for forming a contact hole through a highly reliable and more simplified process at low cost is described with reference to FIGS. 1A to 1D.

When thin films (for example, conductive layers or semiconductor layers) which are to be stacked with an insulating layer interposed therebetween are electrically connected, an opening (so-called contact hole) is formed in the insulating layer. In this case, a mask layer is not formed over the insulating layer, and the opening is selectively formed by irradiation with laser light. A light absorbing layer having a function of absorbing irradiation light is formed, an insulating layer is stacked over the light absorbing layer, and then a region where the opening is formed in a stack including the light absorbing layer and the insulating layer is selectively irradiated with laser light from the insulating layer side. Laser light transmits through the insulating layer and is absorbed by the light absorbing layer. The light absorbing layer is heated by energy of the absorbed laser light, and the insulating layer that is stacked thereover is damaged. Therefore, the opening is formed in the insulating layer, and part of the light absorbing layer below the insulating layer is exposed at the bottom of the opening.

In the case where the light absorbing layer is formed using a conductive material such as a conductive layer using a conductive material or a semiconductor layer using a semiconductor material, by formation of a conductive layer in the opening so as to be in contact with the exposed light absorbing layer, the light absorbing layer and the conductive layer can be electrically connected to each other with the insulating layer interposed therebetween. Specifically, in the present invention, an opening is formed in the insulating layer over a region irradiated with laser light of the light absorbing layer by irradiating the light absorbing layer functioning as a conductive layer or a semiconductor layer with laser light, thereby causing laser ablation.

Since the opening can be selectively formed by laser light, it is not necessary to form a mask layer; therefore, the steps and materials can be reduced. In addition, there are advantages that an insulating layer to be processed can be formed into a predetermined shape with high precision since the laser light can be condensed into an extremely small spot, and the regions other than the processing region is not necessary to be heated substantially since heating is performed instantaneously and for a short time.

Description is specifically made with reference to FIGS. 1A to 1D. In this embodiment mode, as shown in FIGS. 1A to 1D, a light absorbing layer 721 and an insulating layer 722 are formed over a substrate 720. In this embodiment mode, the light absorbing layer 721 is formed using a conductive material and can function as a conductive layer. In this embodiment mode, chromium is used for the light absorbing layer 721.

Figure 1B:
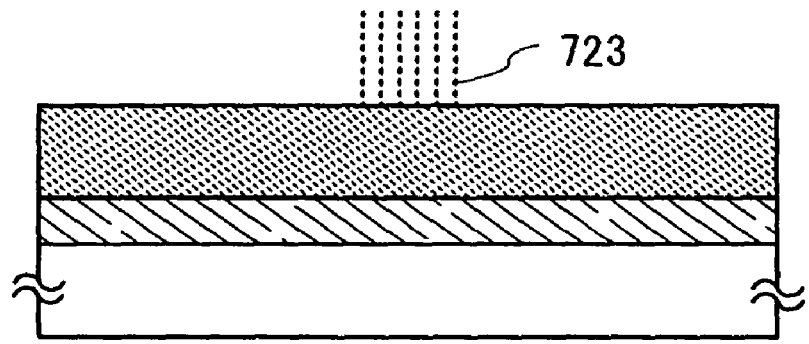
Figure 1C:
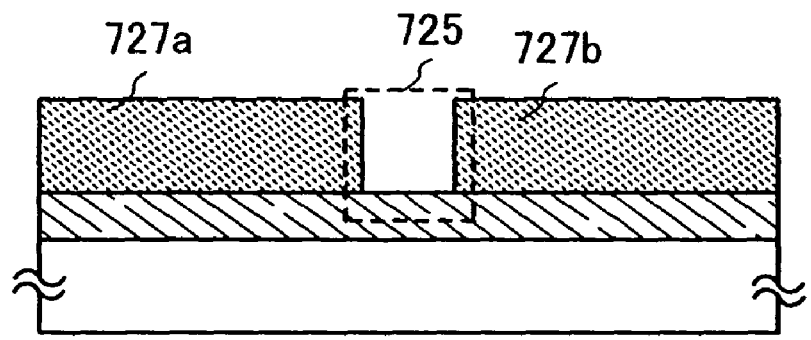
Figure 1D:
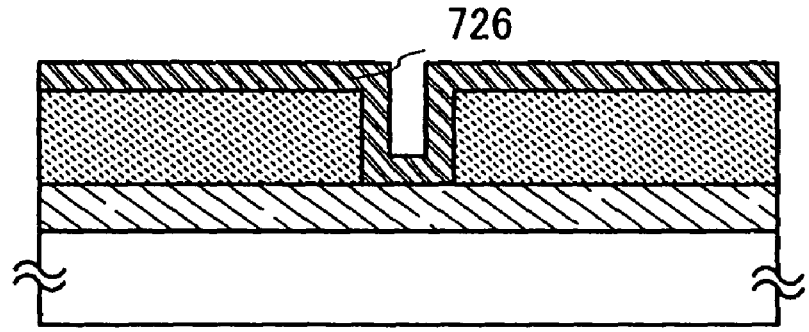

As shown in FIG. 1B, the light absorbing layer 721 is selectively irradiated with laser light 723 from the insulating layer 722 side, and a part of the insulating layer 722, which is over the irradiated region of the light absorbing layer 721, can be removed to form an opening 725. The insulating layer 722 is separated into insulating layers 727a and 727b (see FIG. 1C). A conductive layer 726 is formed in the opening 725 where the light absorbing layer 721 is exposed. Therefore, the light absorbing layer 721 and the conductive film 726 can be electrically connected (see FIG. 1D).

Figure 30:
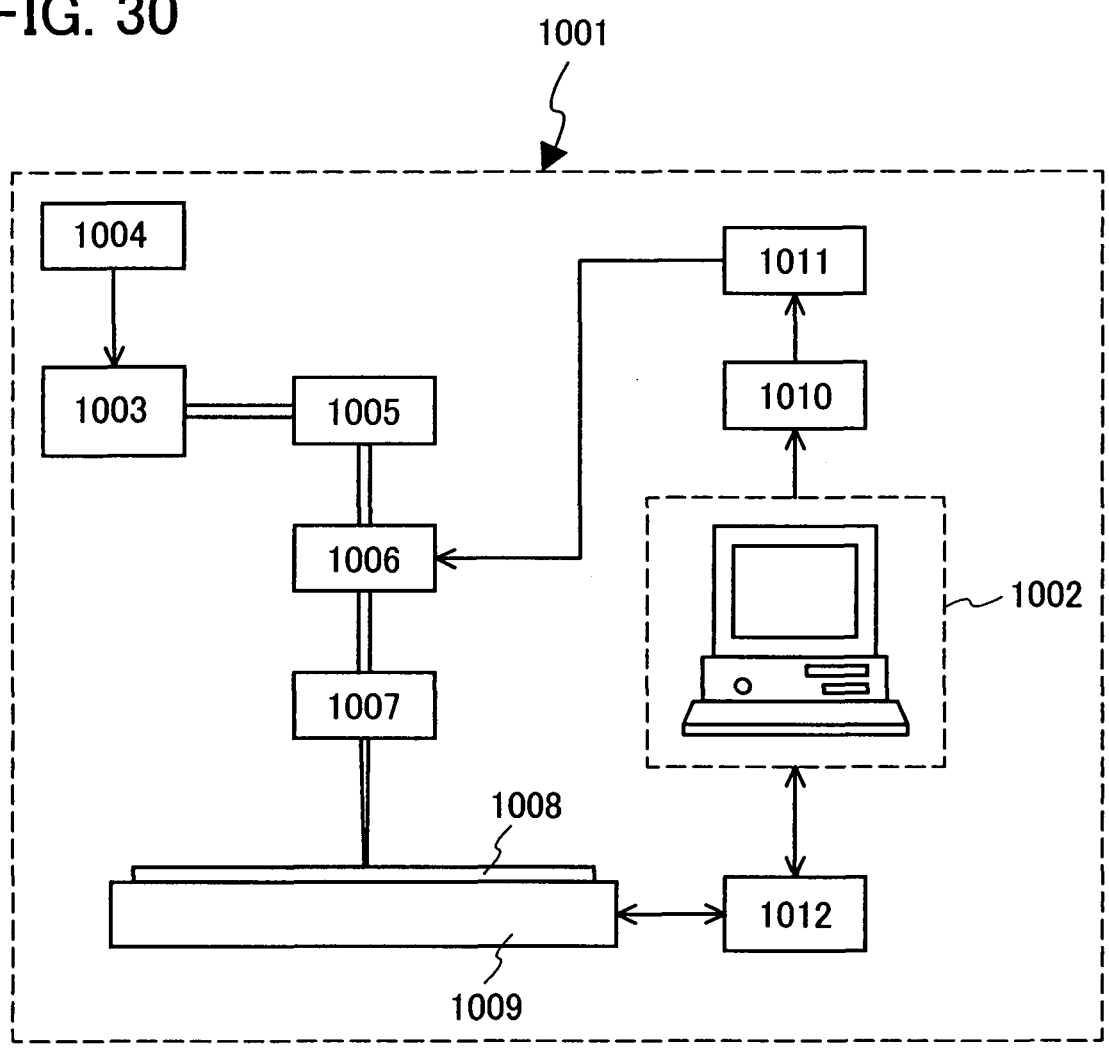
FIG. 30 a view showing a structure of a laser beam direct writing system which can be applied to the present invention.

A laser beam writing system for irradiating a processing region with laser light (also referred to as a laser beam) is described with reference to FIG. 30. A laser beam direct writing system is used in this embodiment mode so that a processing region is directly irradiated with a laser beam. As shown in FIG. 30, a laser beam direct writing system 1001 includes: a personal computer (hereinafter, referred to as a PC) 1002 for performing various kinds of controls when irradiation with a laser beam is performed; a laser oscillator 1003 for outputting a laser beam; a power source 1004 of the laser oscillator 1003; an optical system (ND filter) 1005 for attenuating a laser beam; an acousto-optic modulator (AOM) 1006 for modulating the intensity of a laser beam; an optical system 1007 including a lens for enlarging or reducing a cross section of a laser beam, a mirror for changing a light path, and the like; a substrate transfer mechanism 1009 having an X stage and a Y stage; a D/A converter portion 1010 for digital-analog conversion of control data outputted from the PC; a driver 1011 for controlling the acousto-optic modulator 1006 according to an analog voltage outputted from the D/A converter portion; and a driver 1012 for outputting a driving signal for driving the substrate transfer mechanism 1009.

As the laser oscillator 1003, a laser oscillator capable of emitting ultraviolet light, visible light, or infrared light can be used. The following laser oscillators can be used: an excimer laser oscillator of KrF, ArF, XeCl, Xe, or the like; a gas laser oscillator of He, He—Cd, Ar, He—Ne, HF, or the like; a solid-state laser oscillator using a crystal such as YAG; GdVO$_4$, YVO$_4$, YLF, or YAlO$_3$ doped with Cr, Nd, Er, Ho, Ce, Co, Ti, or Tm; and a semiconductor laser oscillator of GaN, GaAs, GaAlAs, InGaAsP, or the like. In the case of the solid-state laser oscillator, a fundamental wave and first to fifth harmonics of fundamental waves are preferably used. In order to adjust the shape or path of a laser beam emitted from the laser oscillator, an optical system including a shutter, a reflector such as a mirror or a half mirror, a cylindrical lens, a convex lens, and the like may be provided.

Further, laser crystallization may be performed with an oscillation frequency of laser light of pulse oscillation of 0.5 MHz or higher, which corresponds to a much higher frequency band than the frequency band of several tens to several hundreds of Hz which is generally used. Pulsed laser having a pulse width in the picosecond range or in the femtosecond ($10^{-15}$ seconds) range may be used.

Further, laser light irradiation may be performed in an inert gas atmosphere of a rare gas, nitrogen, or the like. Laser light irradiation may be performed under low pressure.

Next, treatment for modifying quality of a film with the use of the laser beam direct writing system is described. When a substrate 1008 is mounted on the substrate transfer mechanism 1009, the PC 1002 detects a position of a marker marked on the substrate with the use of a camera which is not shown. Subsequently, the PC 1002 generates data for moving the substrate transfer mechanism 1009 based on the positional data of the detected marker and data for a writing pattern that has been previously input to the PC. Then when the amount of output light for the acousto-optic modulator 1006 is controlled through the driver 1011 by the PC 1002, laser beam outputted from the laser oscillator 1003 is attenuated by the optical system 1005, so that the amount of light is adjusted to a predetermined amount in the acousto-optic modulator 1006. The light path and beam shape of the laser beam outputted from the acousto-optic modulator 1006 are changed in the optical system 1007. The laser beam is condensed by the lens, and a base film formed over the substrate is irradiated with the condensed laser beam. Thereby, the treatment for modifying quality of the base film is performed. At this time, the substrate transfer mechanism 1009 is controlled to move in an X direction and a Y direction in accordance with the data for moving the substrate transfer mechanism, which is generated by the PC 1002. As a result, a predetermined portion is irradiated with the laser beam, and thereby treatment for modifying the quality of the film is performed.

The shorter the wavelength of the laser beam, the narrower the beam can be condensed in diameter. Therefore, in order to process a region with a minute width, a short wavelength laser beam is preferably irradiated.

The spot shape of the laser beam on the film surface is processed to have a dotted, circular, elliptic, rectangular, or linear (to be precise, narrow rectangular) shape by the optical system.

FIG. 30 shows an example of the system in which a front surface of the substrate is irradiated with laser light to be exposed. Alternatively, another laser beam writing system in which a back surface of the substrate is irradiated with laser light to be exposed may be used by appropriately changing the optical system and the substrate transfer mechanism.

Here, the substrate is moved and selectively irradiated with the laser beam; however, the present invention is not limited thereto. Irradiation with the laser beam can be performed by scanning of the laser beam in the x-axis and y-axis directions. In that case, a polygon mirror or a galvanometer mirror is preferably used for the optical system 1007.

The light absorbing layer 721 can be formed by an evaporation method, a sputtering method, a PVD (Physical Vapor Deposition) method, a CVD (Chemical Vapor Deposition) method such as a low-pressure CVD (LPCVD) method or a plasma CVD method, or the like. Alternatively, a method by which a component can be formed into a desired pattern by transferring or drawing, for example, various printing methods (a method for forming a component into a desired pattern, such as screen (mimeograph) printing, offset (planograph) printing, relief printing, or gravure (intaglio) printing), a dispenser method, a selective-coating method, or the like may be used.

As the light absorbing layer 721, one or a plurality of chromium, molybdenum, nickel, titanium, cobalt, copper, tungsten, and aluminum can be used. Alternatively, for the light absorbing layer, a semiconductor material can be used. For example, an inorganic semiconductor material such as silicon, germanium, silicon germanium, gallium arsenic, molybdenum oxide, tin oxide, bismuth oxide, vanadium oxide, nickel oxide, zinc oxide, gallium arsenide, gallium nitride, indium oxide, indium phosphide, indium nitride, cadmium sulfide, cadmium telluride, or strontium titanate can be used. Further alternatively, hydrogen or an inert gas (helium (He), argon (Ar), krypton (Kr), neon (Ne), xenon (Xe), or the like) may be added to the light absorbing layer. The insulating layer in which an opening is formed can be formed using a material which transmits laser light, for example, a light-transmitting inorganic insulating material or organic resin.

Further, concerning the shape of the opening which functions as a contact hole, it is not necessary for the side surface to be perpendicular to the bottom surface, and the side of the opening may be tapered. For example, the opening may have a mortar shape and the side surface of the opening may be tapered with respect to the bottom surface.

Thus, in the opening provided in the insulating layer, the light absorbing layer below the insulating layer and the conductive layer over the insulating layer are electrically connected to each other. The size and shape of the opening formed in the insulating layer can be controlled by conditions for laser light irradiation (such as laser intensity and irradiation time) and characteristics of materials for the insulating layer and the conductive layer (such as thermal conductivity, melting point, and boiling point).

The size of the opening with respect to the area of the irradiated region determined by the diameter of laser light depends on the magnitude of an energy level of the laser light. When the energy of laser light is sufficiently high, the energy is transmitted to the periphery of the irradiated region; therefore, an opening larger than the region irradiated with laser light is formed in the insulating layer. On the other hand, when the energy of laser light is low, an opening with almost the same size as the irradiated region is formed in the insulating layer.

As described above, by control of the energy of the laser beam, the size of the opening formed in the insulating layer can be controlled as appropriate.

After the opening is formed by irradiation with laser light, a conductive material and an insulating material remaining around the opening (a residue in a portion where the conductive layer or the insulating layer is removed) may be washed with a liquid to remove the residue. In this case, a non-reactive substance such as water may be used for washing, or a chemical solution such as etchant which reacts with (dissolves) the insulating layer may be used. With etchant, the opening is over-etched, and dusts and the like are removed, so that the surface is more planarized. Further, the opening can be widened.

Since the opening can be selectively formed by laser light, it is not necessary to form a mask layer. Therefore, the steps and the materials can be reduced. In addition, there are advantages in that a conductive layer and an insulating layer to be processed can be formed into a predetermined shape with high precision because laser light can be condensed into a very small spot, and it is not necessary to heat a region other than the processing region substantially because heating is performed instantaneously by laser light.

Thus, an opening (contact hole) which electrically connects conductive layers can be formed in an insulating layer by irradiation with laser light without performing of a complicated photolithography step and forming of a mask layer.

Accordingly, when a display device is manufactured using the present invention, the process can be simplified, and loss of materials and the cost can be reduced. Therefore, display devices can be manufactured with a high yield.

Embodiment Mode 2

In this embodiment mode, a method for forming a contact hole through a highly reliable and more simplified process at low cost is described with reference to FIGS. 2A to 2D.

In this embodiment mode, an example of Embodiment Mode 1 is described, in which the conductive film and the stack of the light absorbing layer and the conductive layer are electrically connected to each other with the insulating layer interposed therebetween.

Description is specifically made with reference to FIGS. 2A to 2D. In this embodiment mode, as shown in FIGS. 2A to 2D, a conductive layer 709, a light absorbing layer 701, and an insulating layer 702 are formed over a substrate 700. In this embodiment mode, the light absorbing layer 701 is formed using a conductive material and can function as a conductive layer. In addition, the conductive layer 709 may be formed using a material that absorbs laser light so that it also functions as a light absorbing layer.

The conductive layer 709 and the light absorbing layer 701 are formed to have a stacked-layer structure. In this embodiment mode, a low-melting point metal (chromium in this embodiment mode) that is relatively easily evaporated is used for the light absorbing layer 701, and a high-melting point metal (tungsten in this embodiment mode) that is not easily evaporated compared to the light absorbing layer 701 is used for the conductive layer 709.

Figure 2A:
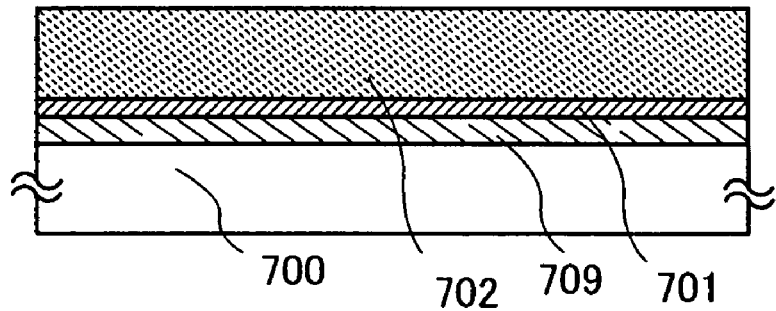
FIGS. 2A to 2D are schematic views showing the present invention.
Figure 2B:
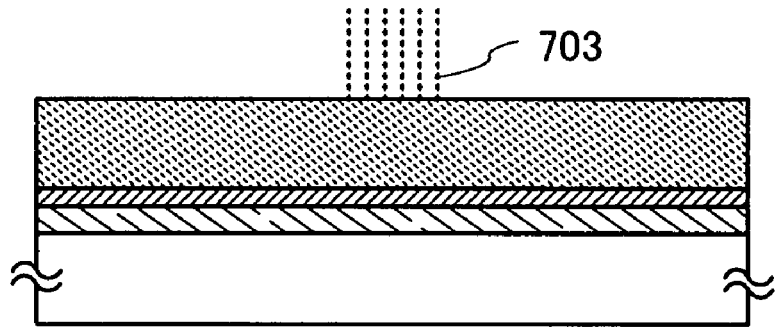
Figure 2C:
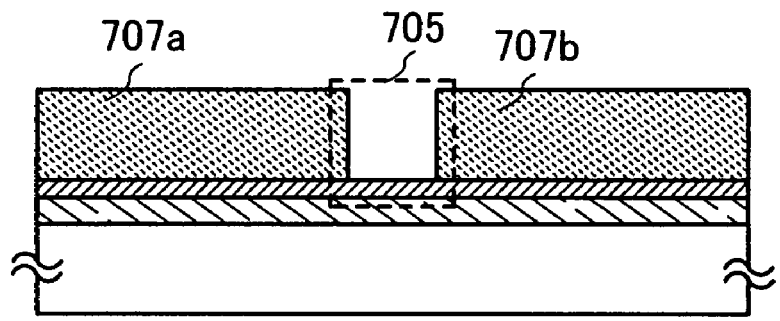
Figure 2D:
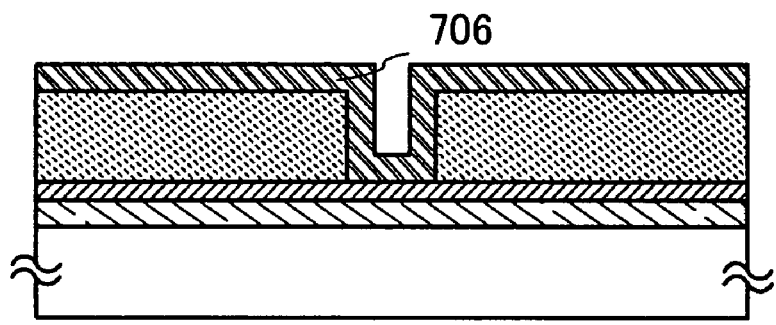

As shown in FIG. 2B, the light absorbing layer 701 is selectively irradiated with laser light 703 from the insulating layer 702 side, and a part of the insulating layer 702, which is over the irradiated region of the light absorbing layer 701, can be removed to form an opening 705. The insulating layer 702 is separated into insulating layers 707a and 707b (see FIG. 2C). A conductive layer 706 is formed in the opening 705 where the light absorbing layer 701 is exposed; therefore, the conductive film 706 and the stack including the conductive layer 709 and the light absorbing layer 701 can be electrically connected (see FIG. 2D).

Thus, a light absorbing layer and a conductive layer (or a semiconductor layer) may be stacked. Further, a plurality of light absorbing layers may be stacked and a plurality of conductive layers may be stacked.

After the opening is formed by irradiation with laser light, a conductive material and an insulating material remaining around the opening (a residue in a portion where the conductive layer or the insulating layer is removed) may be washed with a liquid to remove the residue. In this case, a non-reactive substance such as water may be used for washing, or a chemical solution such as etchant which reacts with (dissolves) the insulating layer may be used. With etchant, the opening is over-etched, and dusts and the like are removed, so that the surface is more planarized. Further, the opening can be widened.

Thus, in the opening provided in the insulating layer, the light absorbing layer below the insulating layer and the conductive layer over the insulating layer are electrically connected to each other. In this embodiment mode, a light absorbing layer is formed of a metal with a high sublimation property over a conductive layer and the light absorbing layer is supplied with an energy by laser light, so that an opening is formed in an insulating layer formed over the light absorbing layer and the conductive layer. The size and shape of the opening formed in the insulating layer and the conductive layer can be controlled by conditions for laser light irradiation (such as laser intensity and irradiation time) and characteristics of materials for the insulating layer and the conductive layer (such as thermal conductivity, melting point, and boiling point). FIGS. 4A to 4D show an example of the size of a laser light spot and the size of the formed opening.

A conductive layer 309 (309a, 309a, and 309a) and a light absorbing layer 301 are stacked over a substrate 300, and an insulating layer 302 is formed so as to cover the conductive layer 309 (309a, 309a, and 309a) and the light absorbing layer 301. In FIGS. 4A to 4D, the conductive layer 309 has a stacked-layer structure including a plurality of thin films. For example, titanium can be used for the conductive layer 309a, aluminum can be used for the conductive layer 309b, titanium can be used for the conductive layer 309c, and chromium can be used for the light absorbing layer 301. Alternatively, tungsten, molybdenum, or the like may be used for the conductive layer 309 (309a, 309a, and 309a). It is needless to say that the light absorbing layer 301 can also have a stacked-layer structure, and a stacked layer containing copper and chromium or the like can be used.

Figure 4A:
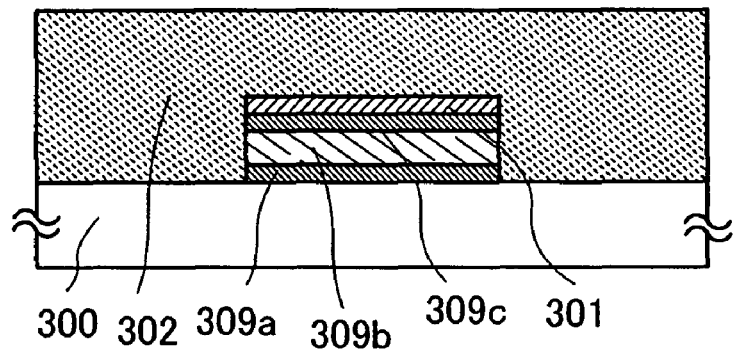
FIGS. 4A to 4D are schematic views showing the present invention.
Figure 4B:
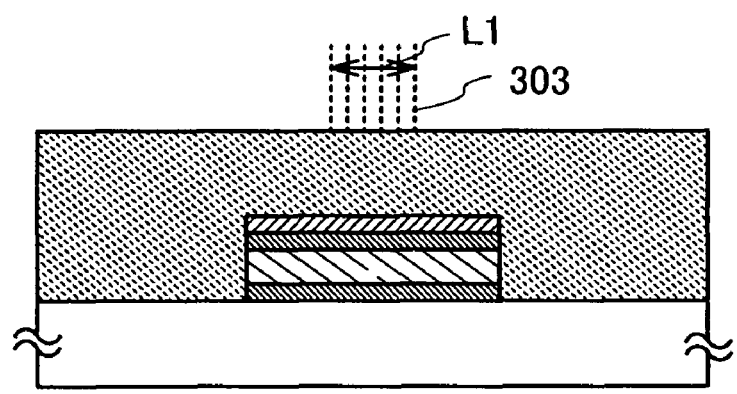
Figure 4C:
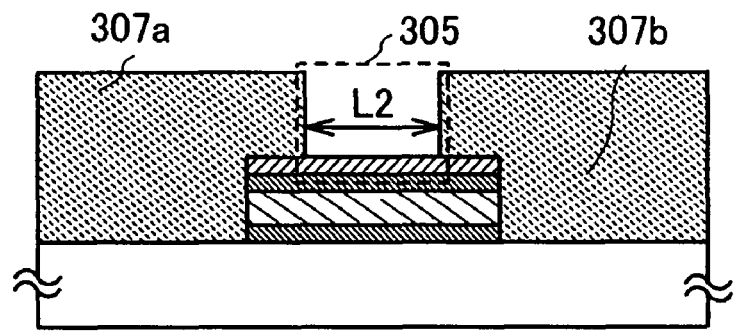
Figure 4D:
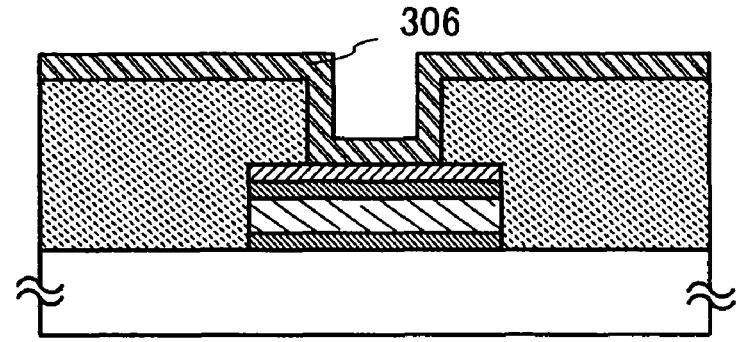

The insulating layer 302 and the light absorbing layer 301 are irradiated with laser light 303 having a diameter L1. When the energy of the laser light 303 is high, the light absorbing layer 301 receives high energy and heat is transmitted to the irradiated region and also to a periphery thereof in the light absorbing layer 301, as shown in FIG. 4C. Therefore, in the insulating layer 302 formed over the light absorbing layer 301, an opening 305 having a diameter L2 larger than the diameter L1 of the laser light 303 is formed. As described above, the insulating layer 302 is separated into insulating layers 307a and 307b, and the opening 305 is formed. A conductive film 306 is formed in the opening 305 where the light absorbing layer 301 is exposed, and is electrically connected to the light absorbing layer 301 and the conductive layer 309 (309a, 309a, and 309a) (see FIG. 4D).

The size of the opening with respect to the area of the irradiated region determined by the diameter of laser light depends on the magnitude of an energy level of the laser light. When the energy of laser light is sufficiently high, the energy is transmitted to the periphery of the irradiated region; therefore, an opening larger than the region irradiated with laser light is formed in the insulating layer. On the other hand, when the energy of laser light is low, an opening with almost the same size as the irradiated region is formed in the insulating layer.

As described above, by control of the energy of the laser beam, the size of the opening formed in the insulating layer can be controlled as appropriate.

Since the opening can be selectively formed by laser light, it is not necessary to form a mask layer. Therefore, the steps and the materials can be reduced. In addition, there are advantages in that a conductive layer and an insulating layer to be processed can be formed into a predetermined shape with high precision because laser light can be condensed into a very small spot, and it is not necessary to heat a region other than the processing region substantially because heating is performed instantaneously by laser light.

Thus, an opening (contact hole) which electrically connects conductive layers can be formed in an insulating layer by irradiation with laser light without performing of a complicated photolithography step and forming of a mask layer.

Accordingly, when a display device is manufactured using the present invention, the process can be simplified, and loss of materials and the cost can be reduced. Therefore, display devices can be manufactured with a high yield.

Embodiment Mode 3

Figure 3A:
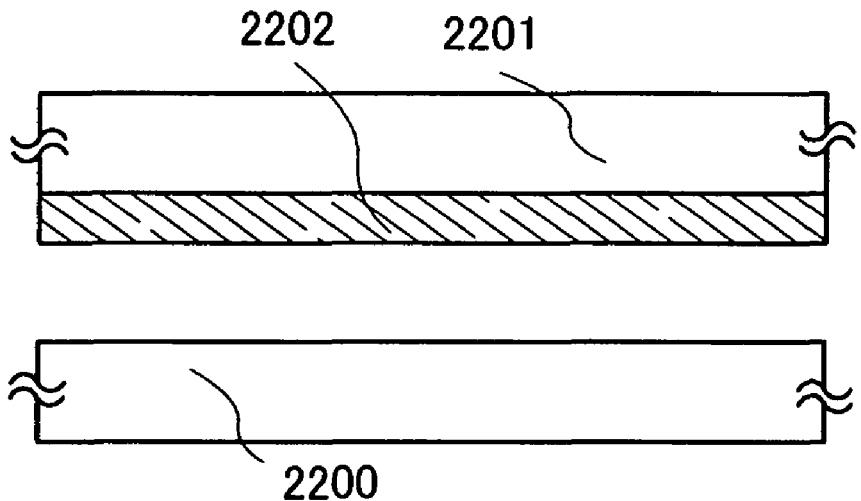
FIGS. 3A to 3C are schematic views showing the present invention.
Figure 3B:
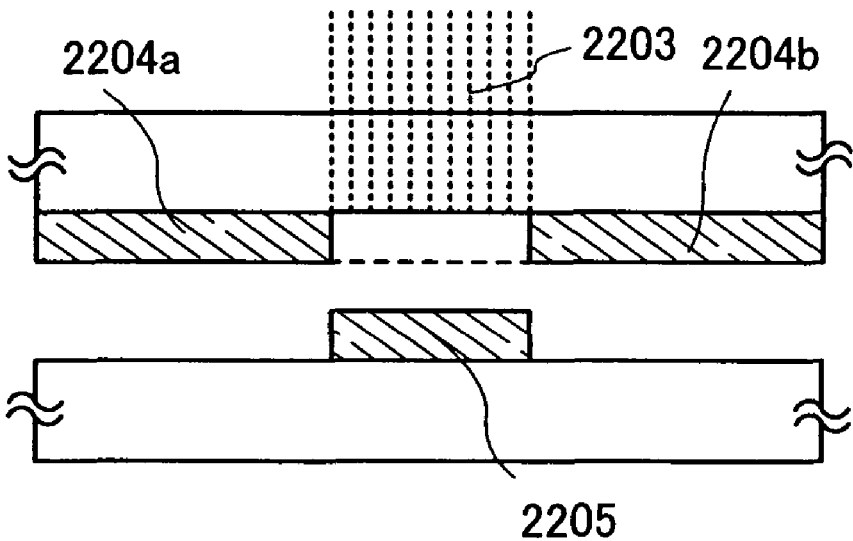
Figure 3C:
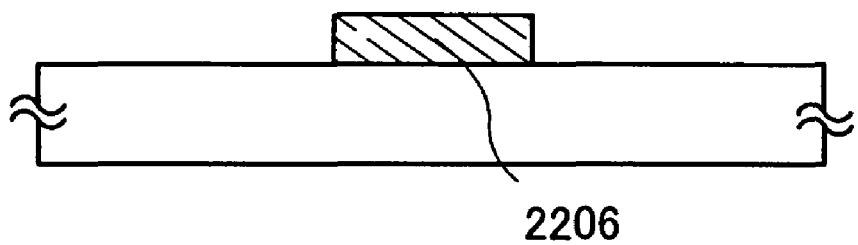

In this embodiment mode, a method for manufacturing a display device through a highly reliable and more simplified process at low cost is described with reference to FIGS. 3A to 3C.

In this embodiment mode, when processing a thin film into a desired pattern, a component (also referred to as a pattern) such as a conductive layer or a semiconductor layer is selectively formed so as to have a desired shape without the use of a photolithography process. In the present invention, a component (also referred to as a pattern) refers to a conductive layer such as a wiring layer, a gate electrode layer, a source electrode layer, or a drain electrode layer, a semiconductor layer, an insulating layer, or the like included in a thin film transistor or a display device and can be any component formed to have a predetermined shape.

In this embodiment mode, a light absorbing film such as a conductive film or a semiconductor film is formed over a light-transmitting transfer substrate and laser light is selectively irradiated from the transfer substrate side, so that the light absorbing film corresponding a region irradiated with laser light is transferred to a substrate to which a light absorbing layer is transferred and the conductive layer or the semiconductor layer which is the light absorbing layer is formed into a desired shape (pattern). In this specification, a transfer substrate refers to a substrate over which a conductive film or a semiconductor film which is a light absorbing film is formed in a first step and then laser light is irradiated, and a substrate to which a light absorbing layer is transferred refers to a substrate over which a conductive layer or a semiconductor layer which is a light absorbing layer is selectively formed in a last step. A conductive layer, a semiconductor layer, or the like can be selectively formed so as to have a desired shape without using a photolithography process. Therefore, simplification of the process, cost reduction, and the like can be achieved.

A method for forming a thin film of this embodiment mode is specifically described with reference to FIGS. 3A to 3C. In FIGS. 3A to 3C, a light absorbing film 2202 is formed over a first substrate 2201 which is a transfer substrate, and the first substrate 2201 and a second substrate 2200 which is a substrate to which a light absorbing layer is transferred are provided such that they face each other and the light absorbing film 2202 is on an inner side.

Laser light 2203 transmits through the substrate 2201 and selectively irradiated onto a light absorbing film 2202. The light absorbing film 2202 in a region irradiated with the laser light 2203 absorbs the laser light 2203 and is transferred to the substrate 2200 side as a light absorbing layer 2205 by energy of the heat or the like. On the other hand, a region which is not irradiated with the laser light 2203 remains on the first substrate 2201 side as light absorbing films 2204a and 2204b.

Thus, when processing a thin film that is the light absorbing layer 2206 into a desired pattern, a component (also referred to as a pattern) such as a conductive layer or a semiconductor layer is selectively formed so as to have a desired shape without the use of a photolithography process.

As laser light, laser light similar to that described in Embodiment Mode 1 may be irradiated in the same manner as in Embodiment Mode 1, and the laser beam writing system shown in FIG. 30 may be used. Therefore, specific description thereof is omitted here.

After being transferred by laser light, a light absorbing layer may be subjected to heat treatment or may be irradiated with laser light.

A material which absorbs irradiation light is used for the light absorbing film 2202 that is a transferred object, and a light transmitting substrate which transmits irradiation light is used for the first substrate 2201. By the present invention, transfer to various substrates can be freely performed; therefore, the number of materials that can be selected for use for a substrate increases. Further, an inexpensive material can be selected for the substrate. Therefore, a display device can be made to have a wide range of functions to match intended uses, and further, can be manufactured at low cost.

The method for forming a thin film of this embodiment mode can be used for forming a conductive layer such as a wiring layer, a gate electrode layer, a source electrode layer, or a drain electrode layer, a semiconductor layer, a mask layer, an insulating layer, and the like included in a thin film transistor or a display device. A film using a desired material is formed as a light absorbing film, light for absorption by the light absorbing film is selected, and irradiation is performed.

A conductive material may be used as the light absorbing film. For example, one or a plurality of chromium, tantalum, silver, molybdenum, nickel, titanium, cobalt, copper, or aluminum can be used. Alternatively, a semiconductor material may be used as the light absorbing layer. For example, an inorganic semiconductor material such as silicon, germanium, silicon germanium, gallium arsenic, molybdenum oxide, tin oxide, bismuth oxide, vanadium oxide, nickel oxide, zinc oxide, gallium arsenide, gallium nitride, indium oxide, indium phosphide, indium nitride, cadmium sulfide, cadmium telluride, or strontium titanate may be used. Hydrogen or an inert gas (helium (He), argon (Ar), krypton (Kr), neon (Ne), xenon (Xe), or the like) may be added to the light absorbing layer.

By the present invention, a component such as a wiring included in a display device can be formed into a desired shape. In addition, since the number of complicated photolithography steps can be reduced and a display device can be manufactured through a simplified process, loss of materials and the cost can be reduced. Therefore, high-performance and highly reliable display devices can be manufactured with a high yield.

Embodiment Mode 4

Figure 25A:
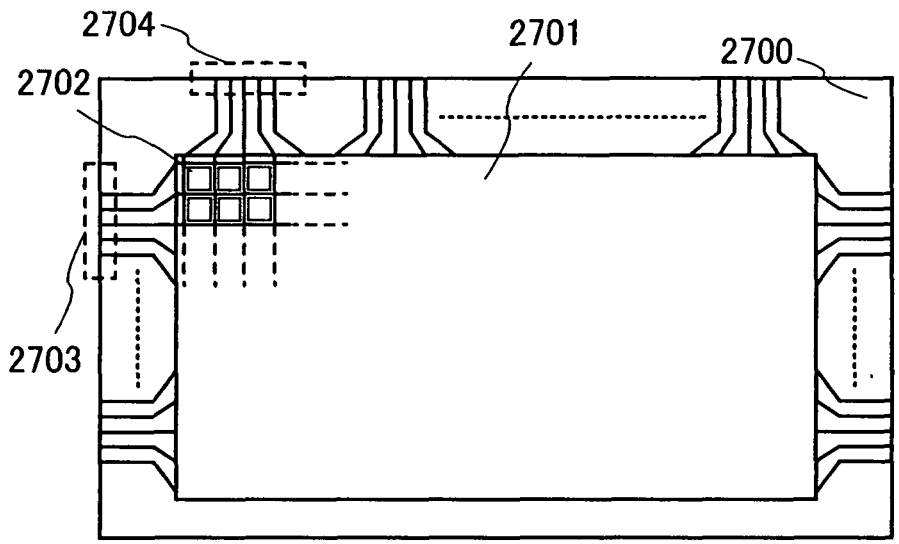
FIGS. 25A to 25C are top plan views of a display device of the present invention.

FIG. 25A is a top plan view showing a structure of a display panel of the present invention, in which a pixel portion 2701 where pixels 2702 are arranged in matrix, a scan line input terminal 2703, and a signal line input terminal 2704 are formed over a substrate 2700 having an insulating surface. The number of pixels may be set in accordance with various standards: the number of pixels of XGA for RGB full-color display may be 1024×768×3 (RGB), that of UXGA for RGB full-color display may be 1600×1200×3 (RGB), and that corresponding to a full-speck high vision for RGB full-color display may be 1920×1080×3 (RGB).

Scan lines which extend from the scan line input terminal 2703 intersect with signal lines which extend from the signal line input terminal 2704, so that the pixels 2702 are arranged in matrix. Each pixel in the pixel portion 2701 is provided with a switching element and a pixel electrode connected to the switching element. A typical example of the switching element is a TFT. A gate electrode layer side of the TFT is connected to the scan line, and a source or drain side thereof is connected to the signal line, so that each pixel can be controlled independently by a signal inputted externally.

Figure 26A:
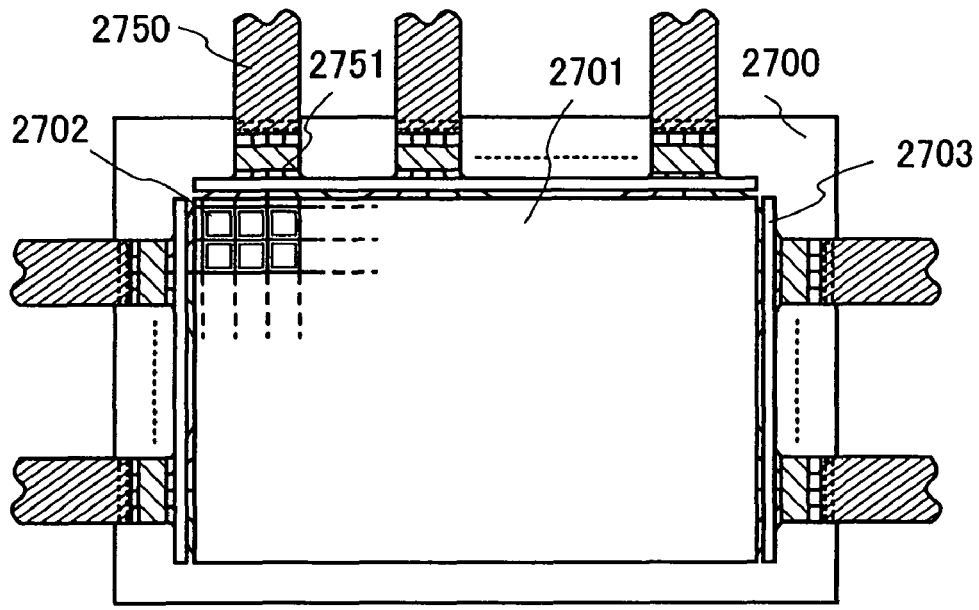
FIGS. 26A and 26B are top plan views of a display device of the present invention.
Figure 26B:
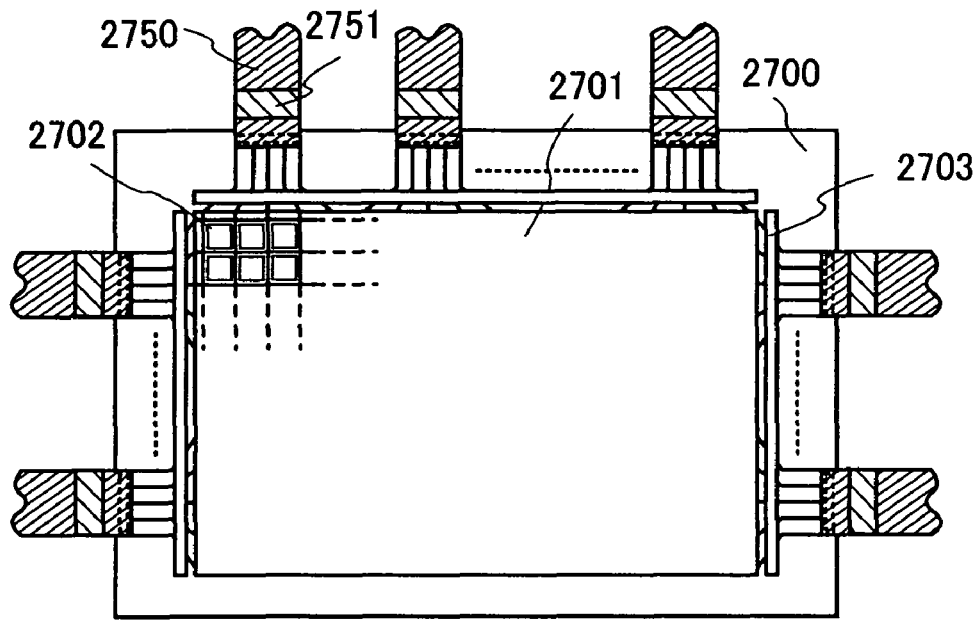

FIG. 25A shows a structure of the display panel in which signals inputted to a scan line and a signal line are controlled by an external driver circuit. Alternatively, driver ICs 2751 may be mounted on the substrate 2700 by a COG (Chip on Glass) method, as shown in FIG. 26A. Alternatively, a TAB (Tape Automated Bonding) method may be employed as shown in FIG. 26B. The driver ICs may be ones formed over a single crystalline semiconductor substrate or may be circuits that are each formed using a TFT over a glass substrate. In FIGS. 26A and 26B, each driver IC 2751 is connected to an FPC 2750.

Figure 25B:
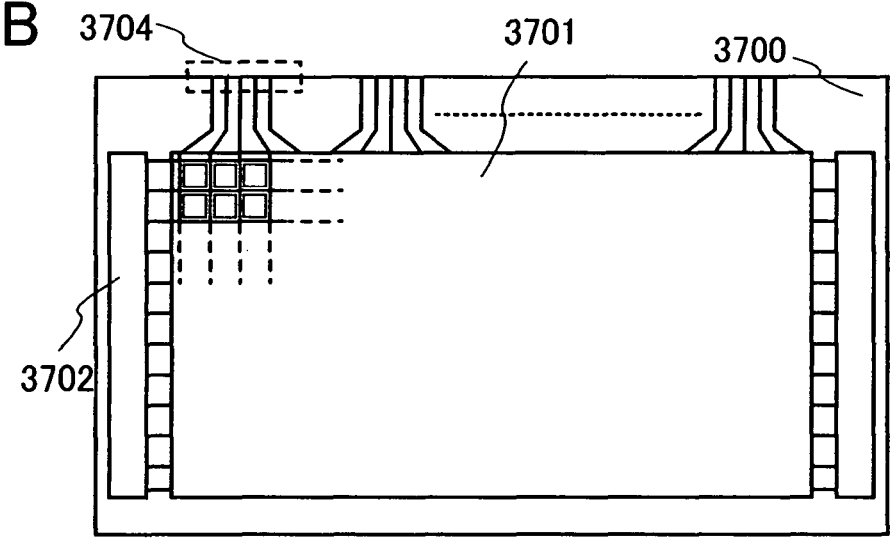
Figure 25C:
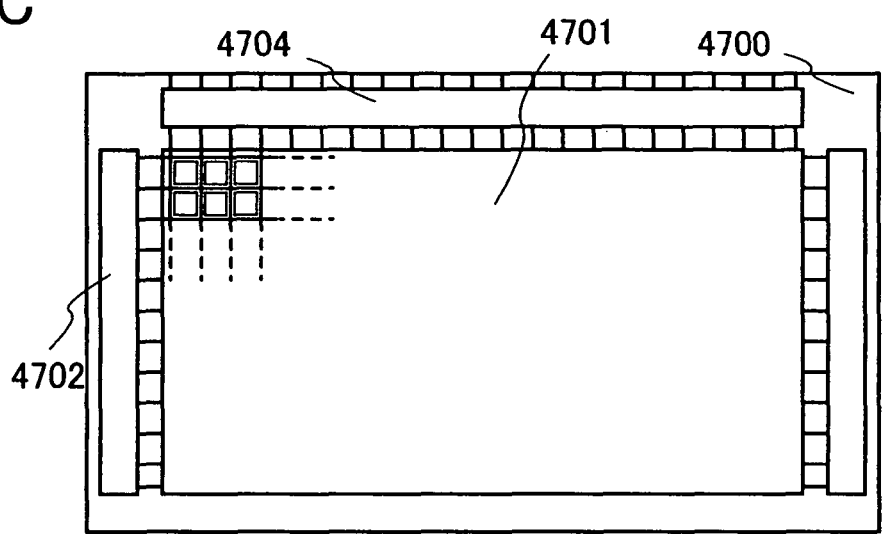

Further, in the case where a TFT provided in a pixel is formed using a polycrystalline (microcrystalline) semiconductor having high crystallinity, a scan line driver circuit 3702 may be formed over a substrate 3700 as shown in FIG. 25B. In FIG. 25B, a reference numeral 3701 denotes a pixel portion, and a signal line driver circuit is controlled by an external driver circuit similarly to that in FIG. 25A. In the case where a TFT provided in a pixel is formed using a polycrystalline (microcrystalline) semiconductor, a single crystalline semiconductor, or the like with high mobility like the TFT formed in the present invention, a scan line driver circuit 4702 and a signal line driver circuit 4704 can be formed over a substrate 4700 as shown in FIG. 25C.

Figure 14A:
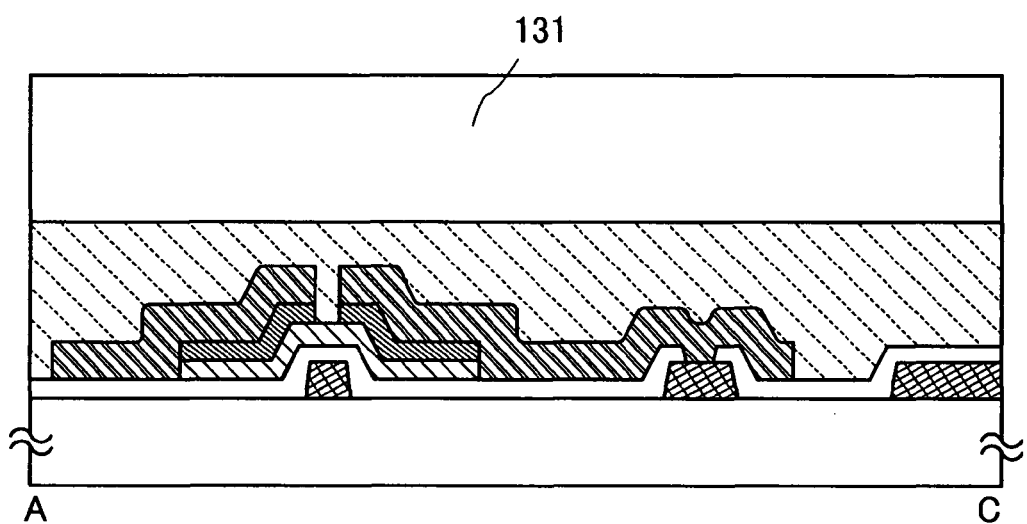
FIGS. 14A and 14B are views showing a method for manufacturing a display device of the present invention.
Figure 14B:
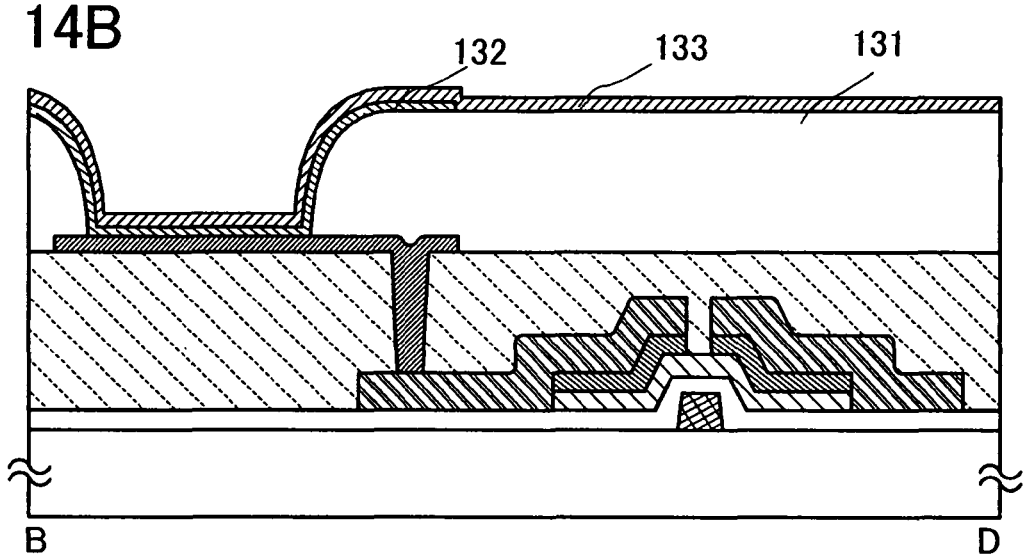

This embodiment mode is described with reference to FIGS. 8A to 14B. More specifically, a method for manufacturing a display device having an inverse staggered thin film transistor, to which the present invention is applied, is described. FIGS. 8A, 9A, 10A, 11A, 12A, and 13A are top plan views each showing a pixel portion of the display device. FIGS. 8B, 9B, 10B, 11B, 12B, and 13B are cross sectional views each taken along a line A-C. FIGS. 8C, 9C, 10C, 11C, 12C, and 13C are cross sectional views each taken along a line B-D. FIGS. 14A and 14B are also cross sectional views of the display device.

As a substrate 100, a glass substrate made of barium borosilicate glass, aluminoborosilicate glass, or the like; a quartz substrate; a metal substrate; or a plastic substrate having heat resistance that can withstand a process temperature of this manufacturing process is used. The surface of the substrate 100 may be polished by a CMP method or the like so that it is planarized. An insulating layer may be formed over the substrate 100. The insulating layer may be formed to have a single-layer or stacked-layer structure using an oxide material containing silicon or a nitride material containing silicon by various methods such as a CVD method, a plasma CVD method, a sputtering method, and a spin coating method. This insulating layer is not necessarily formed; however, this insulating layer has an advantageous effect of blocking contamination substances and the like from the substrate 100.

Gate electrode layers 103 (103a and 103b) and 104 (104a and 104b) are formed over the substrate 100. The gate electrode layers 103 (103a and 103b) and 104 (104a and 104b) may be formed using an element selected from Ag, Au, Ni, Pt, Pd, Ir, Rh, Ta, W, Ti, Mo, Al, and Cu, or an alloy material or compound material containing the above element as its main component. Alternatively, a semiconductor film typified by a polycrystalline silicon film doped with an impurity element such as phosphorus, or an AgPdCu alloy may be used. Alternatively, a single layer structure or a structure including a plurality of layers may be used. For example, a two-layer structure of a tungsten nitride film and a molybdenum (Mo) film or a three-layer structure in which a tungsten film with a thickness of 50 nm, an alloy film of aluminum and silicon (Al—Si) with a thickness of 500 nm, and a titanium nitride film with a thickness of 30 nm are sequentially stacked may be used. In the case of the three-layer structure, tungsten nitride may be used instead of tungsten of a first conductive film, an alloy film of aluminum and titanium (Al—Ti) may be used instead of the alloy film of aluminum and silicon (Al—Si) of a second conductive film, and a titanium film may be used instead of the titanium nitride film of a third conductive film.

The gate electrode layers 103a, 103b, 104a and 104b can be formed using a mask layer by a sputtering method, a PVD (Physical Vapor Deposition) method, a CVD (Chemical Vapor Deposition) method such as a low-pressure CVD (LPCVD) method or a plasma CVD method, or the like. Alternatively, a method by which a component can be formed into a desired pattern by transferring or drawing, for example, various printing methods (a method for forming a component into a desired pattern, such as screen (mimeograph) printing, offset (planograph) printing, relief printing, or gravure (intaglio) printing), a dispenser method, a selective-coating method, or the like may be used.

A conductive film may be processed by dry etching or wet etching. An ICP (Inductively Coupled Plasma) etching method may be used, and by adjusting etching conditions (the amount of power applied to a coiled electrode, the amount of power applied to an electrode on a substrate side, the electrode temperature on the substrate side, and the like) as appropriate, the electrode layer may be etched into a tapered shape. It is to be noted that as an etching gas, a chlorine-based gas typified by $Cl_2$, $BCl_3$, $SiCl_4$, or $CCl_4$, a fluorine-based gas typified by $CF_4$, $SF_6$, or $NF_3$, or $O_2$ can be used as appropriate.

In this embodiment mode, as for formation of a gate electrode layer, after the conductive film that is the light absorbing film is formed over a transfer substrate, the gate electrode layer is processed into a predetermined shape and selectively formed over the transfer substrate by laser light. The light absorbing film is formed over a substrate 101 by a sputtering method, a PVD (Physical Vapor Deposition) method, a CVD method such as a low-pressure CVD (LPCVD) method or a plasma CVD method, or the like.

The light absorbing film is formed over the substrate 101 that is a transfer substrate, and the substrate 101 and a substrate 100 that is a substrate to which a light absorbing layer is transferred are provided such that the substrate 100 and the light absorbing film over the substrate 101 face each other.

Laser light 112a to 112d transmit the substrate 101 to be selectively irradiated onto a light absorbing film. The light absorbing film in regions irradiated with the laser light 112a to 112c absorbs the laser light 112a to 112d and is transferred to the substrate 100 side as gate electrode layers 103 (103a and 103b) and 104 (104a and 104b) by energy of the heat or the like. On the other hand, regions which are not irradiated with the laser light 112a to 112d remain on the substrate 101 side as light absorbing films 102a to 102d. Thus, the light absorbing films are selectively transferred, and the gate electrode layers 103 (103a and 103b) and 104 (104a and 104b) are selectively formed so as to have a desired shape without the use of a photolithography process (see FIGS. 8A to 8C).

After being transferred by laser light, a light absorbing layer may be subjected to heat treatment or may be irradiated with laser light.

A material which absorbs irradiation light is used for the light absorbing film that is a transferred object, and a light transmitting substrate which transmits irradiation light is used for the substrate 101. By using the present invention, transposition to various substrates can be freely performed; therefore, the number of materials that can be selected for use for a substrate increases. Further, an inexpensive material can be selected for the substrate. Therefore, a display device can be made to have a wide range of functions to match intended uses, and further, can be manufactured at low cost.

Next, a gate insulating layer 105 is formed over the gate electrode layers 103a, 103b, 104a, and 104b. The gate insulating layer 105 may be formed of an oxide material of silicon, a nitride material of silicon, or the like, and a single-layer or stacked-layer structure may be used. In this embodiment mode, a two-layer structure of a silicon nitride film and a silicon oxide film is used. Alternatively, a single-layer structure of a silicon oxynitride film or a stacked-layer structure of three or more layers may be used. Preferably, a silicon nitride film which is a dense film is used. When silver, copper, or the like is used for a conductive layer formed by a droplet discharging method, by formation of a silicon nitride film or an NiB film as a barrier film thereover, advantageous effects in that diffusion of an impurity is prevented and the surface is planarized can be obtained. In order to form a dense insulating film with less gate leakage current at a low deposition temperature, a reaction gas containing a rare gas element such as argon may be mixed into an insulating film.

Subsequently, an opening 107 is formed in the gate insulating layer 105. A mask layer is formed of an insulator such as resist or polyimide by a droplet discharging method. The opening 107 is formed in part of the gate insulating layer 105 by etching with the use of the mask layer, so that part of the gate electrode layer 104 provided below the gate insulating layer 105 can be exposed. Either plasma etching (dry etching) or wet etching may be employed for etching; however, plasma etching is suitable for processing a large substrate. As the etching gas, a fluorine-based gas or chlorine-based gas such as $CF_4$, $NF_3$, $Cl_2$, or $BCl_3$ is used. An inert gas such as He or Ar may be added to the etching gas as appropriate. When an etching process using an atmospheric discharge is employed, a local discharging process is also possible, and it is not necessary to form the mask layer over the entire surface of the substrate.

Figure 9A:
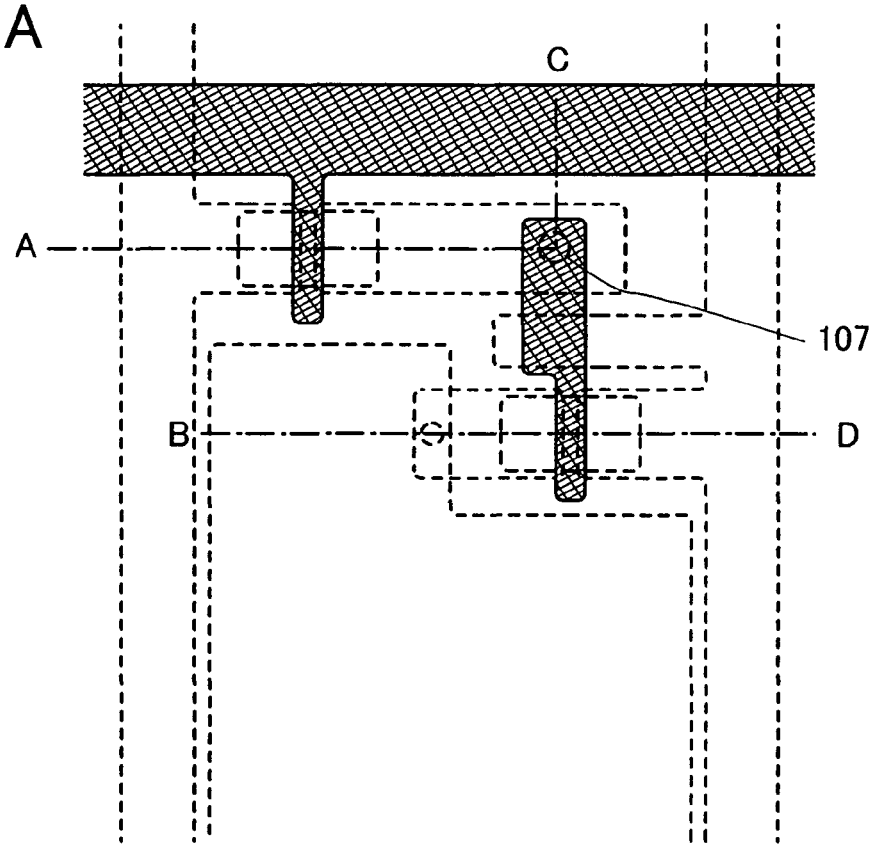
FIGS. 9A to 9C are views showing a method for manufacturing a display device of the present invention.
Figure 9B:
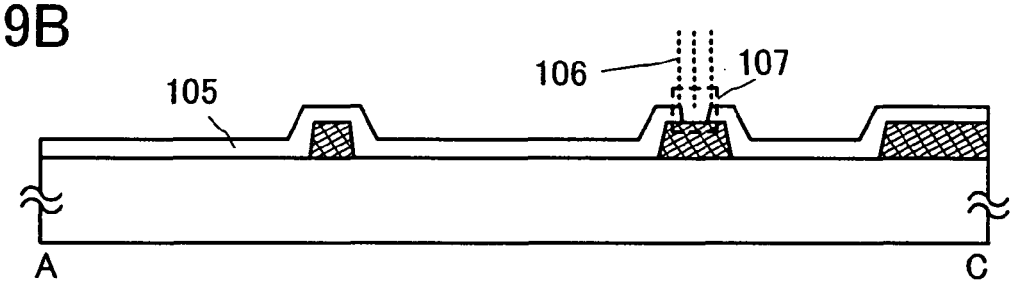
Figure 9C:
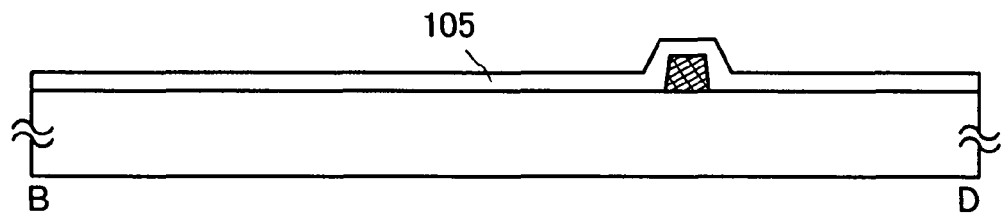
Figure 10A:
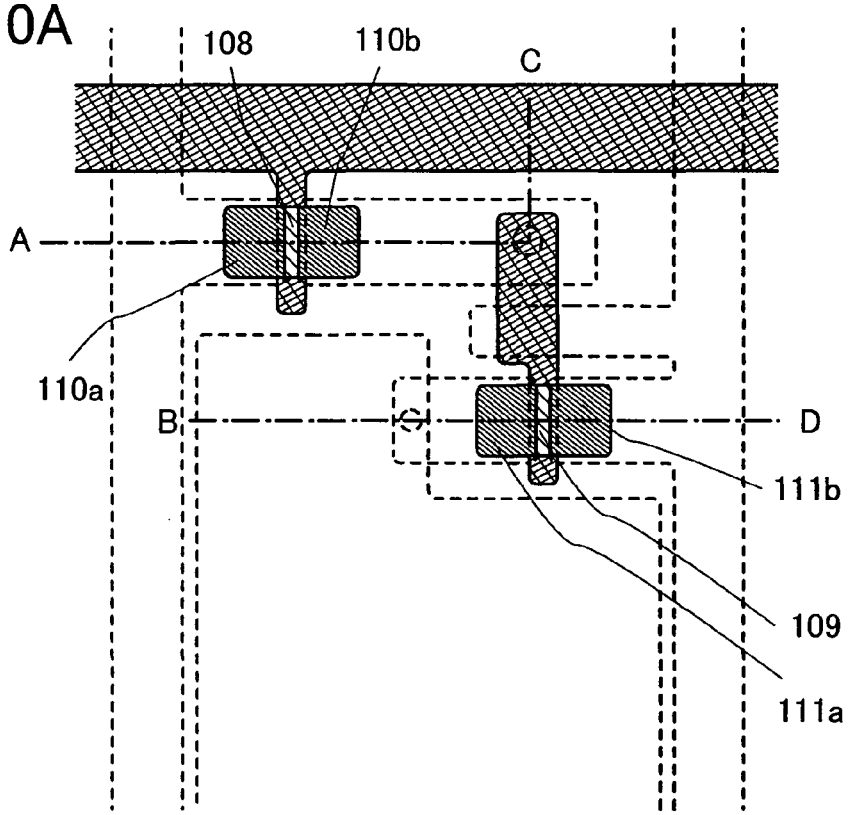
FIGS. 10A to 10C are views showing a method for manufacturing a display device of the present invention.
Figure 10B:
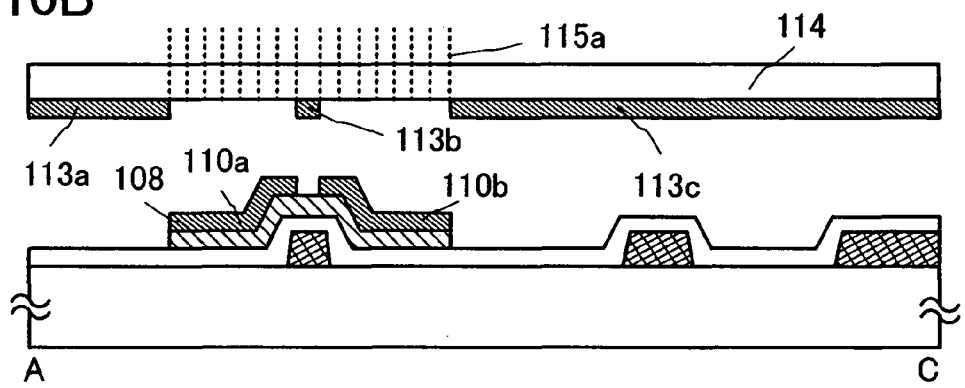
Figure 10C:
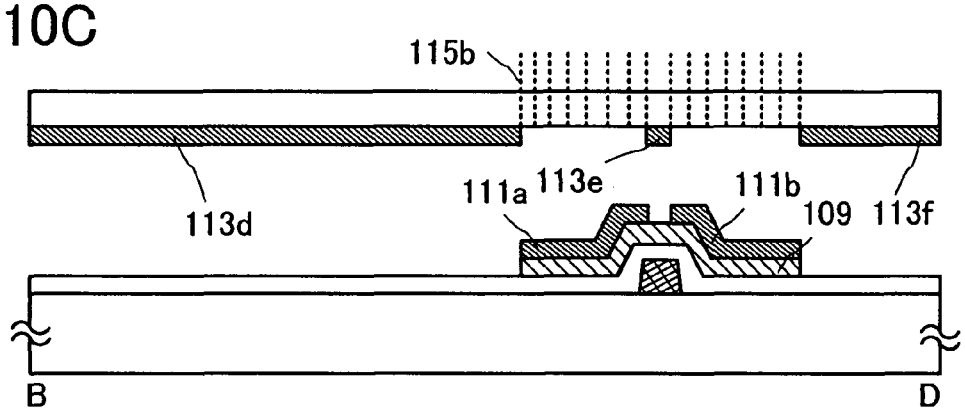

In this embodiment mode, the opening 107 is formed by laser light as described in Embodiment Mode 1 (see FIGS. 9A to 9C). The gate electrode layer 104 is selectively irradiated with laser light from the gate insulating layer 105 side, and the gate insulating layer 105 over the irradiated region of the gate electrode layer 104 can be removed to form the opening 107. A conductive film forming a source electrode layer or drain electrode layer is formed in the opening 107 where the gate electrode layer 104 is exposed, and the gate electrode layer 104 and the source electrode layer or drain electrode layer can be electrically connected to each other. The opening 107 may be formed after formation of a semiconductor layer.

Next, a semiconductor layer is formed. A semiconductor layer having one conductivity type may be formed as needed. Further, an NMOS structure including an n-channel thin film transistor in which an n-type semiconductor layer is formed, a PMOS structure including a p-channel thin film transistor in which a p-type semiconductor layer is formed, or a CMOS structure including an n-channel thin film transistor and a p-channel thin film transistor can be formed. In order to impart conductivity, the semiconductor layer may be doped with an element imparting conductivity to form an impurity region in the semiconductor layer, so that an n-channel TFT and a p-channel TFT can be formed. Instead of formation of the n-type semiconductor layer, plasma treatment with a $PH_3$ gas may be performed, so that conductivity is imparted to the semiconductor layer.

A material for forming the semiconductor layer can be an amorphous semiconductor (hereinafter also referred to as "AS") formed by a vapor deposition method using a semiconductor material gas typified by silane or germane or a sputtering method, a polycrystalline semiconductor formed by crystallization of the amorphous semiconductor with the use of light energy or thermal energy, a semi-amorphous semiconductor (also referred to as microcrystal and hereinafter also referred to as "SAS"), or the like. The semiconductor layer can be formed by various methods (a sputtering method, an LPCVD method, a plasma CVD method, and the like).

An SAS is a semiconductor having an intermediate structure between an amorphous structure and a crystalline structure (including single crystal and polycrystal) and a third state which is stable in free energy. Moreover, an SAS includes a crystalline region with a short-distance order and lattice distortion. A crystal region having a diameter of 0.5 to 20 nm can be observed in at least a portion of a film. In the case where silicon is contained as a main component, Raman spectrum is shifted to the low frequency side that is lower than 520 $cm^{-1}$. The diffraction peaks of (111) and (220), which are believed to be derived from silicon crystal lattice, are observed by X-ray diffraction. An SAS contains hydrogen or halogen by at least 1 atomic % or more for terminating dangling bonds. An SAS is formed by glow discharge decomposition (plasma CVD) of a gas containing silicon. As the gas containing silicon, $SiH_4$, $Si_2H_6$, $SiH_2Cl_2$, $SiHCl_3$, $SiCl_4$, $SiF_4$, or the like can be used. Further, $F_2$ or $GeF_4$ may be mixed. The gas containing silicon may be diluted with $H_2$, or $H_2$ and one or a plurality of kinds of rare gas elements selected from He, Ar, Kr, and Ne. The dilution ratio is 1:2 to 1:1000, pressure is approximately 0.1 to 133 Pa, and a power source frequency is 1 to 120 MHz, preferably, 13 to 60 MHz. A temperature for heating the substrate is preferably 300° C. or lower, and an SAS can be formed at 100 to 200° C. as well. It is preferable here that the concentration of impurities of atmospheric components such as oxygen, nitrogen, and carbon as impurity elements taken into the film mainly in deposition be $1\times10^{20}$ $cm^{-3}$ or lower. In particular, an oxygen concentration is preferably $5\times10^{19}/cm^{-3}$ or lower, and more preferably, $1\times10^{19}/cm^{-3}$ or lower. Further, when a rare gas element such as helium, argon, krypton, or neon is contained to further promote the lattice distortion, stability can be enhanced, and a favorable SAS can be obtained. Further, as the semiconductor layer, an SAS layer formed using a hydrogen-based gas may be stacked over an SAS layer formed using a fluorine-based gas.

As a typical example of an amorphous semiconductor, hydrogenated amorphous silicon can be given, and polysilicon or the like can be given as a typical example of a crystalline semiconductor. Polysilicon (polycrystalline silicon) may be so-called high-temperature polysilicon formed using polysilicon which is formed at processing temperatures of 800° C. or higher as a main material, so-called low-temperature polysilicon formed using polysilicon which is formed at processing temperatures of 600° C. or lower as a main material, polysilicon crystallized by the addition of an element which promotes crystallization, or the like. It is needless to say that a semi-amorphous semiconductor or a semiconductor which includes a crystalline phase in a portion thereof may be used as described above.

When a crystalline semiconductor layer is used for the semiconductor layer, the crystalline semiconductor layer may be formed by various methods (a laser crystallization method, a thermal crystallization method, a thermal crystallization method using an element such as nickel which promotes crystallization, and the like). Further, a microcrystalline semiconductor that is an SAS may be crystallized by laser irradiation to enhance crystallinity. In the case where an element which promotes crystallization is not introduced, before the amorphous silicon film is irradiated with laser light, the amorphous silicon film is heated at 500° C. for one hour in a nitrogen atmosphere to discharge hydrogen so that a hydrogen concentration in the amorphous silicon film is $1\times10^{20}$ atoms/cm$^3$ or lower. This is because, if the amorphous silicon film contains a lot of hydrogen, the amorphous silicon film may be broken by laser beam irradiation.

There is no particular limitation on a method for introducing a metal element into the amorphous semiconductor layer as long as it is a method for introducing the metal element to a surface or inside of the amorphous semiconductor layer. For example, a sputtering method, a CVD method, a plasma treatment method (including a plasma CVD method), an adsorption method, or a method for applying a solution of metal salt can be used. Among these methods, a method using a solution is simple and advantageous in that the concentration of the metal element can be easily controlled. At this time, it is desirable to form an oxide film by UV light irradiation in an oxygen atmosphere, a thermal oxidation method, treatment with ozone water containing hydroxyl radical or hydrogen peroxide, or the like to improve wettability of the surface of the amorphous semiconductor layer so that an aqueous solution is diffused on the entire surface of the amorphous semiconductor layer.

In order to crystallize the amorphous semiconductor layer, heat treatment and irradiation with laser light may be performed in combination, or one of heat treatment and irradiation with laser light may be performed multiple times.

Further, the crystalline semiconductor layer may be directly formed over the substrate by a plasma method. Alternatively, the crystalline semiconductor layer may be selectively formed over the substrate by a linear plasma method.

The semiconductor layer may be formed of an organic semiconductor material by a printing method, a dispenser method, a spray method, a spin coating method, a droplet discharging method, or the like. In this case, the etching step is not necessary; therefore, the number of steps can be reduced. As the organic semiconductor, a low-molecular material such as pentacene, a high-molecular material, an organic dye, a conductive high-molecular material, or the like can be used. As the organic semiconductor material used in the present invention, a π-electron conjugated high-molecular material whose skeleton includes a conjugated double bond is desirable. Typically, a soluble high-molecular material such as polythiophene, polyfluorene, poly(3-alkylthiophene), or a polythiophene derivative can be used.

In addition, as the organic semiconductor material which can be used in the present invention, there is a material which can form a semiconductor layer by performing of a process after forming of a soluble precursor. Note that such an organic semiconductor material may be polythienylenevinylene, poly (2,5-thienylenevinylene), polyacetylene, polyacetylene derivatives, polyallylenevinylene, or the like.

The precursor is changed into the organic semiconductor not only by heat treatment but also by the addition of a reaction catalyst such as a hydrogen chloride gas. Moreover, as a typical solvent for dissolving the soluble organic semiconductor material, toluene, xylene, chlorobenzene, dichlorobenzene, anisole, chloroform, dichloromethane, γbutyllactone, butylcellosolve, cyclohexane, N-methyl-2-pyrrolidone (NMP), cyclohexanone, 2-butanon, dioxane, dimethylformamide (DMF), tetrahydrofuran (THF), and the like can be used.

In this embodiment mode, after a semiconductor film that is the light absorbing film is formed over a transfer substrate, a semiconductor layer and a semiconductor layer having one conductivity type are selectively formed to have a desired shape by being transferred to a substrate to which a light absorbing layer is transferred by laser light. The semiconductor film that is the light absorbing film is formed over a substrate 114 by a sputtering method, a PVD (Physical Vapor Deposition) method, a CVD method such as a low-pressure CVD (LPCVD) method or a plasma CVD method, or the like.

The light absorbing film is formed over the substrate 114 that is a transfer substrate, and the substrate 114 and a substrate 100 that is a substrate to which a light absorbing layer is transferred are provided such that the substrate 100 and the light absorbing film over the substrate 114 face each other.

Laser light 115a and 115b is transmitted through the substrate 114 and selectively irradiated onto the light absorbing film. A region in the light absorbing film, which is irradiated with the laser light 115a and 115b, absorbs the laser light 115a and 115b and is transferred to the substrate 100 side as semiconductor layers having one conductivity type 110a, 110b, 111a, and 111b by energy of the heat or the like. On the other hand, regions which are not irradiated with the laser light 115a and 115b remain on the substrate 114 side as light absorbing films 113a to 113f. Semiconductor layers 108 and 109 can also be formed by a transfer method using laser light similarly to the semiconductor layer having one conductivity type. Thus, the light absorbing films are selectively transferred, and the semiconductor layers 108 and 109 and the semiconductor layers having one conductivity type 110a, 110b, 111a, and 111b are selectively formed so as to have a predetermined shape without the use of a photolithography process (see FIGS. 10A to 10C).

After being transferred by laser light, a light absorbing layer may be subjected to heat treatment or may be irradiated with laser light.

A material which absorbs irradiation light is used for the light absorbing film that is a transferred object, and a light transmitting substrate which transmits irradiation light is used for the substrate 114. By using the present invention, transposition to various substrates can be freely performed; therefore, the number of materials that can be selected for use for a substrate increases. Further, an inexpensive material can be selected for the substrate. Therefore, a display device can be made to have a wide range of functions to match intended uses, and further, can be manufactured at low cost.

In this embodiment mode, amorphous semiconductor layers are formed as the semiconductor layers 108 and 109 and the semiconductor layers having one conductivity type 110a, 110b, 111a, and 111b. In this embodiment mode, an n-type semiconductor film containing phosphorus (P), which is an impurity element imparting n-type conductivity, is formed as the semiconductor film having one conductivity type. The semiconductor film having one conductivity type functions as a source region and a drain region. The semiconductor film having one conductivity type may be formed as needed, and an n-type semiconductor film containing an impurity element imparting n-type conductivity (P, As) or a p-type semiconductor film containing an impurity element imparting p-type conductivity (B) can be formed.

Source electrode layers or drain electrode layers 116 to 119 are formed over the substrate 100. As the source electrode layers or drain electrode layers 116 to 119, an element selected from Ag (silver), Au (gold), Cu (copper), W (tungsten), and Al (aluminum), or an alloy material or a compound material containing the above element as its main component, or the like can be used. Alternatively, titanium nitride, indium tin oxide (ITO), indium tin oxide containing silicon oxide (ITSO), organic indium, organic tin, or zinc oxide, or the like which has a light-transmitting property may be combined.

The source electrode layers or drain electrode layers 116 to 119 can be processed to be formed using a mask layer by a sputtering method, a PVD (Physical Vapor Deposition) method, a CVD (Chemical Vapor Deposition) method such as a low-pressure CVD (LPCVD) method or a plasma CVD method, or the like. Alternatively, a method by which a component can be formed into a desired pattern by transferring or drawing, for example, various printing methods (a method for forming a component into a desired pattern, such as screen (mimeograph) printing, offset (planograph) printing, relief printing, or gravure (intaglio) printing), a droplet discharging method, a dispenser method, a selective-coating method, or the like may be used.

A conductive film may be processed by dry etching or wet etching. An ICP (Inductively Coupled Plasma) etching method may be used, and by adjusting etching conditions (the amount of power applied to a coiled electrode, the amount of power applied to an electrode on a substrate side, the electrode temperature on the substrate side, and the like) as appropriate, the electrode layer may be etched into a tapered shape. It is to be noted that as an etching gas, a chlorine-based gas typified by $Cl_2$, $BCl_3$, $SiCl_4$, or $CCl_4$, a fluorine-based gas typified by $CF_4$, $SF_6$, or $NF_3$, or $O_2$ can be used as appropriate.

In this embodiment mode, as for formation of source electrode layers or drain electrode layers, after the conductive film that is the light absorbing film is formed over a transfer substrate, the gate electrode layer is processed into a predetermined shape and then selectively formed over the transfer substrate by laser light. The light absorbing film is formed over a substrate 101 by a sputtering method, a PVD (Physical Vapor Deposition) method, a CVD method such as a low-pressure CVD (LPCVD) method or a plasma CVD method, or the like.

The light absorbing film is formed over the substrate 121 that is a transfer substrate, and the substrate 121 and a substrate 100 that is a substrate to which a light absorbing layer is transferred are provided such that the substrate 100 and the light absorbing film over the substrate 101 face each other.

Figure 11A:
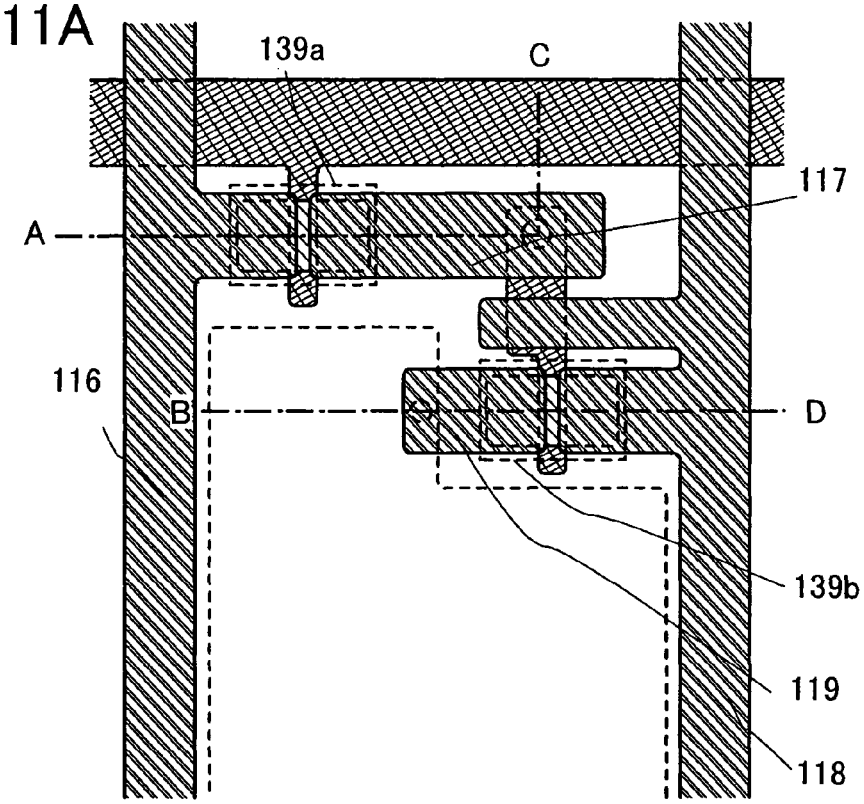
FIGS. 11A to 11C are views showing a method for manufacturing a display device of the present invention.
Figure 11B:
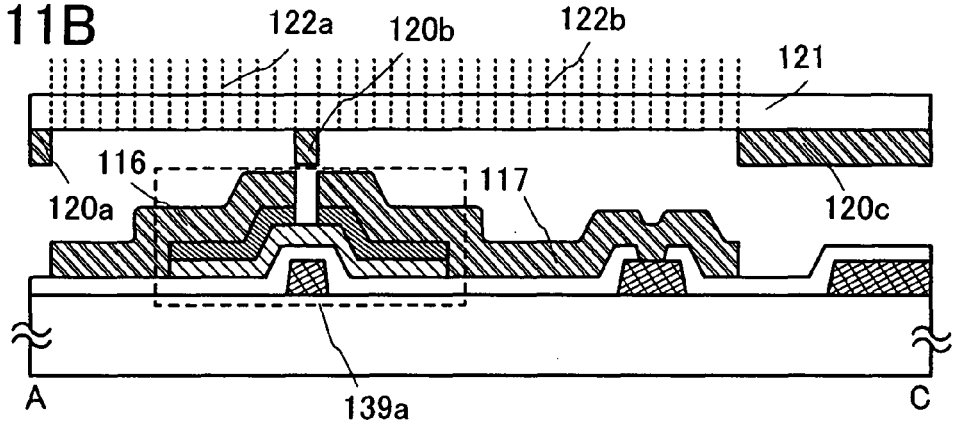
Figure 11C:
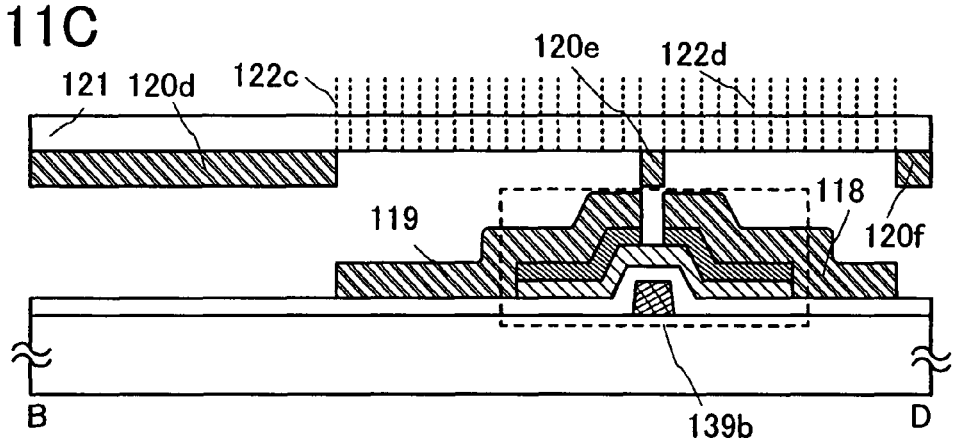
Figure 12A:
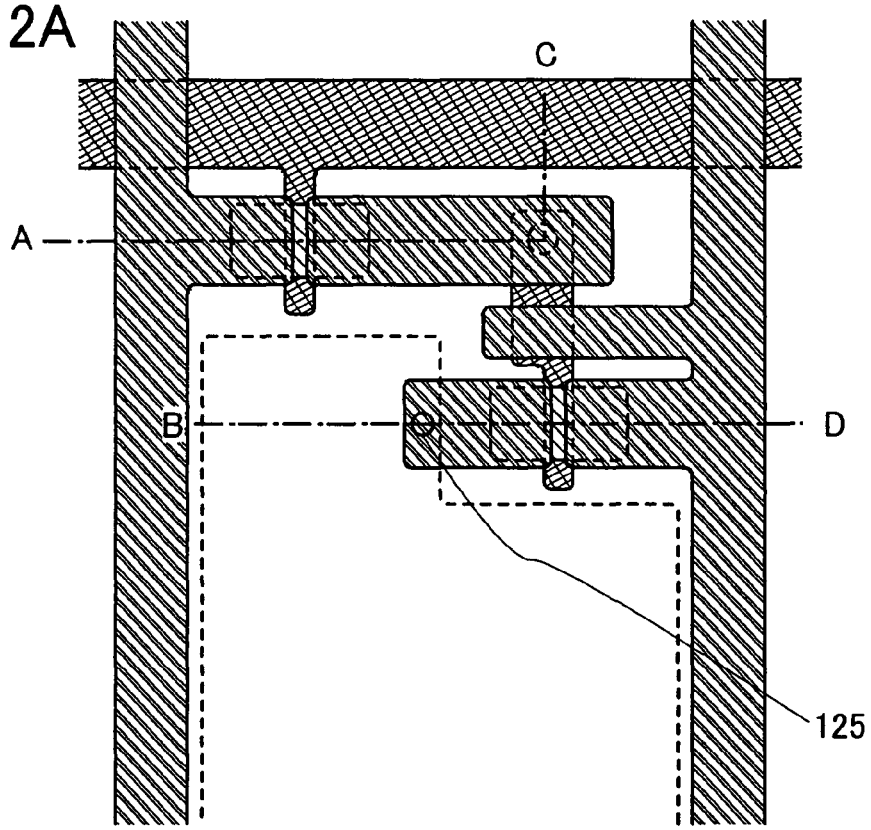
FIGS. 12A to 12C are views showing a method for manufacturing a display device of the present invention.
Figure 12B:
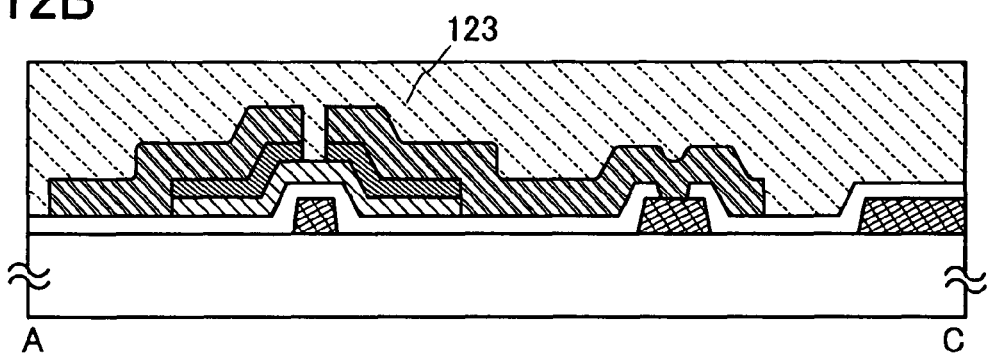
Figure 12C:
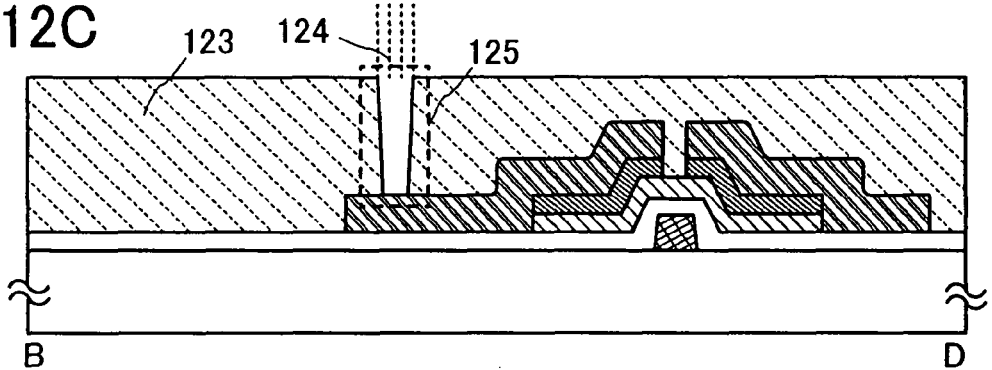
Figure 13A:
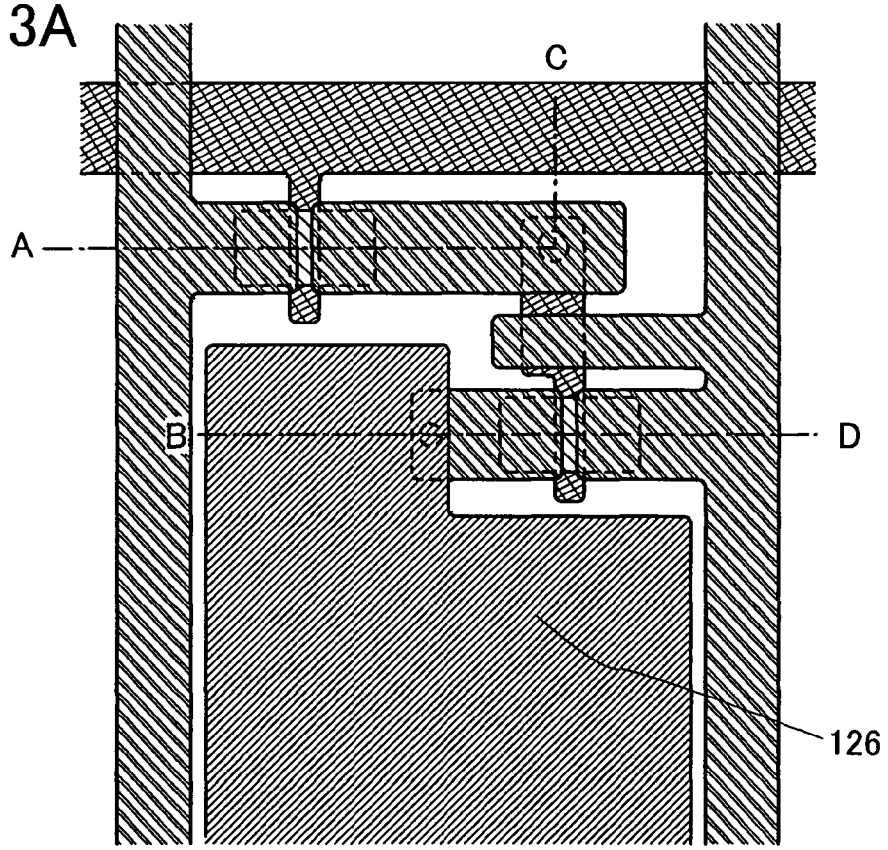
FIGS. 13A to 13C are views showing a method for manufacturing a display device of the present invention.
Figure 13B:
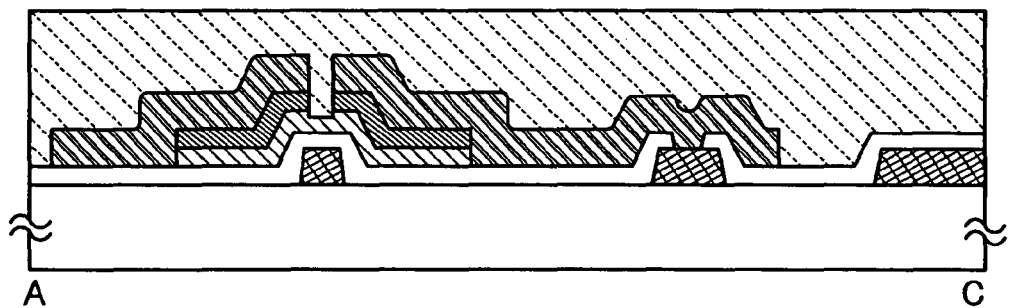
Figure 13C:
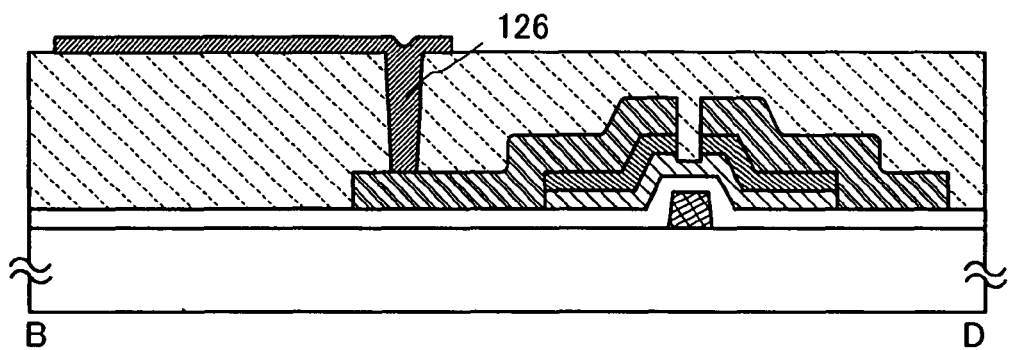

Laser light 122a to 122d is transmitted through the substrate 121 and selectively irradiated onto a light absorbing film. The light absorbing film in a region irradiated with the laser light 122a to 122d absorbs the laser light 122a to 122d and is transferred to the substrate 100 side as the source electrode layers or drain electrode layers 116 to 119 by energy of the heat or the like. On the other hand, regions which are not irradiated with the laser light 122a to 122d remains on the substrate 121 side as light absorbing films 120a to 120d and 120f. Thus, the light absorbing films are selectively transferred, and the source electrode layers or drain electrode layers 116 to 119 are selectively formed so as to have a predetermined shape without using a photolithography process (FIGS. 11A to 11C).

After being transferred by laser light, a light absorbing layer may be subjected to heat treatment or may be irradiated with laser light.

A material which absorbs irradiation light is used for the light absorbing film that is a transferred object, and a light transmitting substrate which transmits irradiation light is used for the substrate 121. By the present invention, transposition to various substrates can be freely performed; therefore, the number of materials which can be selected for use for a substrate increases. Further, an inexpensive material can be selected for the substrate. Therefore, a display device can be made to have a wide range of functions to match intended uses, and further, can be manufactured at low cost.

The source electrode layer or drain electrode layer 116 also functions as a source wiring layer, and the source electrode layer or drain electrode layer 118 also functions as a power source line.

In the opening 107 formed in the gate insulating layer 105, the gate electrode layer 104 and the source electrode layer or drain electrode layer 117 can be electrically connected to each other. A part of the source electrode layer or drain electrode layer 118 forms a capacitor.

Through the above process, transistors 139a and 139b which are inverse staggered thin film transistors are formed (see FIGS. 11A to 11C).

An insulating layer 123 is formed over the gate insulating layer 105 and the transistors 139a and 139b.

The insulating layer 123 can be formed by a sputtering method, a PVD (Physical Vapor Deposition) method, a CVD (Chemical Vapor Deposition) method such as a low-pressure CVD (LPCVD) method or a plasma CVD method, or the like. Alternatively, a droplet discharging method, various printing methods (a method for forming a pattern, such as screen printing or offset printing), a coating method such as a spin-coating method, a dipping method, a dispenser method, or the like may be used.

The insulating layer 123 can also be formed using a material selected from silicon oxide, silicon nitride, silicon oxinitride, aluminum oxide, aluminum nitride, aluminum oxynitride, diamond-like carbon (DLC), nitrogen-containing carbon (CN), polysilazane, and other substances containing an inorganic insulating material. A material containing siloxane may be used. Alternatively, an organic insulating material such as polyimide, acrylic, polyamide, polyimide amide, resist, or benzocyclobutene may be used. Further alternatively, an oxazole resin can be used, and for example, photocurable polybenzoxazole or the like can be used.

Next, the opening 125 is formed in the insulating layer 123. In this embodiment mode, the opening 125 is formed by laser light as described in Embodiment Mode 1. The source electrode layer or drain electrode layer 119 is selectively irradiated with laser light 124 from the insulating layer 123 side, and the insulating layer 123 over the irradiated region of the source electrode layer or drain electrode layer 119 can be removed to form the opening 125 (see FIGS. 12A to 12C).

A first electrode layer 126 of a light-emitting element, which functions as a pixel electrode, is formed in the opening 125 where the source electrode layer or drain electrode layer 119 is exposed, and the source electrode layer or drain electrode layer 119 and the first electrode layer 126 can be electrically connected to each other.

The first electrode layer 126 may also be selectively formed in a similar manner to that described in Embodiment Mode 3, in which a conductive light absorbing film is formed over the transfer substrate and then laser light is irradiated, so that the first electrode layer 126 is processed into a desired shape and selectively formed over the substrate to which a light absorbing layer is transferred.

In this embodiment mode, after a conductive film is formed, the first electrode layer is processed into a desired shape with the use of a mask layer and formed.

The first electrode layer 126 is formed by a sputtering method, a PVD (Physical Vapor Deposition) method, a CVD method such as a low-pressure CVD (LPCVD) method or a plasma CVD method, or the like. As a conductive material forming the first electrode layer 126, indium tin oxide (ITO), indium tin oxide containing silicon oxide (ITSO), or zinc oxide (ZnO) can be used. Preferably, indium tin oxide containing silicon oxide which is formed with the use of a target of ITO containing 2 to 10% by weight of silicon oxide by a sputtering method is used. Alternatively, a conductive material in which ZnO is doped with gallium (Ga) or indium zinc oxide (IZO) which is an oxide conductive material containing silicon oxide formed with the use of a target of indium oxide mixed with 2 to 20 wt % of zinc oxide (ZnO) may be used.

As a mask layer, a resin material such as an epoxy resin, a phenol resin, a novolac resin, an acrylic resin, a melamine resin, or a urethane resin is used. Moreover, the mask layer is formed by a droplet discharging method using an organic material such as benzocyclobutene, parylene, fluorinated arylene ether, or polyimide having a light-transmitting property; a compound material formed by polymerization of a siloxane-based polymer or the like; a composition material containing water-soluble homopolymer and water-soluble copolymer; or the like. Alternatively, a commercial resist material containing photosensitizer may be used. For example, a positive resist or a negative resist may be used. In using any material, the surface tension and the viscosity of a material are adjusted as appropriate, for example, by adjustment of the concentration of a solvent or by addition of a surfactant or the like.

The first electrode layer 126 may be processed by dry etching or wet etching. An ICP (Inductively Coupled Plasma) etching method may be used, and by adjusting of etching conditions (the amount of power applied to a coiled electrode, the amount of power applied to an electrode on a substrate side, the electrode temperature on the substrate side, and the like) as appropriate, the electrode layer may be etched into a tapered shape. It is to be noted that as an etching gas, a chlorine-based gas typified by $Cl_2$, $BCl_3$, $SiCl_4$, or $CCl_4$, a fluorine-based gas typified by $CF_4$, $SF_6$, or $NF_3$, or $O_2$ can be used as appropriate.

The first electrode layer 126 may be cleaned and polished by a CMP method or with the use of a polyvinyl alcohol-based porous material so that the surface thereof is planarized. In addition, after being polished using a CMP method, the surface of the first electrode layer 126 may be subjected to ultraviolet light irradiation, oxygen plasma treatment, or the like.

Through the above process, a TFT substrate for a display panel where a bottom-gate TFT and the first electrode layer 126 are connected to each other over the substrate 100 is completed. The TFT in this embodiment mode is an inverse staggered TFT.

Next, an insulating layer 131 (also referred to as a partition wall) is selectively formed. The insulating layer 131 is formed so as to have an opening portion over the first electrode layer 126. In this embodiment mode, the insulating layer 131 is formed over the entire surface and processed by etching with the use of a mask such as resist. When the insulating layer 131 is formed by a droplet discharging method, a printing method, a dispenser method, or the like by which it can be formed directly and selectively, processing by etching is not always necessary.

The insulating layer 131 can be formed using an inorganic insulating material such as silicon oxide, silicon nitride, silicon oxynitride, aluminum oxide, aluminum nitride, or aluminum oxynitride; an acrylic acid, a methacrylic acid, or a derivative thereof; a heat-resistant high-molecular such as polyimide, aromatic polyamide, or polybenzimidazole; an insulating material of inorganic siloxane including a Si—O—Si bond among compounds which are formed using a siloxane-based material as a starting material and which contain silicon, oxygen, and hydrogen; or an organic siloxane-based insulating material in which hydrogen bonded to silicon is substituted with an organic group such as methyl or phenyl. Alternatively, a photosensitive or nonphotosensitive material such as acrylic or polyimide may be used. It is preferable that the insulating layer 131 be formed to have a continuously-changing curvature radius because the coverage by an electroluminescent layer 132 and a second electrode layer 133 to be formed over the insulating layer 131 is improved.

After the insulating layer 131 is formed by discharging of a composition by a droplet-discharging method, a surface thereof may be planarized by being pressed with pressure to enhance a level of planarity. As a pressing method, concavity and convexity of the surface may be reduced by scanning of the surface by a roller-shaped object, or the surface may be pressed perpendicularly by a flat plate-shaped object. Alternatively, concavity and convexity of the surface may be removed with an air knife after the surface is softened or melted with a solvent or the like. Alternatively, a CMP method may be used for polishing the surface. This step can be employed to planarize the surface when the surface becomes uneven due to a droplet-discharging method. When a level of planarity is enhanced by this step, uneven display of the display panel can be prevented, and thus a high-definition image can be displayed.

A light-emitting element is formed over the substrate 100 that is a TFT substrate for the display panel (see FIGS. 14A and 14B).

Before an electroluminescent layer 132 is formed, heat treatment is performed at 200° C. in atmospheric pressure to remove moisture that is in the first electrode layer 134 and the insulating layer 131 or moisture adsorbed on their surfaces. It is preferable to perform the heat treatment at 200 to 400° C., more preferably 250 to 350° C., under low pressure and to form the electroluminescent layer 132 successively without exposing the substrate to the air by a vacuum evaporation method or a droplet discharging method under low pressure.

As the electroluminescent layer 132, materials emitting light of red (R), green (G), and blue (B) are selectively formed by an evaporation method or the like using evaporation masks. Alternatively, the materials emitting light of red (R), green (G), and blue (B) may be formed by a droplet discharging method similarly to a color filter (such as a low-molecular material or a high-molecular material), and thus materials for R, G, and B can be individually formed without the use of masks, which is preferable. A second electrode layer 133 is formed over the electroluminescent layer 132, and a display device having a display function using a light-emitting element is completed.

Although not shown in the drawings, it is effective to provide a passivation film so as to cover the second electrode layer 133. A passivation (protection) film provided when a display device is formed may have a single-layer structure or a multilayer structure. The passivation film can be formed using an insulating film containing silicon nitride (SiN), silicon oxide ($SiO_2$), silicon oxynitride (SiON), silicon nitride oxide (SiNO), aluminum nitride (AlN), aluminum oxynitride (AlON), aluminum nitride oxide containing more nitrogen than oxygen (AlNO), aluminum oxide, diamond-like carbon (DLC), or carbon-containing nitrogen ($CN_x$) with a single-layer structure or a stacked-layer structure. For example, a stacked layer of a carbon-containing nitrogen ($CN_x$) film and a silicon nitride (SiN) film, an organic material, or a stacked layer of a high molecular such as a styrene polymer may be used. Alternatively, a siloxane material may be used.

In that case, it is preferable to use a film which provides favorable coverage as the passivation film, and it is effective to use a carbon film, particularly, a DLC film as the passivation film. A DLC film can be formed in the range from room temperature to 100° C.; therefore, it can also be formed easily over an electroluminescent layer with low heat resistance. A DLC film can be formed by a plasma CVD method (typically, an RF plasma CVD method, a microwave CVD method, an electron cyclotron resonance (ECR) CVD method, a thermal-filament CVD method, or the like), a combustion flame method, a sputtering method, an ion beam evaporation method, a laser evaporation method, or the like. As a reaction gas for deposition, a hydrogen gas and a hydrocarbon-based gas (for example, $CH_4$, $C_2H_2$, $C_6H_6$, and the like) are used to be ionized by glow discharge. Then, the ions are accelerated so that they impact a cathode to which negative self bias is applied. Further, a CN film may be formed with the use of a $C_2H_4$ gas and a $N_2$ gas as a reaction gas. A DLC film has a high blocking effect against oxygen; therefore, oxidization of the electroluminescent layer can be suppressed. Accordingly, a problem such as oxidation of the electroluminescent layer during a sealing step which is subsequently performed can be prevented.

A sealing material is formed, and sealing is performed using a sealing substrate. Thereafter, a flexible wiring board may be connected to a gate wiring layer that is formed so as to be electrically connected to the gate electrode layer 103, so that electrical connection to an external portion is obtained. This is also applied to a source wiring layer that is formed to be electrically connected to the source electrode layer or drain electrode layer 116 that is also a source wiring layer.

A space between the substrate 100 having an element and the sealing substrate is filled with a filler and thus is sealed. A dripping method may be used instead of filling the space with the filler. Instead of the filler, an inert gas such as nitrogen may be filled. In addition, when a drying agent is provided in the display device, deterioration due to moisture in the light-emitting element can be prevented. The drying agent may be provided on the sealing substrate side or the substrate 100 side having the element. Alternatively, a concave portion may be formed in a region where the sealing material is formed in the substrate, and the drying agent may be provided there. Further, when the drying agent is provided in a place corresponding to a region which does not contribute to display such as a driver circuit region or a wiring region of the sealing substrate, an aperture ratio is not decreased even if the drying agent is an opaque substance. The filler may contain a hygroscopic material and have a function as a drying agent. Thus, a display device having a display function using a light-emitting element is completed.

In this embodiment mode, the switching TFT has a single-gate structure; however, a multi-gate structure such as a double-gate structure may be employed instead. When the semiconductor layer is formed of SAS or a crystalline semiconductor, an impurity region can be formed by addition of an impurity imparting one conductivity type. In this case, the semiconductor layer may have impurity regions with different concentrations. For example, the vicinity of a channel region and a region overlapping with the gate electrode layer may be a low-concentration impurity region, and a region on an outer side of the low-concentration region may be a high-concentration impurity region.

This embodiment mode can be combined with any of Embodiment Modes 1 to 3 as appropriate.

By the present invention, a component such as a wiring included in a display device can be formed into a desired shape. In addition, since the number of complicated photolithography steps can be reduced and a display device can be manufactured through a simplified process, loss of materials and the cost can be reduced. Therefore, high-performance and highly reliable display devices can be manufactured with a high yield.

Embodiment Mode 5

In this embodiment mode, an example of a display device manufactured through a highly reliable and more simplified process at low cost is described. Specifically, a light-emitting display device using a light-emitting element for a display element is described. A method for manufacturing a display device in this embodiment mode is described with reference to FIGS. 15A and 15B.

As a base film over a substrate 150 having an insulating surface, a base film 151a is formed using a silicon nitride oxide film to a thickness of 10 to 200 nm (preferably, 50 to 150 nm), and a base film 151b is formed using a silicon oxynitride film to a thickness of 50 to 200 nm (preferably, 100 to 150 nm) by a sputtering method, a PVD (Physical Vapor Deposition) method, or a CVD (Chemical Vapor Deposition) method such as a low pressure CVD (LPCVD) method or a plasma CVD method. Alternatively, an acrylic acid, a methacrylic acid, or a derivative thereof; a heat-resistant high molecule such as polyimide, aromatic polyamide, or polybenzimidazole; or a siloxane resin may be used. Other resin materials such as a vinyl resin, for example, polyvinyl alcohol or polyvinyl butyral, an epoxy rein, a phenol resin, a novolac resin, an acrylic rein, a melamine resin, and a urethane resin may be used. Alternatively, an organic material such as benzocyclobutene, parylene, fluorinated arylene ether, or polyimide, or a composition material containing water-soluble homopolymers and water-soluble copolymers may be used. Further alternatively, an oxazole resin such as photo-curable polybenzoxazole may be used.

Alternatively, a droplet discharging method, a printing method (a method by which a pattern can be formed, such as screen printing or offset printing), a coating method such as a spin coating method, a dipping method, a dispenser method, or the like may be used. In this embodiment mode, the base films 151a and 151b are formed by a plasma CVD method. As the substrate 150, a glass substrate, a quartz substrate, a silicon substrate, a metal substrate, or a stainless steel substrate having an insulating film formed on its surface may be used. Alternatively, a plastic substrate having heat resistance which can withstand the processing temperature in this embodiment mode, or a flexible substrate such as a film may be used. As a plastic substrate, a substrate made of PET (polyethylene terephthalate), PEN (polyethylene naphthalate), or PES (polyethersulfone) can be used. As a flexible substrate, a synthetic resin such as acrylic can be used. Since a display device manufactured in this embodiment mode has a structure in which light is extracted from the light-emitting element through the substrate 150, it is necessary for the substrate 150 to have a light-transmitting property.

As the base film, silicon oxide, silicon nitride, silicon oxynitride, silicon nitride oxide, or the like can be used, and either a single layer structure or a stacked-layer structure including two or three layers may be employed.

Next, a semiconductor film is formed over the base film. The semiconductor film may be formed to a thickness of 25 to 200 nm (preferably, 30 to 150 nm) by various methods (such as a sputtering method, an LPCVD method, and a plasma CVD method). In this embodiment mode, it is preferable to use a crystalline semiconductor layer which is obtained by crystallization of an amorphous semiconductor film by laser.

The semiconductor film obtained as described above may be doped with a slight amount of an impurity element (boron or phosphorus) in order to control a threshold voltage of a thin film transistor. Such doping with the impurity element may be performed to the amorphous semiconductor film before the crystallization step. When the amorphous semiconductor film is doped with an impurity element and then subjected to heat treatment to be crystallized, activation of the impurity element can also be performed. In addition, a defect caused in doping or the like can be ameliorated.

Then, the crystalline semiconductor film is processed by etching into a desired shape, so that a semiconductor layer is formed.

Concerning an etching process, either plasma etching (dry etching) or wet etching may be employed. In the case of processing a large substrate, plasma etching is suitable. As an etching gas, a fluorine-based gas such as $CF_4$ or $NF_3$ or a chlorine-based gas such as $Cl_2$ or $BCl_3$ is used, and an inert gas such as He or Ar may be added to the etching gas as appropriate. When an etching process using an atmospheric discharge is employed, local discharge process is also possible, and it is not necessary to form the mask layer over the entire surface of the substrate.

In the present invention, a conductive layer for forming a wiring layer or an electrode layer, a mask layer for forming a predetermined pattern, or the like may be formed by a method by which a pattern can be selectively formed, such as a droplet discharging method. By a droplet discharging (jetting) method (also called an ink-jet method depending on its system), a droplet of a composition which is mixed for a particular purpose is selectively discharged (jetted) to form a predetermined pattern (such as a conductive layer or an insulating layer). At that time, treatment to control wettablity or adhesion may be performed on a formation region. Alternatively, a method by which a pattern can be transferred (transferred) or drawn, for example, a printing method (a method for forming a pattern, such as screen printing or offset printing), a dispenser method, or the like may be used.

A gate insulating layer which covers the semiconductor layer is formed. The gate insulating layer is formed using an insulating film containing silicon to a thickness of 10 to 150 nm by a plasma CVD method, a sputtering method, or the like. The gate insulating layer may be formed using a material such as an oxide material or a nitride material of silicon, typified by silicon nitride, silicon oxide, silicon oxynitride, and silicon nitride oxide, and may be a stacked layer or a single layer. For example, the insulating layer may have a stacked-layer structure of three layers including a silicon nitride film, a silicon oxide film, and a silicon nitride film, or a single-layer structure or a stacked-layer structure of two layers of a silicon oxynitride film.

Next, a gate electrode layer is formed over the gate insulating layer. The gate electrode layer can be formed by a sputtering method, an evaporation method, a CVD method, or the like. The gate electrode layer may be formed using an element selected from tantalum (Ta), tungsten (W), titanium (Ti), molybdenum (Mo), aluminum (Al), copper (Cu), chromium (Cr), and neodymium (Nd), or an alloy material or a compound material containing these elements as its main component. Alternatively, as the gate electrode layer, a semiconductor film typified by a polycrystalline silicon film doped with an impurity element such as phosphorus, or AgPdCu alloy may be used. The gate electrode layer may have a single-layer structure or a stacked-layer structure.

In this embodiment mode, the gate electrode layer is formed into a tapered shape; however, the present invention is not limited thereto. The gate electrode layer may have a stacked layer structure, where only one layer has a tapered shape while the other is given a perpendicular side surface by anisotropic etching. The taper angles may differ between the stacked gate electrode layers as in this embodiment mode or may be the same. Due to the tapered shape, coverage by a film that is stacked thereover is improved and defects are reduced; therefore, reliability is enhanced.

The gate insulating layer may be etched to some extent and reduced in thickness (so-called film reduction) by the etching step for forming the gate electrode layer.

An impurity element is added to the semiconductor layer to form an impurity region. The impurity region can be formed as a high concentration impurity region and a low concentration impurity region by the control of the concentration of the impurity element. A thin film transistor having a low concentration impurity region is referred to as a thin film transistor having an LDD (Light Doped Drain) structure. In addition, the low concentration impurity region can be formed so as to overlap with the gate electrode. Such a thin film transistor is referred to as a thin film transistor having a GOLD (Gate Overlapped LDD) structure. The polarity of the thin film transistor is made to be an n type by addition of phosphorus (P) or the like to an impurity region thereof. In a case of forming a p-channel thin film transistor, boron (B) or the like may be added.

In this embodiment mode, a region of the impurity region, which overlaps with the gate electrode layer with the gate insulating layer interposed therebetween, is denoted as an Lov region. Further, a region of the impurity region, which does not overlap with the gate electrode layer with the gate insulating layer interposed therebetween, is denoted as an Loff region. In FIG. 15B, the impurity regions are shown by hatching and a blank. This does not mean that the blank is not doped with an impurity element, but makes it easy to understand that the concentration distribution of the impurity element in the impurity regions reflects the mask and the doping condition. It is to be noted that this also applies to other drawings in this specification.

In order to activate the impurity element, heat treatment, intense light irradiation, or laser beam irradiation may be performed. At the same time as the activation, plasma damage to the gate insulating layer and plasma damage to the interface between the gate insulating layer and the semiconductor layer can be ameliorated.

Next, a first interlayer insulating layer covering the gate electrode layer and the gate insulating layer is formed. In this embodiment mode, a stacked-layer structure of insulating films 167 and 168 is employed. As the insulating films 167 and 168, a silicon nitride film, a silicon nitride oxide film, a silicon oxynitride film, a silicon oxide film, or the like can be formed by a sputtering method or a plasma CVD method. Alternatively, other insulating film containing silicon may be used as a single layer or a stacked-layer structure including three or more layers.

Further, heat treatment is performed at 300 to 550° C. for 1 to 12 hours in a nitrogen atmosphere to hydrogenate the semiconductor layer. Preferably, this heat treatment is performed at 400 to 500° C. In this step, dangling bonds in the semiconductor layer are terminated by hydrogen contained in the insulating film 167 that is an interlayer insulating layer. In this embodiment mode, heat treatment is performed at 410° C.

The insulating films 167 and 168 may be formed using a material selected from aluminum nitride (AlN), aluminum oxynitride (AlON), aluminum nitride oxide containing more nitrogen than oxygen (AlNO), aluminum oxide, diamond-like carbon (DLC), nitrogen-containing carbon (CN), polysilazane, and other substances containing an inorganic insulating material. A material containing siloxane may be used. Alternatively, an organic insulating material such as polyimide, acrylic, polyamide, polyimide amide, resist, or benzocyclobutene may be used. Further alternatively, an oxazole resin can be used, and for example, photo-curable polybenzoxazole or the like can be used.

Next, a contact hole (opening), which reaches the semiconductor layer, is formed in the insulating films 167 and 168, and the gate insulating layer.

In this embodiment mode, an opening is formed by laser light in a similar manner to that in Embodiment Mode 1. A source region and a drain region of the semiconductor layer are selectively irradiated with laser light from a side of the insulating films 167 and 168, and the insulating films 167 and 168 and the gate insulating layer over the irradiated region of the source region and the drain region of the semiconductor layer can be removed to form an opening.

A source electrode layer or a drain electrode layer is formed in the opening where the source region and the drain region of the semiconductor layer are exposed, and the source region and the drain region of the semiconductor layer can be electrically connected to the source electrode layer or the drain electrode layer.

In order to form the source electrode layer or drain electrode layer, a conductive film is formed by a PVD method, a CVD method, an evaporation method, or the like, and the conductive film is processed into a desired shape. Then, a conductive layer can be selectively formed in a predetermined position by a droplet discharging method, a printing method, a dispenser method, an electrolytic plating method, or the like. Alternatively, a reflow method or a damascene method may be used. The source electrode layer or drain electrode layer is formed using a metal such as Ag, Au, Cu, Ni, Pt, Pd, Ir, Rh, W, Al, Ta, Mo, Cd, Zn, Fe, Ti, Si, Ge, Zr, or Ba, or an alloy or metal nitride thereof. Alternatively, a stacked-layer structure of these materials may be used.

Also, the gate electrode layer, the semiconductor layer, the source electrode layer, and the drain electrode layer included in the display device described in this embodiment mode can be selectively formed in a similar manner to that described in Embodiment Mode 3, in which a light absorbing film using a conductive material or a semiconductor material is formed over the transfer substrate and then laser light is irradiated, so that the gate electrode layer, the semiconductor layer, the source electrode layer, and the drain electrode layer included in the display device described in this embodiment mode are processed into a desired shape and selectively formed over the substrate to which a light absorbing layer is transferred. Thus, a photolithography process is not used; therefore, the process can be simplified, and loss of materials can be prevented. Accordingly, cost reduction can be achieved.

Through the above steps, an active matrix substrate can be manufactured, in which a p-channel thin film transistor 285 having a p-type impurity region in an Lov region and an n-channel thin film transistor 275 having an n-channel impurity region in an Lov region are provided in a peripheral driver circuit region 204; and a multi-channel type n-channel thin film transistor 265 having an n-type impurity region in an Loff region and a p-channel thin film transistor 255 having a p-type impurity region in an Lov region are provided in a pixel region 206.

The structure of the thin film transistor in the pixel region is not limited to that of this embodiment mode. A single-gate structure in which one channel formation region is formed, a double-gate structure in which two channel formation regions are formed, or a triple-gate structure in which three channel formation regions are formed may be employed. Further, the thin film transistor in the peripheral driver circuit region may also employ a single gate structure, a double gate structure, or a triple gate structure.

Next, an insulating film 181 is formed as a second interlayer insulating layer. In FIGS. 15A and 15B, a separation region 201 for separation by scribing, an external terminal connection region 202 to which an FPC is attached, a wiring region 203 that is a lead wiring region for the peripheral portion, the peripheral driver circuit region 204, and the pixel region 206 are provided. Wirings 179a and 179b are provided in the wiring region 203, and a terminal electrode layer 178 connected to an external terminal is provided in the external terminal connection region 202.

The insulating film 181 can be formed using a material selected from silicon oxide, silicone nitride, silicon oxynitride, silicon nitride oxide, aluminum nitride (AlN), aluminum oxide containing nitrogen (also referred to as aluminum oxynitride) (AlON), aluminum nitride oxide containing oxygen (also referred to as aluminum nitride oxide) (AlNO), aluminium oxide, diamond-like carbon (DLC), nitrogen-containing carbon (CN), PSG (phosphorus glass), BPSG (boron phosphorus glass), alumina, and other substances containing an inorganic insulating material. A siloxane resin may also be used. Alternatively, an organic insulating material which is photosensitive or non-photosensitive such as polyimide, acrylic, polyamide, polyimide amide, resist, benzocyclobutene, polysilazane, or a low-dielectric constant material (Low-k material) may be used. Further alternatively, an oxazole resin can be used. For example, photo-curable polybenzoxazole or the like may be used. It is necessary that an interlayer insulating layer provided for planarization have high heat resistance, a high insulating property, and a high level of planarity. Thus, the insulating film 181 is preferably formed by a coating method typified by a spin coating method.

The insulating film 181 can be formed by a dipping method, spray coating, a doctor knife, a roll coater, a curtain coater, a knife coater, a CVD method, an evaporation method, or the like. Instead, the insulating film 181 may be formed by a droplet discharging method. In the case of a droplet discharging method, a material solution can be economized on. Alternatively, a method by which a pattern can be transferred or drawn, like a droplet discharging method, for example, a printing method (a method for forming a pattern, such as screen printing or offset printing), a dispenser method, or the like may be used.

A minute opening, that is, a contact hole, is formed in the insulating film 181 in the pixel region 206. The source electrode layer or drain electrode layer is electrically connected to a first electrode layer 185 through the opening formed in the insulating film 181. The opening formed in the insulating film 181 can be formed by irradiation with laser light as shown in Embodiment Mode 1. In this embodiment mode, the source electrode layer or drain electrode layer is formed using a low-melting point metal that is relatively easily evaporated (chromium in this embodiment mode). The source electrode layer or drain electrode layer is selectively irradiated with laser light from the insulating film 181 side, and then the insulating film 181 over the irradiated region of the source electrode layer or drain electrode layer is removed by irradiation energy to form the opening. The first electrode layer 185 is formed in the opening where the source electrode layer or drain electrode layer is exposed, and the source electrode layer or drain electrode layer and the first electrode layer 185 can be electrically connected to each other.

The first electrode layer 185 functions as an anode or a cathode and may be formed from a film mainly containing an element selected from Ti, Ni, W, Cr, Pt, Zn, Sn, In, and Mo, or an alloy material or a compound material containing the above element as its main component, such as titanium nitride, $TiSi_XN_Y$, $WSi_X$, tungsten nitride, $WSi_XN_Y$, or NbN; or a stacked film thereof with a total thickness of 100 to 800 nm.

In this embodiment mode, a light-emitting element is used as a display element, and the first electrode layer 185 has a light-transmitting property so that light from the light-emitting element is extracted from the first electrode layer 185 side. The first electrode layer 185 is formed using a transparent conductive film which is etched into a desired shape.

In the present invention, the first electrode layer 185 that is a light-transmitting electrode layer may be specifically formed using a transparent conductive film formed of a light-transmitting conductive material, and indium oxide containing tungsten oxide, indium zinc oxide containing tungsten oxide, indium oxide containing titanium oxide, indium tin oxide containing titanium oxide, or the like can be used. It is needless to say that indium tin oxide (ITO), indium zinc oxide (IZO), indium tin oxide added with silicon oxide (ITSO), or the like may be used instead.

In addition, even in the case of a material that does not have a light-transmitting property, such as a metal film, when the thickness is made thin (preferably, approximately 5 to 30 nm) so that light can be transmitted, light can be emitted through the first electrode layer 185. As a metal thin film that can be used for the first electrode layer 185, a conductive film formed of titanium, tungsten, nickel, gold, platinum, silver, aluminum, magnesium, calcium, lithium, or alloy thereof, or the like can be used.

The first electrode layer 185 can be formed by an evaporation method, a sputtering method, a CVD method, a printing method, a dispenser method, a droplet discharging method, or the like. In this embodiment mode, the first electrode layer 185 is formed by a sputtering method using indium zinc oxide containing tungsten oxide. The first electrode layer 185 is preferably formed to a total thickness of 100 to 800 nm. The first electrode layer 185 may also be selectively formed in a similar manner to that described in Embodiment Mode 3, in which a conductive light absorbing film is formed over the transfer substrate and then laser light is irradiated, so that the first electrode layer 185 is processed into a desired shape and selectively formed over the substrate to which a light absorbing layer is transferred.

The first electrode layer 126 may be cleaned and polished by a CMP method or with the use of a polyvinyl alcohol-based porous material so that the surface thereof is planarized. In addition, after being polished using a CMP method, the surface of the first electrode layer 126 may be subjected to ultraviolet light irradiation, oxygen plasma treatment, or the like.

Heat treatment may be performed after the first electrode layer 185 is formed. By the heat treatment, moisture contained in the first electrode layer 185 is discharged. Accordingly, degassing or the like does not occur in the first electrode layer 185. Thus, even when a light-emitting material that easily deteriorates due to moisture is formed over the first electrode layer, the light-emitting material does not deteriorate. Therefore, a highly reliable display device can be manufactured.

Next, an insulating layer 186 (also referred to as a partition wall or a barrier) covering the edge of the first electrode layer 185 and the source electrode layer or drain electrode layer is formed.

The insulating layer 186 may be formed using silicon oxide, silicon nitride, silicon oxynitride, silicon nitride oxide, or the like and has a single layer structure or a stacked-layer structure of two or three layers. Alternatively, the insulating films 186 may be formed using a material selected from aluminum nitride, aluminum oxynitride containing more oxygen than nitrogen, aluminum nitride oxide containing more nitrogen than oxygen, aluminum oxide, diamond-like carbon (DLC), nitrogen-containing carbon, polysilazane, and other substances containing an inorganic insulating material. A material containing siloxane may be used. Alternatively, an organic insulating material which is photosensitive or non-photosensitive such as polyimide, acrylic, polyamide, polyimide amide, resist, or benzocyclobutene may be used. Further alternatively, an oxazole resin can be used. For example, photo-curable polybenzoxazole or the like can be used.

The insulating layer 186 can be formed by a sputtering method, a PVD (Physical Vapor Deposition) method, a CVD (Chemical Vapor Deposition) method such as a low-pressure CVD (LPCVD) method or a plasma CVD method, or the like. Alternatively, a droplet discharging method by which a pattern can be selectively formed, a printing method by which a pattern can be transferred or drawn (a method for forming a pattern, such as screen printing or offset printing), a dispenser method, a coating method such as a spin-coating method, a dipping method, or the like may be used.

As for an etching process for the processing into desired shapes, either plasma etching (dry etching) or wet etching may be employed. In the case of processing a large substrate, plasma etching is suitable. As an etching gas, a fluorine-based gas such as $CF_4$ or $NF_3$ or a chlorine-based gas such as $Cl_2$ or $BCl_3$ is used. An inert gas such as He or Ar may be added to the etching gas as appropriate. When an etching process using an atmospheric discharge is employed, local electric discharging process is also possible, and it is not necessary to form the mask layer over the entire surface of the substrate.

In a connection region 205 shown in FIG. 15A, a wiring layer formed of the same material and in the same step as a second electrode layer is electrically connected to a wiring layer formed of the same material and in the same step as the gate electrode layer.

A light-emitting layer 188 is formed over the first electrode layer 185. Although only one pixel is shown in FIGS. 15A and 15B, electroluminescent layers corresponding to R (red), G (green) and B (blue) are formed separately in this embodiment mode.

Then, a second electrode layer 189 formed of a conductive film is provided over the light-emitting layer 188. As the second electrode layer 189, Al, Ag, Li, Ca, or an alloy or a compound thereof such as MgAg, MgIn, AlLi, or $CaF_2$, or calcium nitride may be used. Thus, a light-emitting element 190 including the first electrode layer 185, the light-emitting layer 188, and the second electrode layer 189 is formed (see FIG. 15B).

In the display device of this embodiment mode shown in FIGS. 15A and 15B, light from the light-emitting element 190 is emitted through the first electrode layer 185 side and transmitted in a direction indicated by the arrow in FIG. 15B.

In this embodiment mode, an insulating layer may be provided as a passivation film (protective film) over the second electrode layer 189. It is effective to provide a passivation film in this manner so as to cover the second electrode layer 189. The passivation film may be formed using an insulating film containing silicon nitride, silicon oxide, silicon oxynitride, silicon nitride oxide, aluminum nitride, aluminum oxynitride, aluminum nitride oxide containing more nitrogen than oxygen, aluminum oxide, diamond-like carbon (DLC), or nitrogen-containing carbon, and the insulating film can have a single-layer structure or a stacked-layer structure. Alternatively, a siloxane resin may be used.

In that case, it is preferable to use a film by which favorable coverage is provided as the passivation film, and it is effective to use a carbon film, particularly, a DLC film as the passivation film. A DLC film can be formed in the range from room temperature to 100° C.; therefore, it can also be formed easily over the light-emitting layer 188 with low heat resistance. A DLC film can be formed by a plasma CVD method (typically, an RF plasma CVD method, a microwave CVD method, an electron cyclotron resonance (ECR) CVD method, a thermal-filament CVD method, or the like), a combustion flame method, a sputtering method, an ion beam evaporation method, a laser evaporation method, or the like. As a reaction gas for deposition, a hydrogen gas and a hydrocarbon-based gas (for example, $CH_4$, $C_2H_2$, $C_6H_6$, and the like) are used to be ionized by glow discharge, and the ions are accelerated to impact against a cathode to which negative self bias is applied. Further, a CN film may be formed with the use of a $C_2H_4$ gas and a $N_2$ gas as a reaction gas. A DLC film has a high blocking effect against oxygen; therefore, oxidization of the light-emitting layer 188 can be suppressed. Accordingly, a problem such as oxidation of the light-emitting layer 188 during a sealing step which is subsequently performed can be prevented.

The substrate 150 over which the light-emitting element 190 is formed and a sealing substrate 195 are firmly attached to each other with a sealing material 192, so that the light-emitting element is filled and sealed (see FIGS. 15A and 15B). As the sealing material 192, typically, a visible light curable resin, an ultraviolet curable resin, or a thermosetting resin is preferably used. For example, a bisphenol-A liquid resin, a bisphenol-A solid resin, a bromine-containing epoxy resin, a bisphenol-F resin, a bisphenol-AD resin, a phenol resin, a cresol resin, a novolac resin, a cycloaliphatic epoxy resin, an Epi-Bis epoxy resin, a glycidyl ester resin, a glycidyl amine-based resin, a heterocyclic epoxy resin, a modified epoxy resin, or the like can be used. It is to be noted that a region surrounded by the sealing material may be filled with a filler 193, and sealing may be performed in a nitrogen atmosphere to fill the space between the substrate with nitrogen or the like. Since a bottom emission type is employed in this embodiment mode, it is not necessary for the filler 193 to have a light-transmitting property. However, in the case where light is extracted through the filler 193, it is necessary for the filler to have a light-transmitting property. Typically, a visible light curable epoxy resin, an ultraviolet curable epoxy resin, or a thermosetting epoxy resin may be used. Through the aforementioned steps, a display device having a display function using the light-emitting element of this embodiment mode is completed. Further, the filler may be dripped in a liquid state to fill the display device. In the case of using a hygroscopic substance such as a drying agent as the filler, a further moisture absorption effect can be obtained. Therefore, deterioration of the element can be prevented.

A drying agent is provided in an EL display panel to prevent deterioration due to moisture in the element. In this embodiment mode, the drying agent is provided in a concave portion that is formed on the sealing substrate so as to surround the pixel region and thus, a thin design may be employed. Further, when the drying agent is also formed in a region corresponding to a gate wiring layer so that a moisture absorbing area is increased, the EL display can have high moisture absorption. In addition, when the drying agent is formed over a gate wiring layer which is not self light-emitting, light extraction efficiency is not decreased.

The light-emitting element is sealed by a glass substrate in this embodiment mode. It is to be noted that sealing treatment is treatment for protecting a light-emitting element from moisture, and any of a method for mechanically sealing the light-emitting element by a cover material, a method for sealing the light-emitting element with a thermosetting resin or an ultraviolet light curable resin, and a method for sealing the light-emitting element by a thin film having a high barrier property such as a metal oxide film or a metal nitride film is used. As the cover material, glass, ceramics, plastics, or metal can be used, and it is necessary to use a material having a light-transmitting property in the case where light is emitted to the cover material side. The cover material and the substrate over which the light-emitting element is formed are attached to each other with a sealing material such as a thermosetting resin or an ultraviolet curable resin, and the resin is cured by heat treatment or ultraviolet light irradiation treatment to form a sealed space. It is also effective to provide a moisture absorbing material typified by barium oxide in this sealed space. This moisture absorbing material may be provided on and be in contact with the sealing material, or may be provided over or in the periphery of the partition wall so as not to shield light from the light-emitting element. Further, the space between the cover material and the substrate over which the light-emitting element is formed can be filled with a thermosetting resin or an ultraviolet light curable resin. In this case, it is effective to add a moisture absorbing material typified by barium oxide in the thermosetting resin or the ultraviolet light curable resin.

In addition, it is not necessary for the source electrode layer or drain electrode layer and the first electrode layer to be in direct contact with each other to be electrically connected. They may be connected to each other through a wiring layer.

In this embodiment mode, the terminal electrode layer 178 is connected to an FPC 194 with an anisotropic conductive layer 196 interposed therebetween in the external terminal connection region 202, and is electrically connected to an external portion. In addition, as shown in FIG. 15A, which is a top plan view of the display device, the display device manufactured in this embodiment mode includes a peripheral driver circuit region 207 and a peripheral driver circuit region 208 each including a scan line driver circuit in addition to the peripheral driver circuit region 204 and the peripheral driver circuit region 209 each including a signal line driver circuit.

A circuit such as that described above is formed in this embodiment mode; however, the present invention is not limited thereto. An IC chip may be mounted by the aforementioned COG method or TAB method as the peripheral driver circuit. Further, one or a plurality of gate line driver circuits and source line driver circuits may be provided.

In the display device of the present invention, there is no particular limitation on a driving method for image display, and for example, a dot sequential driving method, a line sequential driving method, a frame sequential driving method, or the like may be used. Typically, a line sequential driving method may be used, and a time division gray scale driving method and an area gray scale driving method may be used as appropriate. Further, a video signal which is inputted to the source line of the display device may be an analog signal or a digital signal. The driver circuit and the like may be appropriately designed in accordance with the video signal.

This embodiment mode can be combined with any of Embodiment Modes 1 to 3 as appropriate.

By the present invention, a component such as a wiring included in a display device can be formed into a desired shape. In addition, since the number of complicated photolithography steps can be reduced and a display device can be manufactured through a simplified process, loss of materials and the cost can be reduced. Therefore, high-performance and highly reliable display devices can be manufactured with a high yield.

Embodiment Mode 6

A thin film transistor can be formed by the present invention, and a display device can be formed using the thin film transistor. When a light-emitting element is used and an n-channel transistor is used as a transistor for driving the light-emitting element, light is emitted from the light-emitting element in the following manner: bottom emission, top emission, or dual emission. Here, a stacked-layer structure of the light-emitting element in each case is described with reference to FIGS. 17A to 17C.

In this embodiment mode, channel protective thin film transistors 461, 471, and 481 to which the present invention is applied are used. The thin film transistor 481 is provided over a light-transmitting substrate 480 and includes a gate electrode layer 493, a gate insulating film 497, a semiconductor layer 494, an n-type semiconductor layer 495a, an n-type semiconductor layer 495b, a source electrode layer or drain electrode layer 487a, a source electrode layer or drain electrode layer 487b, a channel protective layer 496, an insulating layer 499, and a wiring layer 498. The gate electrode layer, the semiconductor layer, the source electrode layer, the drain electrode layer, and the like may be selectively formed in a similar manner to that described in Embodiment Mode 3, in which a light absorbing film using a conductive material or a semiconductor material is formed over the transfer substrate and then laser light is irradiated, so that a light absorbing film using a conductive material or a semiconductor material is processed into a desired shape and selectively formed over the substrate to which a light absorbing layer is transferred. The process can be simplified and loss of materials can be prevented. Accordingly, cost reduction can be achieved.

Figure 17A:
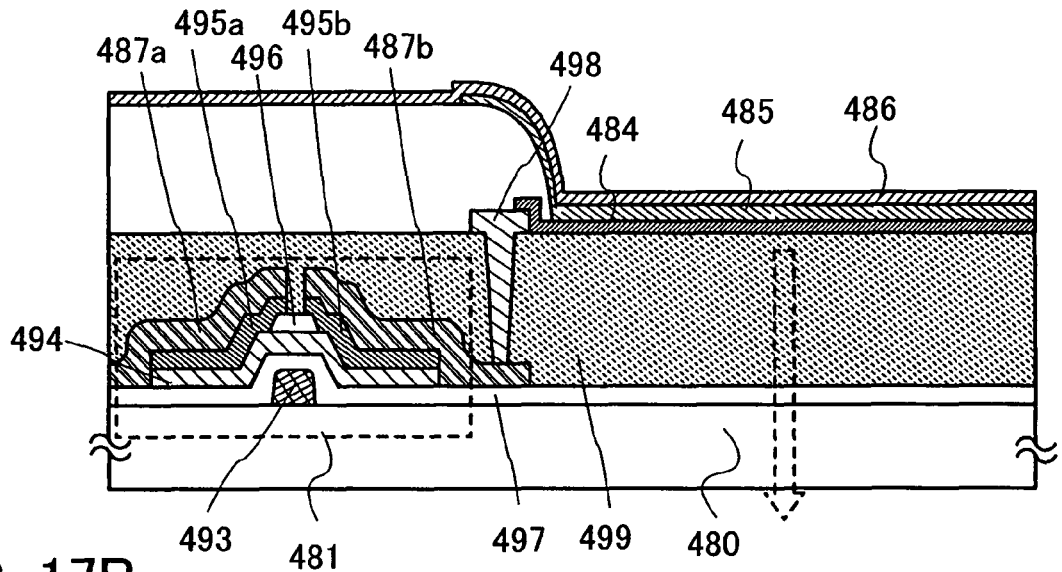
FIGS. 17A to 17C are views showing a display device of the present invention.
Figure 17B:
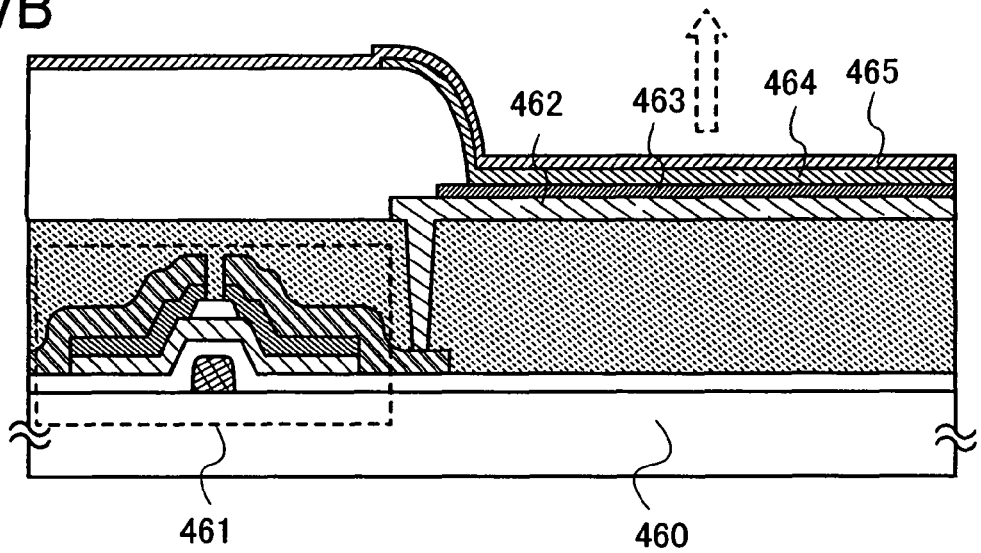
Figure 17C:
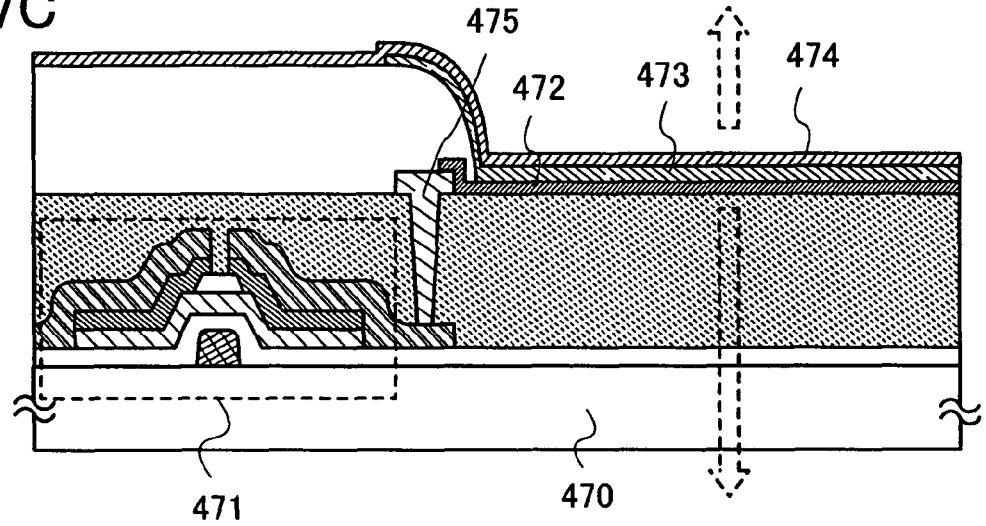

In FIGS. 17A to 17C described in this embodiment mode, a contact hole (opening), which reaches the source electrode layer or drain electrode layer 487b, is formed in the insulating layer 499.

In this embodiment mode, an opening is formed by laser light as described in Embodiment Mode 1. The source electrode layer or drain electrode layer 487b is selectively irradiated with laser light from the insulating layer 499 side, and the insulating layer 499 over the irradiated region of the source electrode layer or drain electrode layer 487b can be removed to form an opening.

The wiring layer 498 is formed in the opening where the source electrode layer or drain electrode layer 487b is exposed, and the source electrode layer or drain electrode layer 487b and the wiring layer 498 can be electrically connected to each other. Since the wiring layer 498 is formed in contact with a first electrode layer 484 of a light-emitting element, the thin film transistor 481 and the light-emitting element are electrically connected with the wiring layer 498 interposed therebetween.

In this embodiment mode, an amorphous semiconductor layer is used as the semiconductor layer. However, the present invention is not limited to this embodiment mode, and a crystalline semiconductor layer can be used as the semiconductor layer, and an n-type semiconductor layer can be used as the semiconductor layer having one conductivity type. Instead of formation of the n-type semiconductor layer, conductivity may be imparted to the semiconductor layer by plasma treatment with a $PH_3$ gas. When a crystalline semiconductor layer like polysilicon is used, the semiconductor layer having one conductivity type is not formed, and an impurity region having one conductivity type may be formed by the introduction (addition) of an impurity to the crystalline semiconductor layer. Alternatively, an organic semiconductor such as pentacene may be used. When the organic semiconductor is selectively formed by a droplet discharging method or the like, the process can be simplified.

The case where a crystalline semiconductor layer is used as the semiconductor layer is described. First, an amorphous semiconductor layer is crystallized to form a crystalline semiconductor layer. In a crystallization step, an element which promotes crystallization (also referred to as a catalytic element or a metal element) is added to the amorphous semiconductor layer, and crystallization is performed by heat treatment (at 550 to 750° C. for 3 minutes to 24 hours). As a metal element which promotes crystallization of silicon, one or a plurality of kinds of metals selected from iron (Fe), nickel (Ni), cobalt (Co), ruthenium (Ru), rhodium (Rh), palladium (Pd), osmium (Os), iridium (Ir), platinum (Pt), copper (Cu), and gold (Au) can be used.

In order to remove the element which promotes crystallization from the crystalline semiconductor layer or reduce the amount of the element which promotes crystallization in the crystalline semiconductor layer, a semiconductor layer containing an impurity element is formed to be in contact with the crystalline semiconductor layer and is made to function as a gettering sink. As the impurity element, an impurity element imparting n-type conductivity, an impurity element imparting p-type conductivity, a rare gas element, or the like can be used. For example, one or a plurality of kinds of elements selected from phosphorus (P), nitrogen (N), arsenic (As), antimony (Sb), bismuth (Bi), boron (B), helium (He), neon (Ne), argon (Ar), krypton (Kr), and xenon (Xe) can be used. An n-type semiconductor layer is formed to be in contact with the crystalline semiconductor layer containing the element which promotes crystallization, and heat treatment (at 550 to 750° C. for 3 minutes to 24 hours) is performed. The element which promotes crystallization contained in the crystalline semiconductor layer moves into the n-type semiconductor layer, and the element which promotes crystallization contained in the crystalline semiconductor layer is removed or reduced, and thereby the semiconductor layer is formed. Meanwhile, this n-type semiconductor layer becomes an n-type semiconductor layer containing a metal element which promotes crystallization, which is later formed into a desired shape to be an n-type semiconductor layer. Thus, the n-type semiconductor layer functions as a gettering sink of the semiconductor layer, and also as a source region or a drain region.

The crystallization step and the gettering step of the semiconductor layer may be performed by a plurality of heat treatments. Alternatively, the crystallization step and the gettering step may be performed by one heat treatment. In this case, heat treatment may be performed after formation of an amorphous semiconductor layer, addition of an element which promotes crystallization, and formation of a semiconductor layer which functions as a gettering sink.

In this embodiment mode, the gate insulating layer is formed by stacking of a plurality of layers, and a silicon nitride oxide film and a silicon oxynitride film are stacked on the gate electrode layer 493 side, as the gate insulating film 497 having a two-layer structure. The insulating layers which are stacked are preferably formed successively at the same temperature in the same chamber while reaction gases are changed while maintaining a vacuum state. When the films are successively formed while the vacuum state is maintained, an interface between the stacked films can be prevented from being contaminated.

The channel protective layer 496 may be formed by a droplet discharging method using polyimide, polyvinyl alcohol, or the like. As a result, a light exposure step can be omitted. The channel protective layer can be formed using one or a plurality of kinds of an inorganic material (such as silicon oxide, silicon nitride, silicon oxynitride, or silicon nitride oxide), a photosensitive or non-photosensitive organic material (organic resin material) (such as polyimide, acrylic, polyamide, polyimide amide, resist, or benzocyclobutene), a low-dielectric constant material, and the like, or a stacked layer structure thereof. Alternatively, a siloxane material may be used. As a manufacturing method, a vapor deposition method such as a plasma CVD method or a thermal CVD method, or a sputtering method can be used. Alternatively, a droplet discharging method, a dispenser method, or a printing method (a method for forming a pattern, such as screen printing or offset printing) may be used. An SOG film obtained by a coating method, or the like may be used.

First, the case where light is emitted to the substrate 480 side, that is, the case of bottom emission is described with reference to FIG. 17A. In this case, the wiring layer 498 is in contact with the source electrode layer or drain electrode layer 487b. The wiring layer 498, the first electrode layer 484, an electroluminescent layer 485, and a second electrode layer 486 are stacked sequentially so as to be electrically connected to the thin film transistor 481. It is necessary for the substrate 480 through which light is transmitted to have a light-transmitting property at least with respect to visible light.

The case where light is emitted to the side opposite to a substrate 460, that is, the case of top emission is described with reference to FIG. 17B. The thin film transistor 461 can be formed similarly to the thin film transistor 481 described above. A wiring layer 462 electrically connected to the thin film transistor 461 is in contact with a first electrode layer 463 to be electrically connected. The first electrode layer 463, an electroluminescent layer 464, and a second electrode layer 465 are sequentially stacked. The wiring layer 462 is a metal layer having reflectivity and reflects light, which is emitted from the light-emitting element, upward as shown by an arrow. The wiring layer 462 and the first electrode layer 463 have a stacked-layer structure; therefore, even when the first electrode layer 463 is formed of a light-transmitting material and transmits light, the light is reflected on the wiring layer 462 and is then emitted in the direction opposite to the substrate 460. It is needless to say that the first electrode layer 463 may also formed using a metal film having reflectivity. Since light from the light-emitting element is emitted through the second electrode layer 465, the second electrode layer 465 is formed using a material having a light-transmitting property at least with respect to visible light.

The case where light is emitted to the substrate 470 side and to the side opposite to the substrate 470 side, that is, the case of dual emission is described with reference to FIG. 17C. The thin film transistor 471 is also a channel protective thin film transistor. A source electrode layer or drain electrode layer electrically connected to a semiconductor layer of the thin film transistor 471 is electrically connected to a wiring layer 475 and a first electrode layer 472. The first electrode layer 472, an electroluminescent layer 473, and a second electrode layer 474 are sequentially stacked. At this time, if the first electrode layer 472 and the second electrode layer 474 are both formed using a material having a light-transmitting property at least with respect to visible light or are both formed to have thicknesses such that light can be transmitted, dual emission is realized. In this case, it is also necessary for the insulating layer and the substrate 470 through which light is transmitted to have a light-transmitting property at least with respect to visible light.

This embodiment mode can be freely combined with any of Embodiment Modes 1 to 5.

By the present invention, a component such as a wiring included in a display device can be formed into a desired shape. In addition, since the number of complicated photolithography steps can be reduced and a display device can be manufactured through a simplified process, loss of materials and the cost can be reduced. Therefore, high-performance and highly reliable display devices can be manufactured with a high yield.

Embodiment Mode 7

In this embodiment mode, an example of a display device manufactured through a highly reliable and more simplified process at low cost is described. Specifically, a light-emitting display device using a light-emitting element for a display element is described.

In this embodiment mode, a structure of the light-emitting element which can be used as the display element of the display device of the present invention is described with reference to FIGS. 22A to 22D.

FIGS. 22A to 22D each show an element structure of a light-emitting element where an electroluminescent layer 860 formed by mixing of an organic compound and an inorganic compound is interposed between a first electrode layer 870 and a second electrode layer 850. As shown in the drawings, the electroluminescent layer 860 includes a first layer 804, a second layer 803, and a third layer 802.

First, the first layer 804 is a layer which has a function of transporting holes to the second layer 803, and includes at least a first organic compound and a first inorganic compound showing an electron-accepting property with respect to the first organic compound. It is important that the first organic compound and the first inorganic compound are not simply mixed but the first inorganic compound has an electron-accepting property with respect to the first organic compound. With this structure, many hole-carriers are generated in the first organic compound having originally almost no inherent carriers, and a hole-injecting property and hole-transporting property which are extremely excellent are obtained.

Therefore, as for the first layer 804, not only an advantageous effect that is considered to be obtained by mixing an organic compound and an inorganic compound (such as improvement in heat resistance) but also excellent conductivity (in particular, a hole-injecting property and a hole-transporting property in the first layer 804) can be obtained. This excellent conductivity is an advantageous effect which cannot be obtained in a conventional hole-transporting layer in which an organic compound and an inorganic compound that do not electronically interact with each other are simply mixed. This advantageous effect can make a driving voltage lower than the conventional case. In addition, since the first layer 804 can be made thick without causing a rise in driving voltage, short circuit of the element due to dusts or the like can be suppressed.

It is preferable to use a hole-transporting organic compound as the first organic compound because hole carriers are generated in the first organic compound as described above. The hole-transporting organic compound includes, for example, phthalocyanine (abbreviation: $H_2Pc$), copper phthalocyanine (abbreviation: CuPc), vanadyl phthalocyanine (abbreviation: VOPc), 4,4',4''-tris(N,N-diphenylamino) triphenylamine (abbreviation: TDATA), 4,4',4''-tris[N-(3-methylphenyl)-N-phenylamino]triphenylamine (abbreviation: MTDATA), 1,3,5-tris[N,N-di(m-tolyl)amino] benzene (abbreviation: m-MTDAB), N,N'-diphenyl-N,N'-bis (3-methylphenyl)-1,1'-biphenyl-4,4'-diamine (abbreviation: TPD), 4,4'-bis[N-(1-naphthyl)-N-phenylamino]biphenyl (abbreviation: NPB), 4,4'-bis{N-[4-di(m-tolyl)amino]phenyl-N-phenylamino}biphenyl (abbreviation: DNTPD), 4,4', 4''-tris(N-carbazolyl)triphenylamine (abbreviation: TCTA), and the like. However, the present invention is not limited thereto. Among the compounds described above, aromatic amine compounds typified by TDATA, MTDATA, m-MTDAB, TPD, NPB, DNTPD, and TCTA can easily generate hole carriers and are suitable compound groups for the first organic compound.

On the other hand, the first inorganic compound may be any material as long as the material can easily accept electrons from the first organic compound, and various kinds of metal oxides and metal nitrides may be used. Oxides of any of transition metals that belong to Groups 4 to 12 of the periodic table is preferable because an electron-accepting property is easily provided. Specifically, titanium oxide, zirconium oxide, vanadium oxide, molybdenum oxide, tungsten oxide, rhenium oxide, ruthenium oxide, zinc oxide, and the like can be given. Among the metal oxides described above, oxides of any of transition metals that belong to Groups 4 to 8 of the periodic table mostly has a high electron-accepting property and is a preferable group. In particular, vanadium oxide, molybdenum oxide, tungsten oxide, and rhenium oxide are preferable because they can be treated by vacuum evaporation and can be easily used.

It is to be noted that the first layer 804 may be formed by stacking of a plurality of layers each containing a combination of the organic compound and the inorganic compound described above, or may further contain another organic compound or inorganic compound.

Next, the third layer 802 is described. The third layer 802 is a layer having a function of transporting electrons to the second layer 803 and includes at least a third organic compound and a third inorganic compound showing an electron-donating property to the third organic compound. It is important that the third organic compound and the third inorganic compound are not simply mixed but the third inorganic compound has an electron-donating property with respect to the third organic compound. With this structure, many electron-carriers are generated in the third organic compound which has originally almost no inherent carriers, and an electron-injecting and an electron-transporting property which are highly excellent can be obtained.

Therefore, as for the third layer 802, not only an advantageous effect that is considered to be obtained by mixing an organic compound and an inorganic compound (such as improvement in heat resistance) but also excellent conductivity (in particular, a hole-injecting property and a hole-transporting property in the third layer 802) can be obtained. This excellent conductivity is an advantageous effect which cannot be obtained in a conventional hole-transporting layer in which an organic compound and an inorganic compound that do not electronically interact with each other are simply mixed. This advantageous effect can make a driving voltage lower than the conventional case. In addition, since the third layer 802 can be made thick without causing a rise in driving voltage, short circuit of the element due to dusts or the like can be suppressed.

It is preferable to use an electron-transporting organic compound as the third organic compound because electron carriers are generated in the third organic compound as described above. The electron-transporting organic compound includes, for example, tris(8-quinolinolato)aluminum (abbreviation: $Alq_3$), tris(4-methyl-8-quinolinolato)aluminum (abbreviation: $Almq_3$), bis(10-hydroxybenzo[h]-quinolinato)beryllium (abbreviation: $BeBq_2$), bis(2-methyl-8-quinolinolato)(4-phenylphenolato)aluminum (abbreviation: BAlq), bis[2-(2'-hydroxyphenyl)benzoxazolato]zinc (abbreviation: $Zn(BOX)_2$), bis [2-(2'-hydroxyphenyl)benzothiazolato]zinc (abbreviation: $Zn(BTZ)_2$), bathophenanthroline (abbreviation: BPhen), bathocuproin (abbreviation: BCP), 2-(4-biphenylyl)-5-(4-tert-butylphenyl)-1,3,4-oxadiazole (abbreviation: PBD), 1,3-bis[5-(4-tert-butylphenyl)-1,3,4-oxadiazol-2-yl]benzene (abbreviation: OXD-7), 2,2',2''-(1,3, 5-benzenetriyl)-tris(1-phenyl-1H-benzimidazole) (abbreviation: TPBI), 3-(4-biphenylyl)-4-phenyl-5-(4-tert-butylphenyl)-1,2,4-triazole (abbreviation: TAZ), 3-(4-biphenylyl)-4-(4-ethylphenyl)-5-(4-tert-butylphenyl)-1,2,4-triazole (abbreviation: p-EtTAZ), and the like. However, the present invention is not limited thereto. Among the compounds mentioned above, chelate metal complexes each having a chelate ligand including an aromatic ring typified by $Alq_3$, $Almq_3$, $BeBq_2$, BAlq, $Zn(BOX)_2$, and $Zn(BTZ)_2$, organic compounds having a phenanthroline skeleton typified by BPhen and BCP, and organic compounds having an oxadiazole skeleton typified by PBD and OXD-7 can easily generate electron carriers and are suitable compound groups for the third organic compound.

On the other hand, the third inorganic compound may be any material as long as the material can easily donate electrons to the third organic compound, and various kinds of metal oxide and metal nitride can be used. Alkali metal oxide, alkaline-earth metal oxide, rare-earth metal oxide, alkali metal nitride, alkaline-earth metal nitride, and rare-earth metal nitride are preferable because an electron-donating property is easily provided. Specifically, for example, lithium oxide, strontium oxide, barium oxide, erbium oxide, lithium nitride, magnesium nitride, calcium nitride, yttrium nitride, lanthanum nitride, and the like can be given. In particular, lithium oxide, barium oxide, lithium nitride, magnesium nitride, and calcium nitride are preferable because they can be treated by vacuum evaporation and can be easily used.

It is to be noted that the third layer 802 may be formed by stacking of a plurality of layers each containing a combination of the organic compound and the inorganic compound described above, or may further contain another organic compound or inorganic compound.

Then, the second layer 803 is described. The second layer 803 is a layer having a function of emitting light and includes a second organic compound having a light-emitting property. The second layer 803 may include a second inorganic compound. The second layer 803 may be formed using various light-emitting organic compounds and inorganic compounds. However, since it is considered that a current does not easily flows through the second layer 803 as compared to through the first layer 804 or the third layer 802, the thickness of the second layer 803 is preferably approximately 10 to 100 nm.

There are no particular limitations on the second organic compound as long as it is a light-emitting organic compound. The second organic compound includes, for example, 9,10-di(2-naphthyl)anthracene (abbreviation: DNA), 9,10-di(2-naphthyl)-2-tert-butylanthracene (abbreviation: t-BuDNA), 4,4'-bis(2,2-diphenylvinyl)biphenyl (abbreviation: DPVBi), coumarin 30, coumarin 6, coumarin 545, coumarin 545T, perylene, rubrene, periflanthene, 2,5,8,11-tetra(tert-butyl) perylene (abbreviation: TBP), 9,10-diphenylanthracene (abbreviation: DPA), 5,12-diphenyltetracene, 4-(dicyanomethylene)-2-methyl-[p-(dimethylamino)styryl]-4H-pyran (abbreviation: DCM1), 4-(dicyanomethylene)-2-methyl-6-[2-(julolidin-9-yl)ethenyl]-4H-pyran (abbreviation: DCM2), 4-(dicyanomethylene)-2,6-bis[p-(dimethylamino)styryl]-4H-pyran (abbreviation: BisDCM), and the like. Alternatively, a compound capable of emitting phosphorescence such as bis[2-(4',6'-difluorophenyl)pyridinato-N,$C^{2'}$]iridium (picolinate) (abbreviation: FIrpic), bis{2-[3',5'-bis(trifluoromethyl)phenyl]pyridinato-N,$C^{2'}$}iridium(picolinate) (abbreviation: Ir($CF_3$ ppy)$_2$(pic)), tris(2-phenylpyridinato-N, $C^{2'}$)iridium (abbreviation: Ir(ppy)$_3$), bis(2-phenylpyridinato-N,$C^{2'}$)iridium(acetylacetonate) (abbreviation: Ir(ppy)$_2$(acac)), bis[2-(2'-thienyl)pyridinato-N,$C^{3'}$]iridium (acetylacetonate) (abbreviation: Ir(thp)$_2$(acac)), bis(2-phenylquinolinato-N,$C^{2'}$)iridium(acetylacetonate) (abbreviation: Ir(pq)$_2$(acac)), or bis[2-(2'-benzothienyl)pyridinato-N,$C^{3'}$]iridium(acetylacetonate) (abbreviation: Ir(btp)$_2$(acac)) may be used.

Further, a triplet excitation light-emitting material containing a metal complex or the like may be used for the second layer 803 in addition to a singlet excitation light-emitting material. For example, among pixels emitting light of red, green, and blue, the pixel emitting light of red whose luminance is reduced by half in a relatively short time is formed using a triplet excitation light-emitting material and the other pixels are formed using a singlet excitation light-emitting material. A triplet excitation light-emitting material has a feature that light-emitting efficiency is favorable so that less power is consumed to obtain the same luminance. In other words, when a triplet excitation light-emitting material is used for the pixel emitting light of red, only a small amount of current is necessary to be applied to a light-emitting element; thus, reliability can be improved. The pixel emitting light of red and the pixel emitting light of green may be formed using a triplet excitation light-emitting material and the pixel emitting light of blue may be formed using a singlet excitation light-emitting material in order to achieve low power consumption. Low power consumption can be further achieved by formation of a light-emitting element emitting light of green that has high visibility for a human eye with the use of a triplet excitation light-emitting material.

The second layer 803 may be added with not only the second organic compound described above, which emits light, but also another organic compound. An organic compound that can be added includes, for example, TDATA, MTDATA, m-MTDAB, TPD, NPB, DNTPD, TCTA, Alq$_3$, Almq$_3$, BeBq$_2$, BAlq, Zn(BOX)$_2$, Zn(BTZ)$_2$, BPhen, BCP, PBD, OXD-7, TPBI, TAZ, p-EtTAZ, DNA, t-BuDNA, and DPVBi, which are mentioned above, and 4,4'-bis(N-carbazolyl)biphenyl (abbreviation: CBP), 1,3,5-tris[4-(N-carbazolyl)phenyl]benzene (abbreviation: TCPB), and the like. However, the present invention is not limited thereto. It is preferable that the organic compound which is added in addition to the second organic compound have larger excitation energy than the second organic compound and be added by larger amount than the second organic compound, in order to make the second organic compound emit light efficiently (which makes it possible to prevent concentration quenching of the second organic compound). Alternatively, as another function, the added organic compound may emit light along with the second organic compound (which makes it possible to emit white light or the like).

The second layer 803 may have a structure where color display is performed by formation of a light-emitting layer having a different emission wavelength range for each pixel. Typically, a light-emitting layer corresponding to each of R (red), G (green), and B (blue) is formed. Also in this case, color purity can be improved and a pixel portion can be prevented from having a mirror surface (reflecting) by provision of a filter which transmits light of the emission wavelength range on the light-emission side of the pixel. By provision of the filter, a circularly polarizing plate or the like that has been considered to be necessary can be omitted, and further, the loss of light emitted from the light-emitting layer can be eliminated. Further, change in color tone, which occurs when a pixel portion (display screen) is obliquely seen, can be reduced.

Either a low-molecular organic light-emitting material or a high-molecular organic light-emitting material may be used for a material of the second layer 803. A high-molecular organic light-emitting material has higher physical strength and higher durability of the element than a low-molecular material. In addition, since a high-molecular organic light-emitting material can be formed by coating, the element can be relatively easily formed.

The emission color is determined depending on a material forming the light-emitting layer; therefore, a light-emitting element which emits desired light can be formed by selecting an appropriate material for the light-emitting layer. As a high-molecular electroluminescent material which can be used for forming a light-emitting layer, a polyparaphenylene-vinylene-based material, a polyparaphenylene-based material, a polythiophene-based material, a polyfluorene-based material, and the like can be given.

As the polyparaphenylene-vinylene-based material, a derivative of poly(paraphenylenevinylene)[PPV] such as poly(2,5-dialkoxy-1,4-phenylenevinylene) [RO-PPV], poly (2-(2'-ethyl-hexoxy)-5-methoxy-1,4-phenylenevinylene) [MEH-PPV], or poly(2-(dialkoxyphenyl)-1,4-phenylenevinylene)[ROPh-PPV] can be given. As the polyparaphenylene-based material, a derivative of polyparaphenylene[PPP] such as poly(2,5-dialkoxy-1,4-phenylene) [RO-PPP] or poly(2,5-dihexoxy-1,4-phenylene) can be given. As the polythiophene-based material, a derivative of polythiophene[PT] such as poly(3-alkylthiophene)[PAT], poly(3-hexylthiophen)[PHT], poly(3-cyclohexylthiophen) [PCHT], poly(3-cyclohexyl-4-methylthiophene)[PCHMT], poly(3,4-dicyclohexylthiophene)[PDCHT], poly[3-(4-octylphenyl)-thiophene][POPT], or poly[3-(4-octylphenyl)-2, 2bithiophene][PTOPT] can be given. As the polyfluorene-based material, a derivative of polyfluorene[PF] such as poly (9,9-dialkylfluorene)[PDAF] or poly(9,9-dioctylfluorene) [PDOF] can be given.

The second inorganic compound may be any inorganic compound as long as light emission of the second organic compound is not easily quenched by the inorganic compound, and various kinds of metal oxide and metal nitride may be used. In particular, a metal oxide having a metal that belongs to Group 13 or 14 of the periodic table is preferable because light emission of the second organic compound is not easily quenched, and specifically, aluminum oxide, gallium oxide, silicon oxide, and germanium oxide are preferable. However, the second inorganic compound is not limited thereto.

It is to be noted that the second layer 803 may be formed by stacking of a plurality of layers each containing a combination of the organic compound and the inorganic compound, which are described above, or may further include another organic compound or inorganic compound. A layer structure of the light-emitting layer can be changed, and an electrode layer for injecting electrons may be provided or a light-emitting material may be dispersed, instead of provision of no specific electron-injecting region or light-emitting region. Such a change can be permitted unless it departs from the spirit of the present invention.

A light-emitting element formed using the above materials emits light by being forwardly biased. A pixel of a display device which is formed using a light-emitting element can be driven by a simple matrix mode or an active matrix mode. In any case, each pixel emits light by application of forward bias thereto at a specific timing; however, the pixel is in a non-emitting state for a certain period. Reliability of a light-emitting element can be improved by application of reverse bias in the non-emitting time. In a light-emitting element, there is a deterioration mode in which emission intensity is decreased under a constant driving condition or a deterioration mode in which a non-light-emitting region is increased in the pixel and luminance is apparently decreased. However, progression of deterioration can be slowed down by performing of alternating driving where bias is applied forwardly and reversely; thus, reliability of a light-emitting display device can be improved. In addition, either digital driving or analog driving can be applied.

A color filter (colored layer) may be formed over a sealing substrate. The color filter (colored layer) can be formed by an evaporation method or a droplet discharging method. High-definition display can be performed with the use of the color filter (colored layer). This is because a broad peak can be modified to be sharp in an emission spectrum of each of R, G, and B by the color filter (colored layer).

A material emitting light of a single color is formed and it is combined with a color filter or a color conversion layer, so that full color display can be performed. The color filter (colored layer) or the color conversion layer may be formed over, for example, the sealing substrate and attached to an element substrate.

It is needless to say that display of a single color emission may be performed. For example, an area color type display device may be formed using single color emission. The area color type display device is suitable for a passive matrix display portion and can mainly display characters and symbols.

Figure 22A:
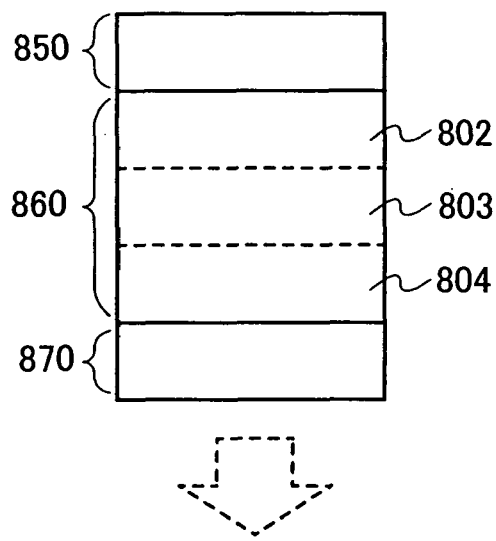
FIGS. 22A to 22D are views each showing a structure of a light-emitting element which can be applied to the present invention.
Figure 22B:
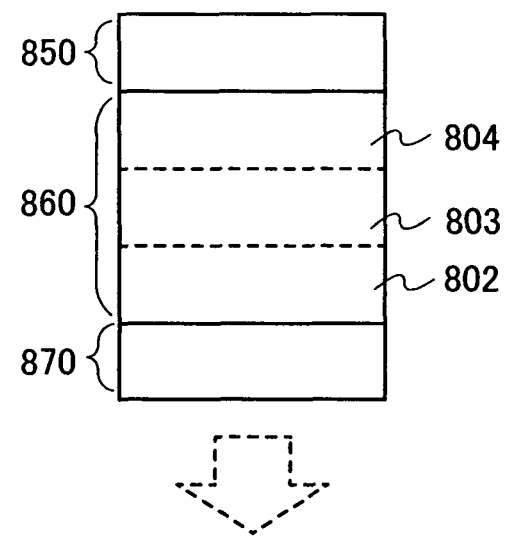

Materials for the first electrode layer 870 and the second electrode layer 850 are necessary to be selected considering the work function. The first electrode layer 870 and the second electrode layer 850 can be either an anode or a cathode depending on the pixel structure. In a case where the polarity of a driving thin film transistor is a p-channel type, the first electrode layer 870 preferably serves as an anode and the second electrode layer 850 preferably serves as a cathode as shown in FIG. 22A. In the case where the polarity of the driving thin film transistor is an n-channel type, the first electrode layer 870 preferably serves as a cathode and the second electrode layer 850 preferably serves as an anode as shown in FIG. 22B. Materials that can be used for the first electrode layer 870 and the second electrode layer 850 are described below. It is preferable to use a material having a high work function (specifically, a material having a work function of 4.5 eV or more) for one of the first electrode layer 870 and the second electrode layer 850, which serves as an anode, and a material having a low work function (specifically, a material having a work function of 3.5 eV or less) for the other electrode layer which serves as a cathode. However, since the first layer 804 is superior in a hole-injecting property and a hole-transporting property and the third layer 802 is superior in an electron-injecting property and an electron transporting property, both the first electrode layer 870 and the second electrode layer 850 are scarcely restricted by a work function and various materials can be used.

The light-emitting elements in FIGS. 22A and 22B each have a structure where light is extracted from the first electrode layer 870 and thus, the second electrode layer 850 is not necessary to have a light-transmitting property. The second electrode layer 850 may be formed from a film mainly containing an element selected from Ti, Ni, W, Cr, Pt, Zn, Sn, In, Ta, Al, Cu, Au, Ag, Mg, Ca, Li and Mo, or an alloy material or a compound material containing the above element as its main component, such as titanium nitride, $TiSi_xN_y$, $WSi_x$, tungsten nitride, $WSi_xN_y$, or NbN; or a stacked film thereof with a total thickness of 100 to 800 nm.

The second electrode layer 850 can be formed by an evaporation method, a sputtering method, a CVD method, a printing method, a dispenser method, a droplet discharging method, or the like.

In addition, when the second electrode layer 850 is formed using a light-transmitting conductive material similarly to the material used for the first electrode layer 870, light can be extracted from the second electrode layer 850 as well, and a dual emission structure can be obtained, in which light emitted from the light-emitting element is emitted from both the first electrode layer 870 and the second electrode layer 850.

It is to be noted that the light-emitting element of the present invention can have variations by changing of types of the first electrode layer 870 and the second electrode layer 850.

FIG. 22B shows the case where the electroluminescent layer 860 is formed by stacking of the third layer 802, the second layer 803, and the first layer 804 in this order on the first electrode layer 870 side.

As described above, in the light-emitting element of the present invention, the layer interposed between the first electrode layer 870 and the second electrode layer 850 is formed of the electroluminescent layer 860 including a layer in which an organic compound and an inorganic compound are combined. The light-emitting element is an organic-inorganic composite light-emitting element provided with layers (that is, the first layer 804 and the third layer 802) that provide functions of a high carrier-injecting property and carrier-transporting property by mixing of an organic compound and an inorganic compound. Such functions as high carrier-injecting property and carrier-transporting property cannot be obtained from only either one of the organic compound or the inorganic compound. In addition, the first layer 804 and the third layer 802 are particularly necessary to be layers in which an organic compound and an inorganic compound are combined when provided on the first electrode layer 870 side, and may contain only one of an organic compound and an inorganic compound when provided on the second electrode layer 850 side.

Further, various methods can be used as a method for forming the electroluminescent layer 860, which is a layer in which an organic compound and an inorganic compound are mixed. For example, the methods include a co-evaporation method for vaporizing both an organic compound and an inorganic compound by resistance heating. Alternatively, for co-evaporation, an inorganic compound may be vaporized by an electron beam (EB) while an organic compound is vaporized by resistance heating. Further alternatively, a method for sputtering an inorganic compound while vaporizing an organic compound by resistance heating to deposit the both at the same time. Instead, the electroluminescent layer 860 may be formed by a wet method.

In the same manner, for the first electrode layer 870 and the second electrode layer 850, an evaporation method by resistance heating, an EB evaporation method, a sputtering method, a wet method, or the like can be used. The first electrode layer 870 and the second electrode layer 850 may also be selectively formed in a similar manner to that described in Embodiment Mode 3, in which a conductive light absorbing film is formed over the transfer substrate and laser light is irradiated, so that the first electrode layer 870 and the second electrode layer 850 are processed into desired shapes and selectively formed over the substrate to which a light absorbing layer is transferred.

Figure 22C:
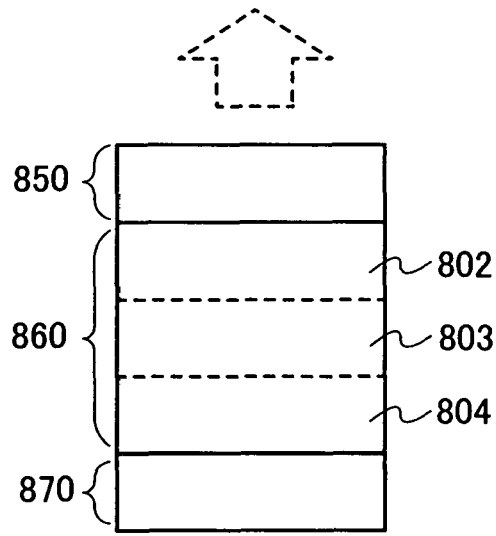
Figure 22D:
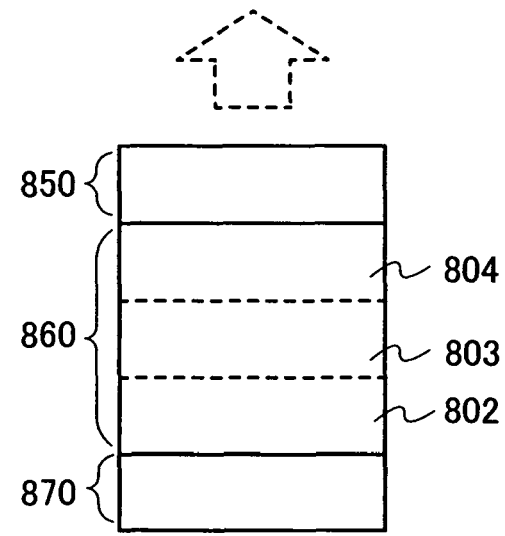

In FIG. 22C, an electrode layer having reflectivity is used for the first electrode layer 870, and an electrode layer having a light-transmitting property is used for the second electrode layer 850 in the structure of FIG. 22A. Light emitted from the light-emitting element is reflected off the first electrode layer 870, transmitted through the second electrode layer 850, and is emitted. Similarly, in FIG. 22D, an electrode layer having reflectivity is used for the first electrode layer 870, and an electrode layer having a light-transmitting property is used for the second electrode layer 850 in the structure of FIG. 22B. Light emitted from the light-emitting element is reflected off the first electrode layer 870, transmitted through the second electrode layer 850, and is emitted.

This embodiment mode can be freely combined with any of the above embodiment modes concerning the display device having a light-emitting element. This embodiment mode can be freely combined with any of Embodiment Modes 1 to 5 as appropriate.

By the present invention, a component such as a wiring included in a display device can be formed into a desired shape. In addition, since the number of complicated photolithography steps can be reduced and a display device can be manufactured through a simplified process, loss of materials and the cost can be reduced. Therefore, high-performance and highly reliable display devices can be manufactured with a high yield.

Embodiment Mode 8

In this embodiment mode, an example of a display device manufactured through a highly reliable and more simplified process at low cost is described. Specifically, a light-emitting display device using a light-emitting element for a display element is described. In this embodiment mode, a structure of the light-emitting element which can be used as the display element of the display device of the present invention is described with reference to FIGS. 23A to 24C.

A light-emitting element utilizing electroluminescence is distinguished depending on whether a light-emitting material is an organic compound or an inorganic compound. In general, the former is called an organic EL element, and the latter is called an inorganic EL element.

The inorganic EL element is categorized into a dispersion inorganic EL element and a thin-film inorganic EL element depending on its element structure. The former and the latter are different in that the former has an electroluminescent layer where particles of a light-emitting material are dispersed in a binder, and the latter has an electroluminescent layer formed of a thin film of a light-emitting material. However, the former and the latter are the same in that electrons accelerated by a high electric field are necessary. It is to be noted that, as a mechanism of light emission that is obtained, there are donor-acceptor recombination light emission that utilizes a donor level and an acceptor level, and localized light emission that utilizes inner-shell electron transition of a metal ion. In many cases, it is general that a dispersion inorganic EL element has donor-acceptor recombination light emission and a thin-film inorganic EL element has localized light emission.

The light-emitting material that can be used in the present invention includes a base material and an impurity element to be a light-emission center. An impurity element that is contained is changed, so that light emission of various colors can be obtained. As a method for forming the light-emitting material, various methods such as a solid phase method and a liquid phase method (coprecipitation method) may be used. Alternatively, a spray pyrolysis method, a double decomposition method, a method by heat decomposition reaction of a precursor, a reversed micelle method, a method in which such a method is combined with high-temperature baking, a liquid phase method such as a lyophilization method, or the like may be used.

A solid phase method is a method in which a base material, and an impurity element or a compound containing an impurity element are weighed, mixed in a mortar, heated in an electric furnace, and baked to be reacted, so that the impurity element is contained in the base material. The baking temperature is preferably 700 to 1500° C. This is because the solid reaction does not progress when the temperature is too low, whereas the base material is decomposed when the temperature is too high. The baking may be performed in a powder state; however, it is preferable to perform the baking in a pellet state. Although the baking is necessary to be performed at relatively high temperature, the solid phase method is easy; therefore, high productivity can be achieved. Thus, the solid phase method is suitable for mass production.

A liquid phase method (coprecipitation method) is a method in which a base material or a compound containing a base material is reacted with an impurity element or a compound containing an impurity element in a solution, dried, and then baked. Particles of a light-emitting material are distributed uniformly, and the reaction can progress even when the grain size is small and the baking temperature is low.

As a base material used for a light-emitting material, sulfide, oxide, or nitride can be used. As sulfide, zinc sulfide (ZnS), cadmium sulfide (CdS), calcium sulfide (CaS), yttrium sulfide ($Y_2S_3$), gallium sulfide ($Ga_2S_3$), strontium sulfide (SrS), barium sulfide (BaS), or the like can be used. As oxide, zinc oxide (ZnO), yttrium oxide ($Y_2O_3$), or the like can be used. As nitride, aluminum nitride (AlN), gallium nitride (GaN), indium nitride (InN), or the like can be used. Alternatively, zinc selenide (ZnSe), zinc telluride (ZnTe), or the like may be used, or a ternary mixed crystal such as calcium-gallium sulfide ($CaGa_2S_4$), strontium-gallium sulfide ($SrGa_2S_4$), or barium-gallium sulfide ($BaGa_2S_4$) may be used.

As a light-emission center of localized light emission, manganese (Mn), copper (Cu), samarium (Sm), terbium (Tb), erbium (Er), thulium (Tm), europium (Eu), cerium (Ce), praseodymium (Pr), or the like can be used. It is to be noted that a halogen element such as fluorine (F) or chlorine (Cl) may be added. A halogen element may have a function of compensating a charge.

On the other hand, as a light-emission center of donor-acceptor recombination light emission, a light-emitting material containing a first impurity element which forms a donor level and a second impurity element which forms an acceptor level can be used. As the first impurity element, fluorine (F), chlorine (Cl), aluminum (Al), or the like can be used. As the second impurity element, copper (Cu), silver (Ag), or the like can be used.

In the case where the light-emitting material of donor-acceptor recombination light emission is synthesized by a solid phase method, a base material, the first impurity element or a compound containing a first impurity element, and the second impurity element or a compound containing the second impurity element are weighed in each, mixed in a mortar, heated in an electric furnace, and baked. As the base material, any of the above described base materials can be used. As the first impurity element or the compound containing the first impurity element, fluorine (F), chlorine (Cl), aluminum sulfide ($Al_2S_3$), or the like can be used. As the second impurity element or the compound containing the second impurity element, copper (Cu), silver (Ag), copper sulfide ($Cu_2S$), silver sulfide ($Ag_2S$), or the like can be used. The baking temperature is preferably 700 to 1500° C. This is because the solid reaction does not progress when the temperature is too low, whereas the base material is decomposed when the temperature is too high. The baking may be performed in a powder state; however, it is preferable to perform the baking in a pellet state.

As the impurity element in the case of utilizing solid reaction, the compounds containing the first impurity element and the second impurity element may be combined. In this case, since the impurity element is easily diffused and solid reaction progresses easily, a uniform light-emitting material can be obtained. Further, since an unnecessary impurity element is not mixed therein, a light-emitting material having high purity can be obtained. As the compounds containing the first impurity element and the second impurity element, copper chloride (CuCl), silver chloride (AgCl), or the like can be used.

It is to be noted that the concentration of these impurity elements may be 0.01 to 10 atomic % with respect to the base material and is preferably 0.05 to 5 atomic %.

In the case of a thin-film inorganic EL element, an electroluminescent layer is a layer containing the above light-emitting material, which can be formed by a vacuum evaporation method such as a resistance heating evaporation method or an electron beam evaporation (EB evaporation) method, a physical vapor deposition (PVD) method such as a sputtering method, a chemical vapor deposition (CVD) method such as a metal organic CVD method or a low-pressure hydride transport CVD method, an atomic layer epitaxy (ALE) method, or the like.

Figure 23A:
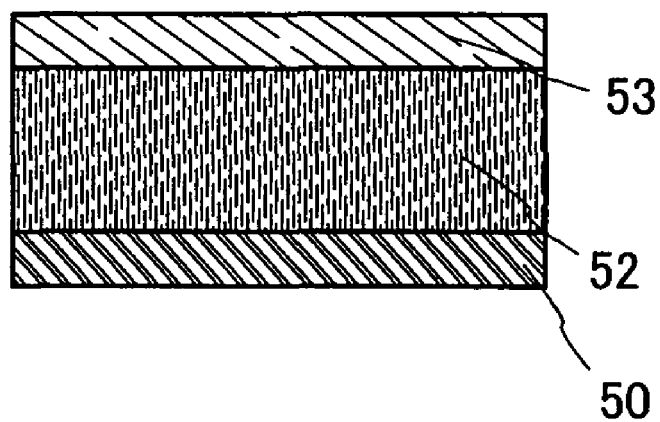
FIGS. 23A to 23C are views each showing a structure of a light-emitting element which can be applied to the present invention.
Figure 23B:
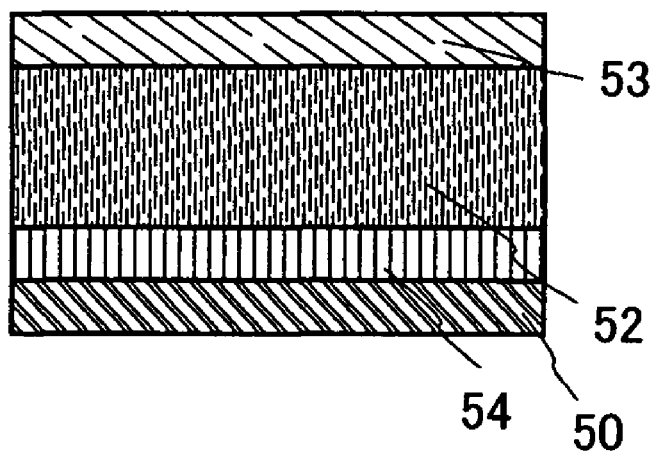
Figure 23C:
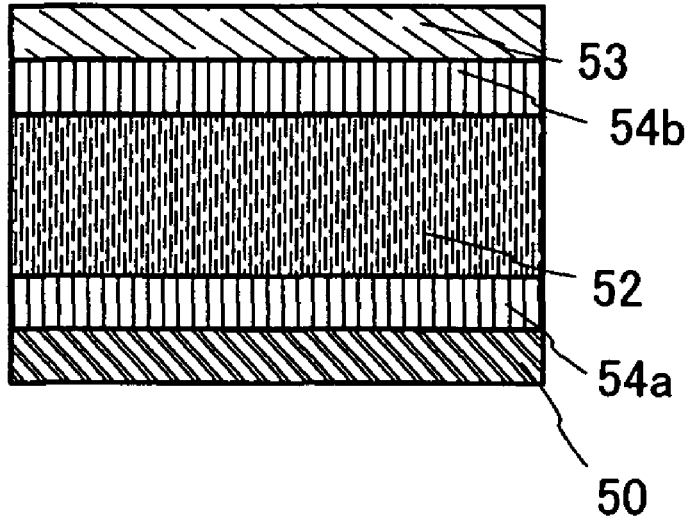

FIGS. 23A to 23C each show an example of a thin-film inorganic EL element that can be used as a light-emitting element. In FIGS. 23A to 23C, each light-emitting element includes a first electrode layer 50, an electroluminescent layer 52, and a second electrode layer 53.

The light-emitting elements shown in FIGS. 23B and 23C each have a structure where an insulating layer is provided between the electrode layer and the electroluminescent layer of the light-emitting element of FIG. 23A. The light-emitting element shown in FIG. 23B has an insulating layer 54 between the first electrode layer 50 and the electroluminescent layer 52. The light-emitting element shown in FIG. 23C includes an insulating layer 54a between the first electrode layer 50 and the electroluminescent layer 52, and an insulating layer 54b between the second electrode layer 53 and the electroluminescent layer 52. Thus, the insulating layer may be provided between the electroluminescent layer and one of the electrode layers that sandwich the electroluminescent layer, or the insulating layer may be provided between the electroluminescent layer and the first electrode layer and between the electroluminescent layer and the second electrode layer. Further, the insulating layer may have a single-layer structure or a stacked-layer structure including a plurality of layers.

In addition, although the insulating layer 54 is provided so as to be in contact with the first electrode layer 50 in FIG. 23B, the insulating layer 54 may be provided so as to be in contact with the second electrode layer 53 by reversing of the positions of the insulating layer and the electroluminescent layer.

In the case of a dispersion inorganic EL element, a film-shaped electroluminescent layer where particles of a light-emitting material are dispersed in a binder is formed. When particles with desired grain sizes cannot be obtained by a manufacturing method of a light-emitting material, a light-emitting material may be processed into a particle state by being crushed in a mortar or the like. The binder is a substance for fixing particles of a light-emitting material in a dispersed state to keep a shape of an electroluminescent layer. The light-emitting material is uniformly dispersed and fixed in the electroluminescent layer by the binder.

In the case of a dispersion inorganic EL element, as a formation method of an electroluminescent layer, a droplet discharging method which can selectively form an electroluminescent layer, a printing method (such as screen printing or offset printing), a coating method such as a spin coating method, a dipping method, a dispenser method, or the like can be used. There are no particular limitations on the thickness of the electroluminescent layer; however, a thickness of 10 to 1000 nm is preferable. In addition, in the electroluminescent layer containing a light-emitting material and a binder, a ratio of the light-emitting material is preferably 50 to 80 wt %.

Figure 24A:
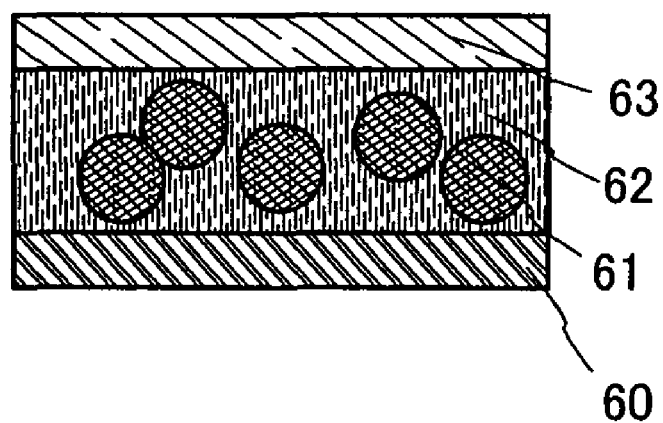
FIGS. 24A to 24C are views each showing a structure of a light-emitting element which can be applied to the present invention.
Figure 24B:
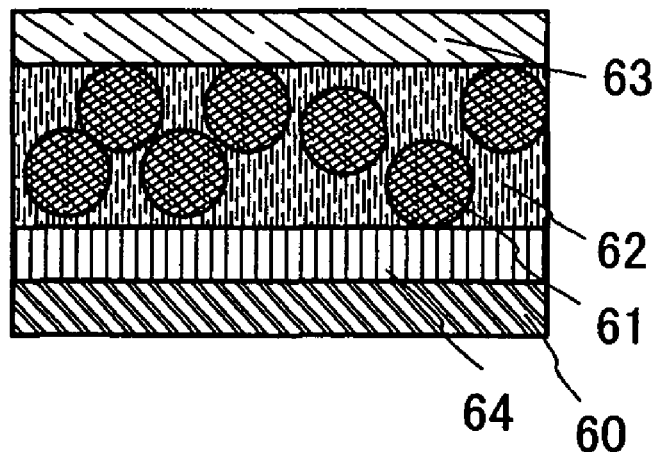
Figure 24C:
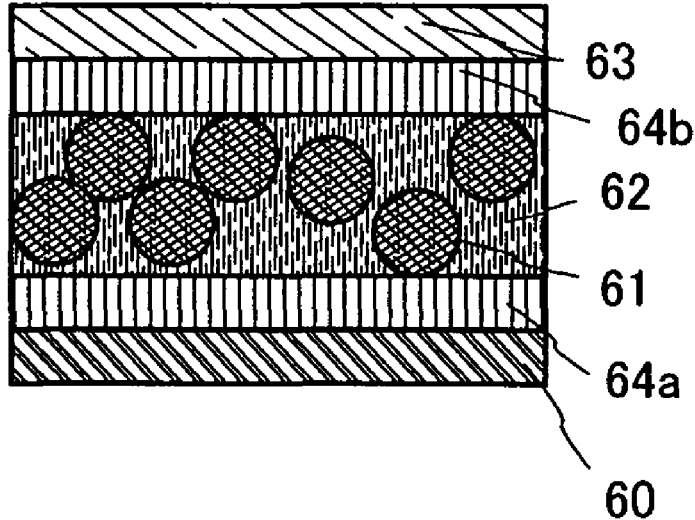

FIGS. 24A to 24C each show an example of a dispersion inorganic EL element that can be used as a light-emitting element. In FIG. 24A, the light-emitting element has a stacked-layer structure of a first electrode layer 60, an electroluminescent layer 62, and a second electrode layer 63, in which a light-emitting material 61 held by a binder is contained in the electroluminescent layer 62.

The first electrode layers 50 and 60 and the second electrode layers 53 and 63 may also be selectively formed in a similar manner to that described in Embodiment Mode 3, in which a conductive light absorbing film is formed over the transfer substrate and then laser light is irradiated, so that the first electrode layers 50 and 60 and the second electrode layers 53 and 63 are processed into a desired shape and selectively formed over the substrate to which a light absorbing layer is transferred.

As the binder that can be used in this embodiment mode, an organic material or an inorganic material can be used, or a mixed material of an organic material and an inorganic material may be used. As the organic material, a polymer having a relatively high dielectric constant like a cyanoethyl cellulose-based resin, or a resin such as polyethylene, polypropylene, a polystyrene-based resin, a silicone resin, an epoxy resin, or vinylidene fluoride can be used. Alternatively, a heat-resistant high molecular such as aromatic polyamide or polybenzimidazole, or a siloxane resin may be used. A siloxane resin corresponds to a resin containing a Si—O—Si bond. Siloxane is composed of a skeleton structure formed by the bond of silicon (Si) and oxygen (O). As a substituent thereof, an organic group containing at least hydrogen (such as an alkyl group or aromatic hydrocarbon) is used. Instead, a fluoro group, or a fluoro group and an organic group containing at least hydrogen may be used as the substituent. Further alternatively, a resin material such as a vinyl resin, for example, polyvinyl alcohol or polyvinyl butyral, a phenol resin, a novolac resin, an acrylic resin, a melamine resin, a urethane resin, or an oxazole resin (polybenzoxazole) may be used. A dielectric constant can be controlled by mixing of these resins with high-dielectric constant microparticles of barium titanate (BaTiO$_3$), strontium titanate (SrTiO$_3$), or the like as appropriate.

As the inorganic material contained in the binder, a material selected from silicon oxide (SiO$_x$), silicon nitride (SiN$_x$), silicon containing oxygen and nitrogen, aluminum nitride (AlN), aluminum containing oxygen and nitrogen, aluminum oxide (Al$_2$O$_3$), titanium oxide (TiO$_2$), BaTiO$_3$, SrTiO$_3$, lead titanate (PbTiO$_3$), potassium niobate (KNbO$_3$), lead niobate (PbNbO$_3$), tantalum oxide (Ta$_2$O$_5$), barium tantalate (BaTa$_2$O$_6$), lithium tantalate (LiTaO$_3$), yttrium oxide (Y$_2$O$_3$), zirconium oxide (ZrO$_2$), and other substances containing an inorganic insulating material can be used. By mixing of the organic material with a high-dielectric constant inorganic material (by addition or the like), a dielectric constant of an electroluminescent layer containing a light-emitting material and a binder can be controlled much better and further increased. When a mixed layer of an inorganic material and an organic material is used for the binder to have a high dielectric constant, a larger electric charge can be induced by the light-emitting material.

In a manufacturing process, the light-emitting material is dispersed in a solution containing a binder. As a solvent of the solution containing a binder that can be used in this embodiment mode, it is preferable to select a solvent that dissolves a binder material and can make a solution with the viscosity appropriate for a method for forming the electroluminescent layer (various wet processes) and for a desired film thickness. An organic solvent or the like can be used, and for example, when a siloxane resin is used as the binder, propylene glycolmonomethyl ether, propylene glycolmonomethyl ether acetate (also referred to as PGMEA), 3-methoxy-3-methyl-1-butanol (also referred to as MMB), or the like can be used.

The light-emitting elements shown in FIGS. 24B and 24C each have a structure where an insulating layer is provided between the electrode layer and the electroluminescent layer of the light-emitting element of FIG. 24A. The light-emitting element shown in FIG. 24B has an insulating layer 64 between the first electrode layer 60 and the electroluminescent layer 62. The light-emitting element shown in FIG. 24C includes an insulating layer 64a between the first electrode layer 60 and the electroluminescent layer 62, and an insulating layer 64b between the second electrode layer 63 and the electroluminescent layer 62. Thus, the insulating layer may be provided between the electroluminescent layer and one of the electrode layers that sandwich the electroluminescent layer, or the insulating layers may be provided between the electroluminescent layer and the first electrode layer and between the electroluminescent layer and the second electrode layer. Further, the insulating layer may have a single-layer structure or a stacked-layer structure including a plurality of layers.

In addition, although the insulating layer 64 is provided so as to be in contact with the first electrode layer 60 in FIG. 24B, the insulating layer 64 may be provided so as to be in contact with the second electrode layer 63 by reversing of the positions of the insulating layer and the electroluminescent layer.

Although the insulating layers 54 and 64 in FIGS. 23B, 23C, 24B and 24C are not particularly limited, such insulating layers preferably have high dielectric strength and dense film qualities, and more preferably have a high dielectric constant. For example, silicon oxide (SiO$_2$), yttrium oxide (Y$_2$O$_3$), titanium oxide (TiO$_2$), aluminum oxide (Al$_2$O$_3$), hafnium oxide (HfO$_2$), tantalum oxide (Ta$_2$O$_5$), barium titanate (BaTiO$_3$), strontium titanate (SrTiO$_3$), lead titanate (PbTiO$_3$), silicon nitride (Si$_3$N$_4$), zirconium oxide (ZrO$_2$), or the like, or a mixed film or a staked-layer film of two or more kinds thereof can be used. These insulating films can be formed by sputtering, evaporation, CVD, or the like. Alternatively, the insulating layers may be formed by dispersing of particles of these insulating materials in a binder. The binder material may be formed of the same material and by the same method as the binder contained in the electroluminescent layer. A thickness of the insulating layer is not particularly limited, and a thickness of 10 to 1000 nm is preferable.

The light-emitting element described in this embodiment mode can emit light by application of a voltage between the pair of electrodes which sandwich the electroluminescent layer, and can be operated by direct current driving or alternating current driving.

By the present invention, a component such as a wiring included in a display device can be formed into a desired shape. In addition, since the number of complicated photolithography steps can be reduced and a display device can be manufactured through a simplified process, loss of materials and the cost can be reduced. Therefore, high-performance and highly reliable display devices can be manufactured with a high yield.

This embodiment mode can be freely combined with any of Embodiment Modes 1 to 5 as appropriate.

Embodiment Mode 9

In this embodiment mode, an example of a display device manufactured through a highly reliable and more simplified process at low cost is described. Specifically, a liquid crystal display device using a liquid crystal element for a display element is described.

Figure 19A:
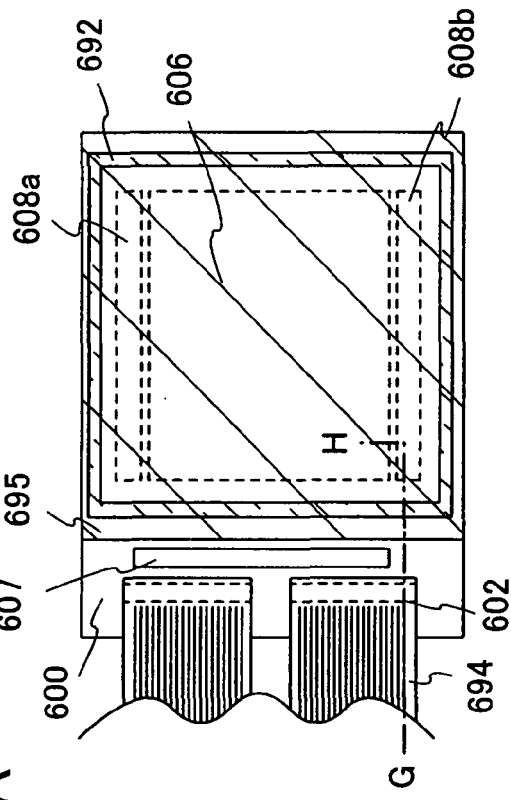
FIGS. 19A and 19B are views showing a display device of the present invention.
Figure 19B:
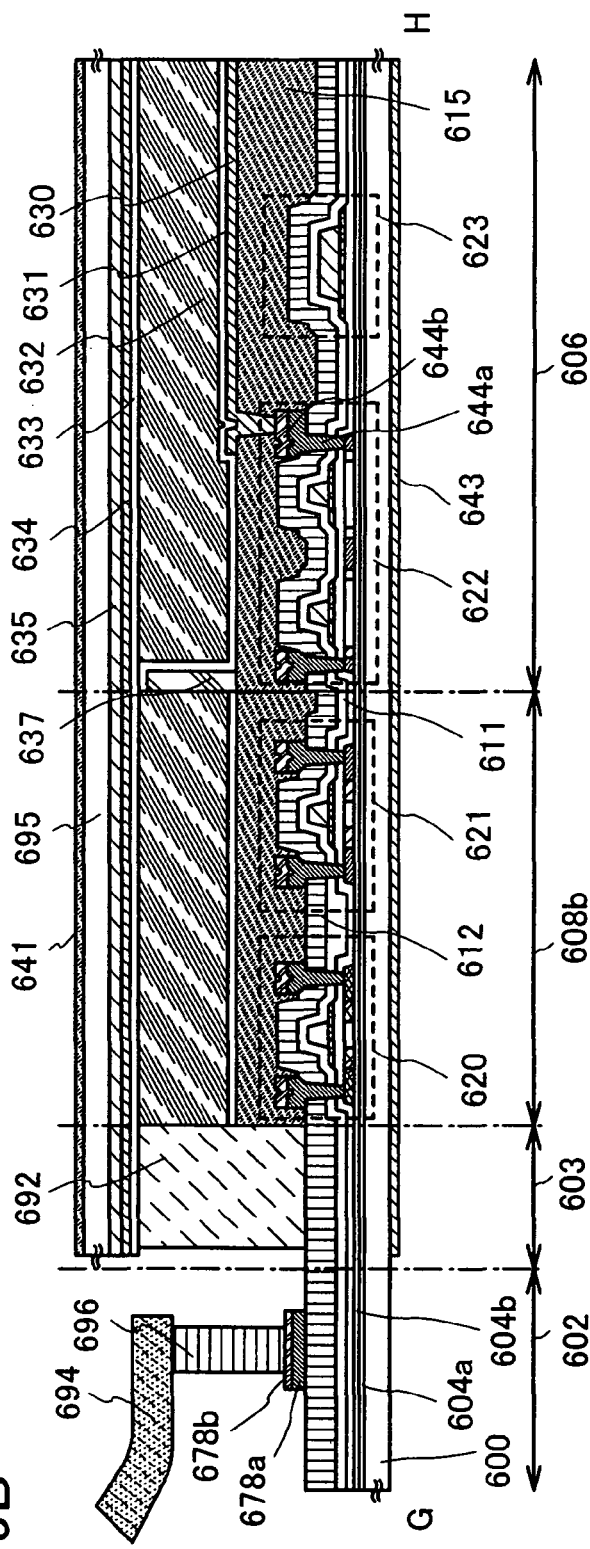

FIG. 19A is a top plan view of a liquid crystal display device, and FIG. 19B is a cross-sectional view taken along a line G-H of FIG. 19A.

As shown in FIG. 19A, a pixel region 606, a driving circuit region 608a which is a scan line driving region, and a driving circuit region 608b which is a scan line driving region are sealed between a substrate 600 and a counter substrate 695 with a sealing material 692. A driving circuit region 607 which is a signal line driver circuit formed with an IC driver is provided over the substrate 600. A transistor 622 and a capacitor 623 are provided in the pixel region 606. A driver circuit having transistors 620 and 621 is provided in the driving circuit region 608b. An insulating substrate can be used as the substrate 600 as in the above embodiment modes. Although there is a concern that a substrate formed of a synthetic resin generally has a lower temperature limit than other substrates, the substrate formed of a synthetic resin can be used when a manufacturing process is performed using a substrate with high heat resistance and then the substrate formed of a synthetic resin displaces the substrate with high heat resistance.

In the pixel region 606, the transistor 622 which is to be a switching element is provided with base films 604a and 604b interposed therebetween. In this embodiment mode, a multi-gate thin film transistor (TFT) is used as the transistor 622, which includes a semiconductor layer having impurity regions serving as a source region and a drain region, a gate insulting layer, a gate electrode layer having a stacked-layer structure of two layers, a source electrode layer, and a drain electrode layer. The source electrode layer or drain electrode layer is in contact with and electrically connected to an impurity region of the semiconductor layer and a pixel electrode layer 630.

The source electrode layer and drain electrode layer have a stacked-layer structure, and the source electrode layers or drain electrode layers 644a and 644b are electrically connected to the pixel electrode layer 630 through an opening formed in an insulating layer 615. The opening formed in the insulating layer 615 can be formed by irradiation with laser light as described in Embodiment Mode 2. In this embodiment mode, the source electrode layer or drain electrode layer 644b is formed using a low-melting point metal that is relatively easily evaporated (chromium in this embodiment mode), and the source electrode layer or drain electrode layer 644a is formed using a high-melting point metal that is not easily evaporated compared to the source electrode layer or drain electrode layer 644b (tungsten in this embodiment mode). The source electrode layers or drain electrode layers 644a and 644b are selectively irradiated with laser light from the insulating layer 615 side, and then the insulating layer 615 over the irradiated region of the source electrode layer or the drain electrode layers 644b is removed by irradiation energy to form the opening. The pixel electrode layer 630 is formed in the opening where the source electrode layers or drain electrode layers 644a and 644b are exposed, and the source electrode layers or drain electrode layers 644a and 644b and the pixel electrode layer 630 can be electrically connected to each other.

The thin film transistor can be manufactured by various methods. For example, a crystalline semiconductor film is used for an active layer, a gate electrode is formed over the crystalline semiconductor film with a gate insulating film interposed therebetween, and an impurity element can be added to the active layer with use of the gate electrode. Thus, when the gate electrode is used for adding the impurity element, a mask for adding the impurity element is not necessarily formed. The gate electrode can have a single-layer structure or a stacked-layer structure. The impurity region can be a high-concentration impurity region or a low-concentration impurity region with its concentration being controlled. A structure of a thin film transistor having a low-concentration impurity region is called an LDD (Light Doped Drain) structure. Alternatively, the low-concentration impurity region may be formed so as to overlap with the gate electrode and a structure of such a thin film transistor is called a GOLD (Gate Overlapped LDD) structure. The polarity of the thin film transistor is an n type when phosphorus (P) or the like is used for the impurity region. The polarity of the thin film transistor is a p type when boron (B) or the like is added. After that, insulating films 611 and 612 covering the gate electrode and the like are formed. A dangling bond of the crystalline semiconductor film can be terminated by a hydrogen element mixed into the insulating film 611 (and the insulating film 612).

In order to further improve planarity, the insulating layer 615 may be formed as an interlayer insulating layer. For the insulating layer 615, an organic material, an inorganic material, or a stacked-layer structure thereof can be used. For example, a material selected from silicon oxide, silicon nitride, silicon oxynitride, silicon nitride oxide, aluminum nitride, aluminum oxynitride, aluminum nitride oxide containing more nitrogen than oxygen, aluminum oxide, diamond-like carbon (DLC), polysilazane, nitrogen-containing carbon (CN), PSG (phosphosilicate glass), BPSG (borophosphosilicate glass), alumina, or any other substance containing an inorganic insulating material can be used. Alternatively, an organic insulating material may be used. As the organic material, either a photosensitive or nonphotosensitive material can be used, and polyimide, acrylic, polyamide, polyimide amide, resist, benzocyclobutene, a siloxane resin, or the like can be used. It is to be noted that a siloxane resin is a resin containing a Si—O—Si bond. The skeletal structure of siloxane is formed of a bond of silicon (Si) and oxygen (O). As a substituent, an organic group containing at least hydrogen (such as an alkyl group or aromatic hydrocarbon) is used. Instead, a fluoro group or a fluoro group and an organic group containing at least hydrogen may be used as the substituent.

The pixel region and the driver circuit region can be formed over one substrate when the crystalline semiconductor film is used. In this case, a transistor in the pixel portion and a transistor in the driver circuit region 608b are formed at the same time. The transistor used in the driver circuit region 608b forms a CMOS circuit. Although a thin film transistor included in the CMOS circuit has a GOLD structure, it may have an LDD structure like the transistor 622.

A structure of the thin film transistor in the pixel region is not limited to those in this embodiment mode, and a single-gate structure in which one channel formation region is formed, a double-gate structure in which two channel formation regions are formed, or a triple-gate structure in which three channel formation regions are formed may be employed. A thin film transistor in a peripheral driver circuit region may also have a single-gate structure, a double-gate structure, or a triple-gate structure.

It is to be noted that a method for manufacturing a thin film transistor is not limited to those described in this embodiment mode. The thin film transistor may have a top gate structure (such as a staggered type), a bottom gate structure (such as a inverse staggered type), a dual gate structure in which two gate electrode layers are arranged above or below a channel formation region, each with a gate insulating film interposed therebetween, or another structure.

Then, an insulating layer 631 called an alignment film is formed by a printing method or a droplet discharging method so as to cover the pixel electrode layer 630. It is to be noted that the insulating layer 631 can be selectively formed by a screen printing method or an off-set printing method. Thereafter, rubbing treatment is performed. This rubbing treatment is not performed in some cases when a liquid crystal mode is, for example, a VA mode. An insulating layer 633 serving as an alignment film is similar to the insulating layer 631. Then, the sealing material 692 is formed in a peripheral region of the pixels by a droplet discharging method.

After that, the counter substrate 695 provided with the insulating layer 633 serving as the alignment film, a conductive layer 634 serving as a counter electrode, a colored layer 635 serving as a color filter, a polarizer 641 (also referred to as a polarizing plate) is attached to the substrate 600 which is a TFT substrate with a spacer 637 interposed therebetween. A liquid crystal layer 632 is provided in a space therebetween. Since the liquid crystal display device of this embodiment mode is a transmissive type, a polarizer (polarizing plate) 643 is also provided on a side of the substrate 600, which is opposite to a side where an element is formed. The polarizer can be provided over the substrate with the use of an adhesive layer. A filler may be mixed into the sealing material, and a shielding film (black matrix) or the like may be formed over the counter substrate 695. It is to be noted that a color filter or the like may be formed of materials which exhibit red (R), green (G), and blue (B) when the liquid crystal display device performs full-color display, and the colored layer may be omitted or may be formed of a material which exhibits at least one color when the liquid crystal display device performs single-color display.

It is to be noted that when RGB light-emitting diodes (LEDs) or the like are provided in a backlight and a field sequential method for performing color display by time division is employed, there is the case where a color filter is not provided. The black matrix may be provided so as to overlap with the transistor and the CMOS circuit because the black matrix reduces the reflection of external light by the wiring in the transistor and the CMOS circuit. Alternatively, the black matrix may be provided so as to overlap with the capacitor. It is because the black matrix can prevent reflection due to a metal film included in the capacitor.

As a method for forming the liquid crystal layer, a dispenser method (dripping method) or an injection method by which the substrate 600 provided with an element and the counter substrate 695 are attached and then a liquid crystal is injected with the use of capillary phenomenon can be used. A dripping method may be employed when a large substrate to which an injection method is difficult to be applied is used.

A spacer may be provided by a method by which particles each having a size of several μm are sprayed. In this embodiment mode, a method by which a resin film is formed over the entire surface of the substrate and then etched is employed. A material for the spacer is applied by a spinner and then, light exposure and developing treatment are performed to form a predetermined pattern. Further, the material is heated at 150 to 200° C. in a clean oven or the like to be cured. The spacer manufactured in this manner can have various shapes depending on the conditions of light exposure and the developing treatment. It is preferable that the spacer have a columnar shape with a flat top so that mechanical strength of the liquid crystal display device can be secured when the counter substrate is attached. The shape of the spacer is not particularly limited and may be conical, pyramidal, or the like.

Then, an FPC 694, which is a wiring board for connection, is provided over terminal electrode layers 678a and 678b electrically connected to the pixel region, with an anisotropic conductive layer 696 interposed therebetween. The FPC 694 transmits an external signal and an external potential. Through the aforementioned steps, a liquid crystal display device having a display function can be manufactured.

The wiring and the gate electrode layer, which are included in the transistor, the pixel electrode layer 630, and the conductive layer 634 serving as the counter electrode layer can be formed using indium tin oxide (ITO), indium zinc oxide (IZO) in which zinc oxide (ZnO) is mixed with indium oxide, a conductive material in which silicon oxide ($SiO_2$) is mixed with indium oxide, organic indium, organic tin, indium oxide containing tungsten oxide, indium zinc oxide containing tungsten oxide, indium oxide containing titanium oxide, indium tin oxide containing titanium oxide; a metal such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), or silver (Ag); an alloy of such metals; or metal nitride thereof.

A retardation plate may be provided between the polarizing plate and the liquid crystal layer.

Note that in this embodiment mode, a TN liquid crystal panel is described; however, the above process can be similarly applied to liquid crystal panels of other modes. For example, this embodiment mode can be applied to a liquid crystal panel of an in-plane switching mode in which liquid crystals are aligned by application of an electric filed in a direction parallel to the glass substrate. Further, this embodiment mode can also be applied to a VA (Vertical Alignment) mode liquid crystal panel.

Figure 5:
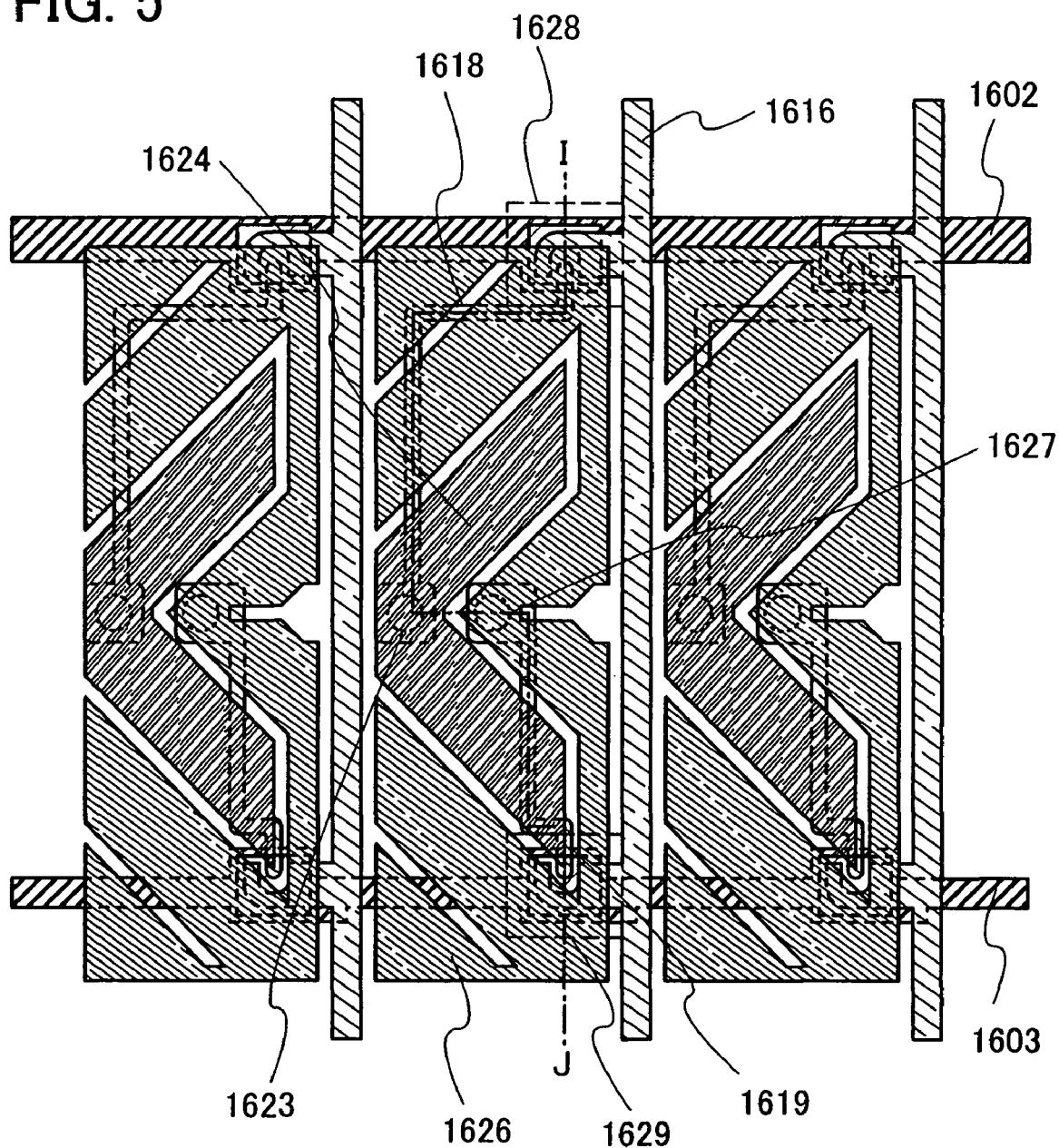
FIG. 5 is a view showing a display device of the present invention.
Figure 6:
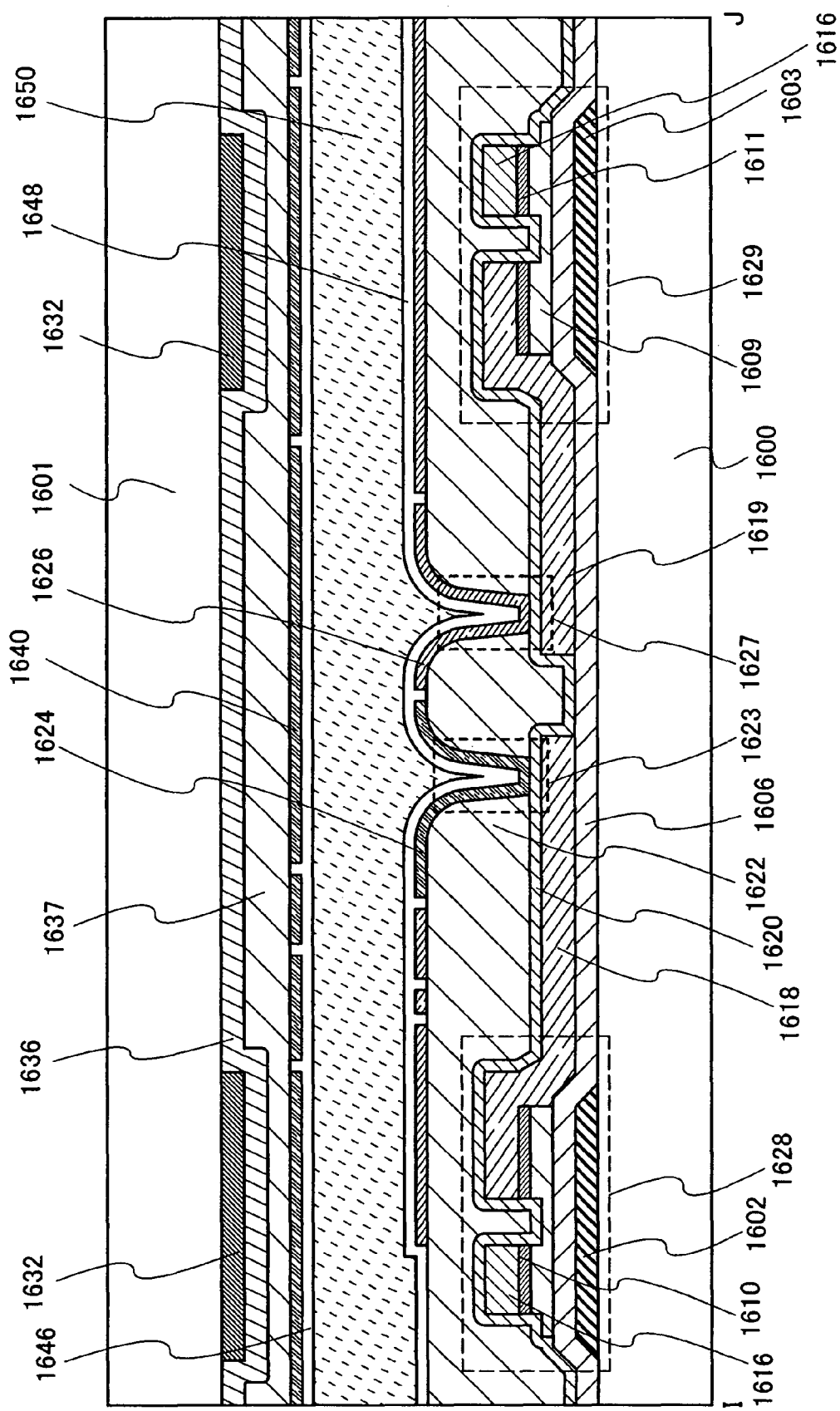
FIG. 6 is a view showing a display device of the present invention.

FIGS. 5 and 6 each show a pixel structure of a VA liquid crystal panel. FIG. 5 is a plan view, and FIG. 6 shows a cross-sectional structure taken along a line I-J. In the following description, both of these drawings are used.

In this pixel structure, a plurality of pixel electrodes are provided in one pixel, and each pixel electrode is connected to a TFT. Each TFT is constituted so as to be driven by a different gate signal. In other words, a multi-domain pixel has a structure in which a signal applied to each pixel electrode is independently controlled.

A pixel electrode layer 1624 is connected to a TFT 1628 with a wiring layer 1618 through an opening (contact hole) 1623. In addition, a pixel electrode layer 1626 is connected to a TFT 1629 with a wiring layer 1619 through an opening (contact hole) 1627. A gate wiring layer 1602 of the TFT 1628 and a gate electrode layer 1603 of the TFT 1629 are separated so as to be able to receive different gate signals. On the other hand, a wiring layer 1616 functioning as a data line is used in common by the TFTs 1628 and 1629.

The pixel electrode layers 1624 and 1626 may also be selectively formed in a similar manner to that described in Embodiment Mode 3, in which a conductive light absorbing film is formed over the transfer substrate and then laser light is irradiated, so that the pixel electrode layers 1624 and 1626a are processed into desired shapes and selectively formed over the substrate to which a light absorbing layer is transferred. Thus, since the process can be simplified and loss of materials can be prevented by the present invention, a display device can be manufactured at low cost with high productivity.

Figure 7:
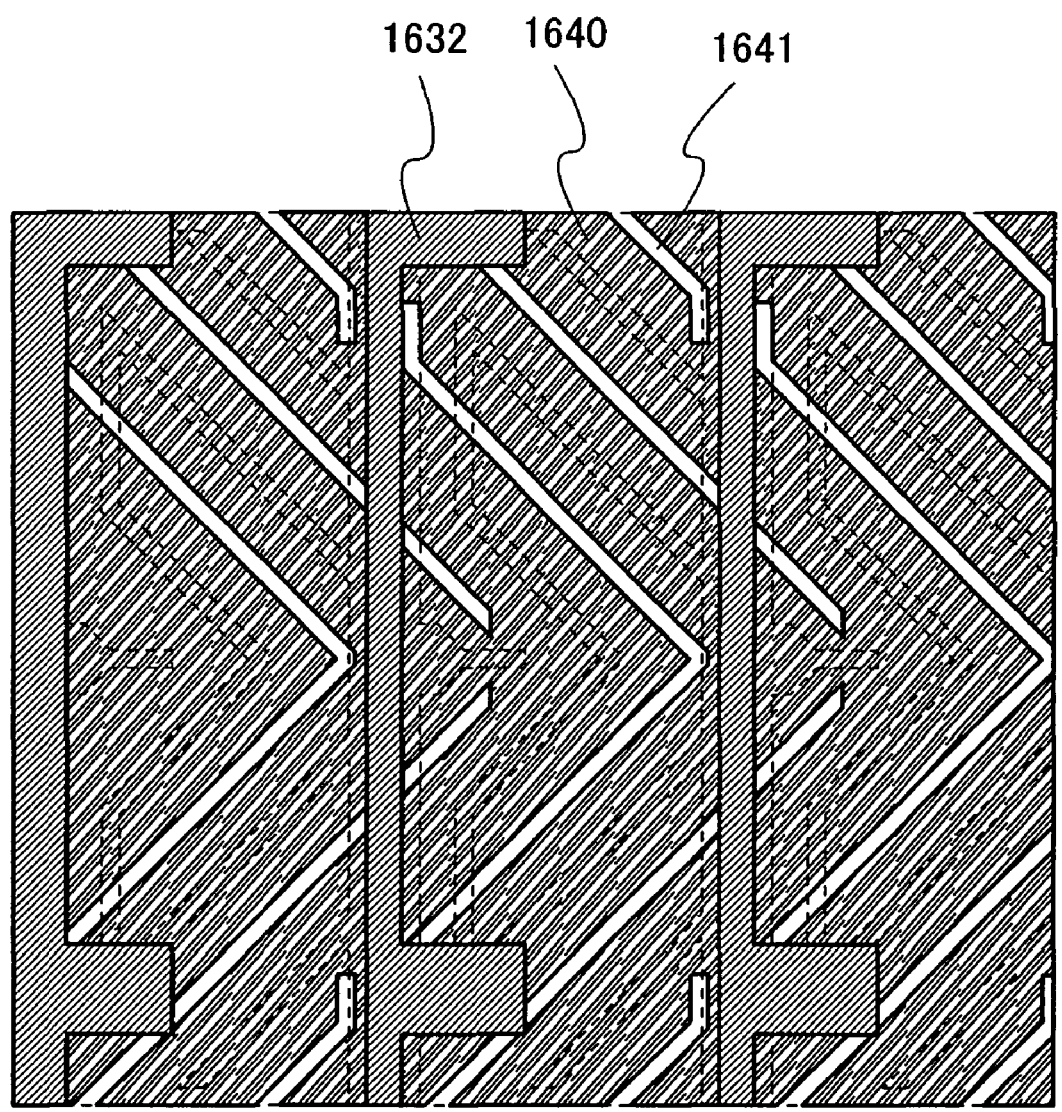
FIG. 7 is a view showing a display device of the present invention.
Figure 8A:
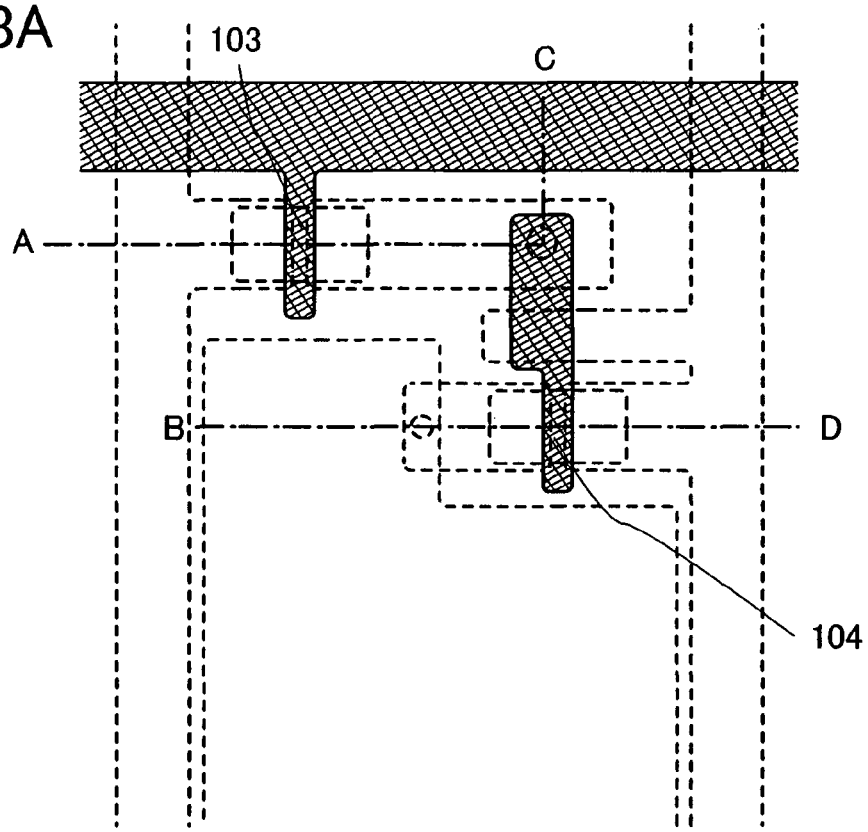
FIGS. 8A to 8C are views showing a method for manufacturing a display device of the present invention.
Figure 8B:
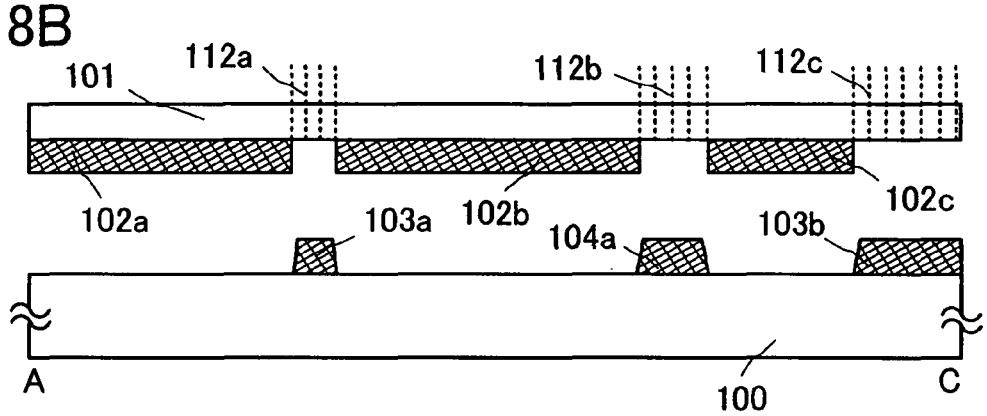
Figure 8C:
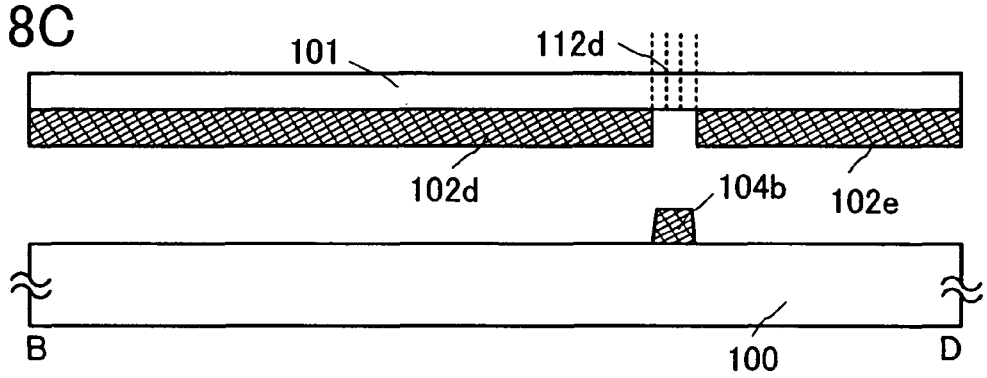

The shapes of the pixel electrode layers 1624 and 1626 are different, and the pixel electrode layers 1624 and 1626 are separated by a slit 1625. The pixel electrode layer 1626 is formed so as to surround the pixel electrode layer 1624 that is extended into a V shape. Timings of application of voltage to the pixel electrode layers 1624 and 1626 are made different in the TFTs 1628 and 1629, thereby controlling alignment of liquid crystals. A light-shielding film 1632, a colored layer 1636, and a counter electrode layer 1640 are formed over a counter substrate 1601. A planarization film 1637 is formed between the colored layer 1636 and the counter electrode layer 1640 so that disordered alignment of liquid crystals is prevented. FIG. 7 shows a structure on the counter substrate side. The counter electrode layer 1640 is used in common by different pixels, and a slit 1641 is formed. The slit 1641 and the slit 1625 on the side of the pixel electrode layers 1624 and 1626 are arranged so as to alternately interdigitate, and thus an oblique electric field can be effectively generated to control alignment of liquid crystals. Accordingly, an alignment direction of the liquid crystals can be varied depending on a place; therefore, the viewing angle can be widened.

Thus, a liquid crystal panel can be manufactured using a composite material of an organic compound and an inorganic compound for a pixel electrode layer. With the use of such a pixel electrode layer, it is not necessary to use a transparent conductive film containing indium as its main component and bottlenecks of materials can be resolved.

This embodiment mode can be freely combined with any of Embodiment Modes 1 to 3 as appropriate.

By the present invention, a component such as a wiring included in a display device can be formed into a desired shape. In addition, since the number of complicated photolithography steps can be reduced and a display device can be manufactured through a simplified process, loss of materials and the cost can be reduced. Therefore, high-performance and highly reliable display devices can be manufactured with a high yield.

Embodiment Mode 10

In this embodiment mode, an example of a display device manufactured through a highly reliable and more simplified process at low cost is described. Specifically, a liquid crystal display device using a liquid crystal display element for a display element is described.

Figure 18:
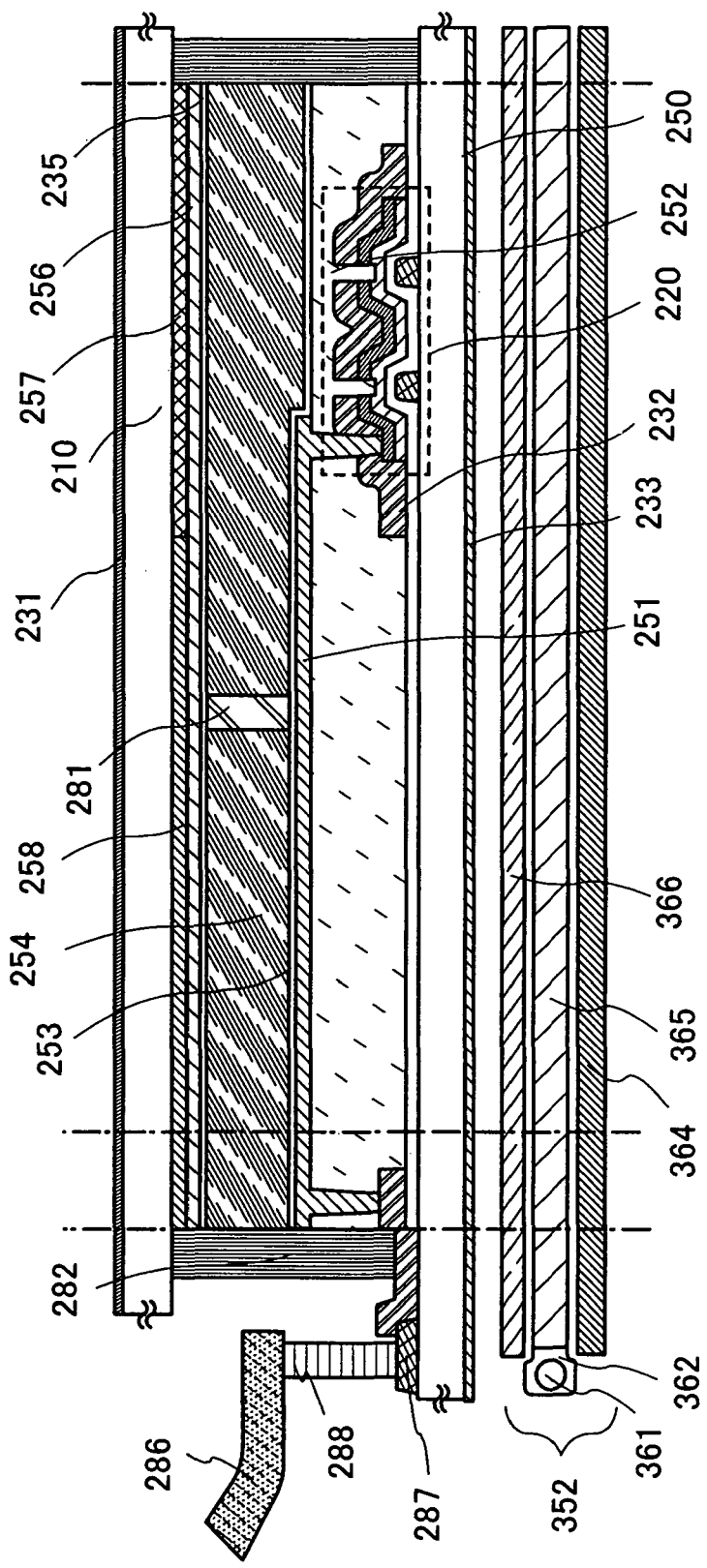
FIG. 18 is a view showing a display device of the present invention.

In the display device shown in FIG. 18, a transistor 220 which is a inverse staggered thin film transistor, a pixel electrode layer 251, an insulating layer 252, an insulating layer 253, a liquid crystal layer 254, a spacer 281, an insulating layer 235, a counter electrode layer 256, a color filter 258, a black matrix 257, a counter substrate 210, a polarizing plate (polarizer) 231, and a polarizing plate (polarizer) 233, which are in a pixel region, and a sealing material 282, a terminal electrode layer 287, an anisotropic conductive layer 288, and an FPC 286, which are in a sealing region, are provided over a substrate 250.

A gate electrode layer, a source electrode layer and a drain electrode layer of the transistor 220, which is a inverse staggered thin film transistor formed in this embodiment mode, and the pixel electrode layer 251 may also be selectively formed in a similar manner to that described in Embodiment Mode 3, in which a conductive light absorbing film using a conductive material or a semiconductor material is formed over the transfer substrate and then laser light is irradiated, so that a gate electrode layer, a source electrode layer, a drain electrode layer, and the pixel electrode layer 251 of the transistor 220 which is an inverse staggered thin film transistor formed in this embodiment mode are processed into a desired shape and selectively formed over the substrate to which a light absorbing layer is transferred. Thus, since the process can be simplified and loss of materials can be prevented by the present invention, a display device can be manufactured at low cost with high productivity.

In this embodiment mode, an amorphous semiconductor is used for a semiconductor layer, and a semiconductor layer having one conductivity type may be formed as needed. In this embodiment mode, a semiconductor layer and an amorphous n-type semiconductor layer as a semiconductor layer having one conductivity type are stacked. Further, an NMOS structure of an n-channel thin film transistor in which an n-type semiconductor layer is formed, a PMOS structure of a p-channel thin film transistor in which a p-type semiconductor layer is formed, or a CMOS structure of an n-channel thin film transistor and a p-channel thin film transistor can be formed.

Moreover, in order to impart conductivity, an element imparting conductivity is added by doping and an impurity region is formed in the semiconductor layer, so that an n-channel thin film transistor and a p-channel thin film transistor can be formed. Instead of formation of an n-type semiconductor layer, conductivity may be imparted to the semiconductor layer by plasma treatment with a $PH_3$ gas.

In this embodiment mode, the transistor 220 is an n-channel inverse staggered thin film transistor. Alternatively, a channel protective inverse staggered thin film transistor in which a protective layer is provided over the channel region of the semiconductor layer may be used.

Next, a structure of a backlight unit 352 is described. The backlight unit 352 includes a cold cathode tube, a hot cathode tube, a light-emitting diode, an inorganic EL, or an organic EL as a light source 361 which emits fluorescence, a lamp reflector 362 for effectively leading fluorescence to a light guide plate 365, the light guide plate 365 for leading light to the entire surface with fluorescence totally reflected, a diffusing plate 366 for reducing variations in brightness, and a reflective plate 364 for reusing light leaked under the light guide plate 365.

A control circuit for adjusting the luminance of the light source 361 is connected to the backlight unit 352. The luminance of the light source 361 can be controlled by a signal supplied from the control circuit.

A source electrode layer or drain electrode layer of the transistor 220 is electrically connected to the pixel electrode layer 251 through the opening formed in the insulating layer 252. The opening formed in the insulating layer 252 can be formed by irradiation with laser light as shown in Embodiment Mode 1. In this embodiment mode, the source electrode layer or drain electrode layer is formed using a low-melting point metal that is relatively easily vaporized (chromium in this embodiment mode). The source electrode layer or drain electrode layer is selectively irradiated with laser light from the insulating layer 252 side, and then the insulating layer 252 over the irradiated region of the source electrode layer or drain electrode layer is removed by irradiation energy to form the opening. The pixel electrode layer 251 is formed in the opening where the source electrode layer or drain electrode layer is exposed, and the source electrode layer or drain electrode layer and the pixel electrode layer 251 can be electrically connected to each other.

This embodiment mode can be appropriately combined with Embodiment Modes 1 to 3.

By the present invention, a component such as a wiring included in a display device can be formed into a desired shape. In addition, since the number of complicated photolithography steps can be reduced and a display device can be manufactured through a simplified process, loss of materials and the cost can be reduced. Therefore, high-performance and highly reliable display devices can be manufactured with a high yield.

Embodiment Mode 11

In this embodiment mode, an example of a display device manufactured through a highly reliable and more simplified process at low cost is described.

Figure 21:
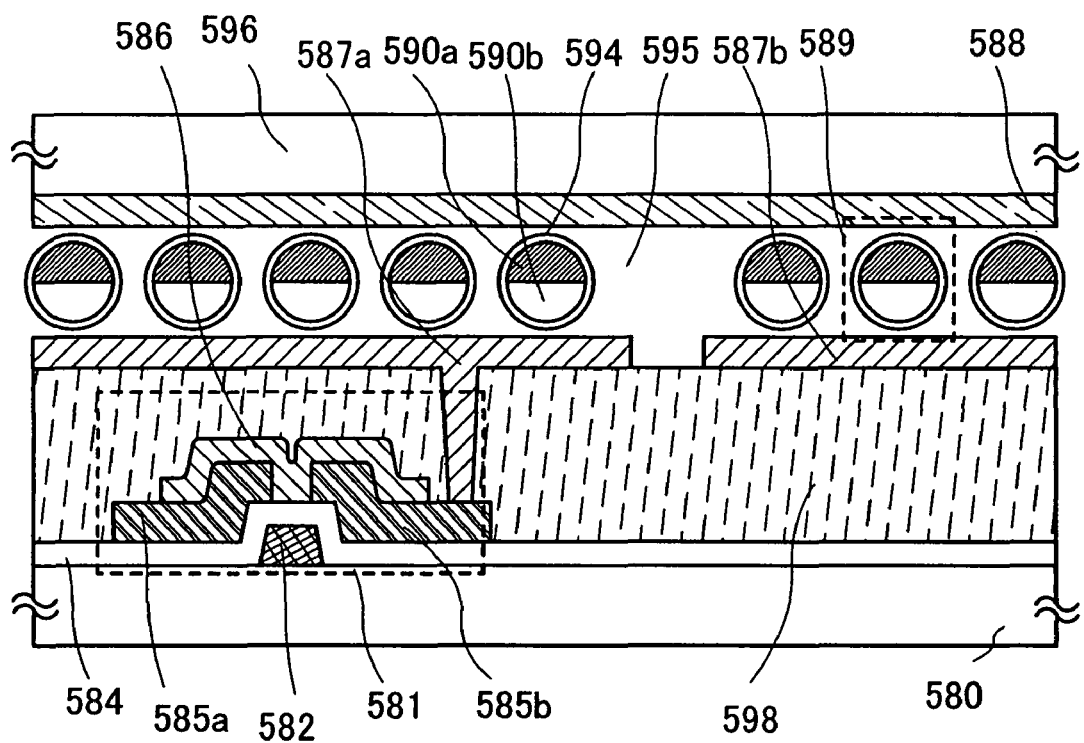
FIG. 21 is a view showing a display device of the present invention.

FIG. 21 shows an active matrix type electronic paper to which the present invention is applied. Although FIG. 21 shows an active matrix type, the present invention can also be applied to a passive matrix type.

A twist ball display mode may be used for the electronic paper. A twist ball display mode means a method in which spherical particles each colored in black and white are arranged between a first electrode layer and a second electrode layer, and a potential difference is generated between the first electrode layer and the second electrode layer to control directions of the spherical particles, so that display is performed.

A transistor 581 is an inverse coplanar thin film transistor, and includes a gate electrode layer 582, a gate insulating layer 584, wiring layers 585a and 585b, and a semiconductor layer 586. In addition, the wiring layer 585b is in contact with and electrically connected to first electrode layers 587a through an opening formed in an insulating layer 598. Between the first electrode layers 587a and 587b, and a second electrode layer 588, spherical particles 589 each including a black region 590a and a white region 590b, and a cavity 594 filled with liquid around the black region 590a and the white region 590b are provided. The circumference of the spherical particle 589 is filled with a filler 595 such as a resin or the like (see FIG. 21).

In this embodiment mode, the gate electrode layer, the semiconductor layer, the source electrode layer, the drain electrode layer, and the like may also be selectively formed in a same manner to that described in Embodiment Mode 3, in which a conductive light absorbing film is formed over the transfer substrate and then laser light is irradiated, so that the gate electrode layer, the semiconductor layer, the source electrode layer, the drain electrode layer, and the like are processed into desired shapes and selectively formed over the substrate to which a light absorbing layer is transferred. By the present invention, the process can be simplified and loss of materials can be prevented. Accordingly, cost reduction can be achieved.

The wiring layer 585*b* is electrically connected to the first electrode layer 587*a* through the opening formed in the insulating layer 598. The opening formed in the insulating layer 598 can be formed by irradiation with laser light as shown in Embodiment Mode 1. In this embodiment mode, the wiring layer 585*b* is formed using a low-melting point metal that is relatively easily vaporized (chromium in this embodiment mode). The wiring layer 585*b* is selectively irradiated with laser light from the insulating layer 598 side, and then the insulating layer 598 over the irradiated region of the wiring layer 585*b* is removed by irradiation energy to form the opening. The first electrode layer 587*a* is formed in the opening where the wiring layer 585*b* is exposed, and the wiring layer 585*b* and the first electrode layer 587*a* can be electrically connected to each other.

Instead of the twist ball, an electrophoretic element may be used. A microcapsule having a diameter of approximately 10 to 20 μm in which transparent liquid, positively charged white microparticles, and negatively charged black microparticles are encapsulated is used. In the microcapsule provided between the first electrode layer and the second electrode layer, when an electric field is applied by the first electrode layer and the second electrode layer, the white microparticles and black microparticles move to opposite sides from each other, so that white or black can be displayed. A display element using this principle is an electrophoretic display element and is called an electronic paper in general. The electrophoretic display element has higher reflectivity than a liquid crystal display element, and thus an assistant light is unnecessary, power consumption is low, and a display portion can be recognized even in a dim place. Further, even when electric power is not supplied to the display portion, an image which has been displayed once can be stored. Thus, a displayed image can be stored even if a display device having a display function is distanced from a source of an electronic wave.

The transistor may have any structure as long as the transistor can function as a switching element. As a semiconductor layer, various semiconductors such as an amorphous semiconductor, a crystalline semiconductor, a polycrystalline semiconductor, and a microcrystal semiconductor may be used, or an organic transistor may be formed using an organic compound.

In this embodiment mode, specifically, the case where a structure of a display device is an active matrix type is described; however, it is needless to say that the present invention can also be applied to a passive matrix display device. Also in a passive matrix display device, the wiring layer, the electrode layer, and the like may be selectively formed, in which a conductive light absorbing film is formed over the transfer substrate and then laser light is irradiated, so that the wiring layer, the electrode layer, and the like are processed into desired shapes and selectively formed over the substrate to which a light absorbing layer is transferred.

This embodiment mode can be freely combined with any of Embodiment Modes 1 to 3 as appropriate.

By the present invention, a component such as a wiring included in a display device can be formed into a desired shape. In addition, since the number of complicated photolithography steps can be reduced and a display device can be manufactured through a simplified process, loss of materials and the cost can be reduced. Therefore, high-performance and highly reliable display devices can be manufactured with a high yield.

Embodiment Mode 12

Next, a mode of mounting a driver circuit on a display panel manufactured in accordance with Embodiment Modes 4 to 11 is described.

First, a display device employing a COG method is described with reference to FIG. 26A. A pixel portion 2701 for displaying information of characters, images, or the like is provided over a substrate 2700. A substrate provided with a plurality of driver circuits is divided into rectangles, and a driver circuit (also referred to as a driver IC) 2751 after division is mounted on the substrate 2700. FIG. 26A shows a mode of mounting a plurality of driver ICs 2751 and FPCs 2750 on the ends of the driver ICs 2751. In addition, when a size of the driver IC is almost the same length as that of a side of the pixel portion on a signal line side, a tape may be mounted on the end of the single driver IC.

Alternatively, a TAB method may be employed. In that case, a plurality of tapes may be attached, and driver ICs may be mounted on the tapes as shown in FIG. 27B. Similarly to the case of a COG method, a single driver IC may be mounted on a single tape. In this case, a metal piece or the like for fixing the driver IC is preferably attached together in terms of the strength.

A plurality of driver ICs to be mounted on the display panel are preferably formed over a rectangular substrate having a side of 300 to 1000 mm or a side longer than 1000 mm for improvement in productivity.

In other words, a plurality of circuit patterns each including a driver circuit portion and an input-output terminal as one unit may be formed over a substrate and may be divided to be taken out. In consideration of the side length of a pixel portion or a pixel pitch, the driver IC may be formed to be a rectangle having a long side of 15 to 80 mm and a short side of 1 to 6 mm. Alternatively, the driver IC may be formed to have the side length that is the same as that of the pixel portion, or the length obtained by addition of a side length of the pixel portion and a side length of each driver circuit.

An advantage of the external dimension of the driver IC over an IC chip is the length of the long side. When the driver IC having a long side length of 15 to 80 mm is used, the number of driver ICs necessary for being mounted in accordance with the pixel portion is smaller than that in the case of using IC chips. Therefore, the yield in manufacturing can be improved. When a driver IC is formed over a glass substrate, there is no limitation on the shape of the substrate used as a base; therefore, productivity is not decreased. This is a great advantage compared to the case where IC chips are taken out of a circular silicon wafer.

When a scan line driver circuit 3702 is formed to be integrated over a substrate as shown in FIG. 25B, a driver IC provided with a signal line driver circuit is mounted on a region on the outer side of a pixel portion 3701. The driver IC is a signal line driver circuit. In order to form a pixel region corresponding to RGB full colors, 3072 signal lines are necessary for an XGA class and 4800 signal lines are necessary for a UXGA class. The signal lines formed in such a number are divided into several blocks at the end portion of the pixel portion 3701, and leading lines are formed. The signal lines are gathered corresponding to the pitches of output terminals of the driver ICs.

The driver IC is preferably formed using a crystalline semiconductor formed over a substrate. The crystalline semiconductor is preferably formed by being irradiated with continuous wave laser light. Therefore, continuous wave solid-state laser or continuous wave gas laser is used for an oscillator for generating the laser light. When a continuous wave laser is used, there are few crystal defects and as a result, a transistor can be manufactured using a polycrystalline semiconductor layer having a large grain size. In addition, high-speed driving is possible because mobility and response speed are favorable, and it is possible to further improve an operating frequency of an element than that of the conventional element. Further, high reliability can be obtained because there is little variation in characteristics. It is to be noted that a channel length direction of the transistor and a scanning direction of laser light over a substrate preferably correspond in order to further improve the operating frequency. This is because the highest mobility can be obtained when a channel length direction of a transistor and a scanning direction of laser light over a substrate are almost parallel to each other (preferably, −30° to 30°) in a step of laser crystallization with continuous wave laser. It is to be noted that the channel length direction corresponds to a direction in which a current flows, in other words, a direction in which an electric charge moves, in a channel formation region. The thus formed transistor has an active layer including a polycrystalline semiconductor layer in which crystal grains are extended in the channel length direction, and this means that crystal grain boundaries are formed almost along the channel length direction.

In order to perform laser crystallization, it is preferable to significantly narrow laser light, and the shape of the laser light (beam spot) preferably has the width that is the same as a short side of the driver IC, which is approximately 1 to 3 mm. In addition, in order to secure an enough and effective energy density for an object to be irradiated, an irradiated region with laser light preferably has a linear shape. Note that the term "linear" used herein means not a line in a strict sense but a rectangle or an oblong with a large aspect ratio. For example, the linear shape refers to a rectangle or an oblong with an aspect ratio of 2 or more (preferably 10 to 10000). Thus, by setting a width of the laser light shape (beam spot) to be as long as a short side of the driver ICs, a method for manufacturing a display device, of which productivity is improved, can be provided.

As shown in FIGS. 27A and 27B, driver ICs may be mounted for both the scan line driver circuit and the signal line driver circuit. In this case, it is preferable to use the driver ICs having different specifications for the scan line driver circuit and the signal line driver circuit.

In the pixel region, the signal lines and the scan lines intersect to form a matrix, and transistors are arranged corresponding to intersections. In the present invention, TFTs having an amorphous semiconductor or a semi-amorphous semiconductor for a channel portion are used as the transistors arranged in the pixel region. The amorphous semiconductor is formed by a method such as a plasma CVD method or a sputtering method. The semi-amorphous semiconductor can be formed by a plasma CVD method at a temperature of 300° C. or lower, and a film thickness necessary for forming the transistor is formed in a short time even in the case of using, for example, a non-alkaline glass substrate having an external size of 550 mm×650 mm. The feature of such a manufacturing technique is effective in manufacturing a large-sized display device. In addition, a semi-amorphous TFT can obtain field effect mobility of 2 to 10 cm$^2$/V·sec by formation of a channel formation region using an SAS. When the present invention is used, a pattern can be formed into a desired shape with high controllability; therefore, a minute wiring can be stably formed without generation of a defect such as a short circuit. Thus, a display panel where system-on-panel is realized can be manufactured.

The scan line driver circuit can also be formed to be integrated over the substrate with the use of a TFT having a semiconductor layer formed of an SAS. When a TFT having a semiconductor layer formed of an SAS is used, the driver ICs are preferably mounted for both the scan line driver circuit and the signal line driver circuit.

In that case, it is preferable to use the driver ICs having different specifications for the scan line driver circuit and the signal line driver circuit. For example, it is necessary for a transistor included in the scan line driver IC to withstand a voltage of approximately 30 V; however, since a drive frequency is 100 kHz or lower, high-speed operation is not relatively necessary. Therefore, it is preferable to set a channel length (L) of the transistor included in the scan line driver sufficiently long. On the other hand, it is enough for a transistor of the signal line driver IC to withstand a voltage of approximately 12 V; however, since a drive frequency is approximately 65 MHz at 3 V, high-speed operation is necessary. Therefore, it is preferable to set a channel length or the like of the transistor included in a signal line driver on a micron rule.

A method for mounting the driver IC is not particularly limited, and a COG method, a wire bonding method, or a TAB method can be employed.

When the thicknesses of the driver IC and the counter substrate are set equal to each other, the heights of the driver IC and the counter substrate are almost equal, which contributes to thinning of a display device as a whole. When both substrates are formed from materials having the same characteristics, thermal stress is not generated and characteristics of a circuit formed of a TFT are not damaged even when a temperature change is caused in the display device. Furthermore, the number of the driver ICs to be mounted for one pixel portion can be reduced by mounting of driver ICs having a longer side than IC chips as driver circuits as described in this embodiment mode.

Thus, a driver circuit can be incorporated in a display panel.

Embodiment Mode 13

An example of a display panel (an EL display panel or a liquid crystal display panel) manufactured according to Embodiment Modes 4 to 11, in which a semiconductor layer is formed using an amorphous semiconductor or an SAS and a scan line driver circuit is formed over a substrate, is described.

Figure 31:
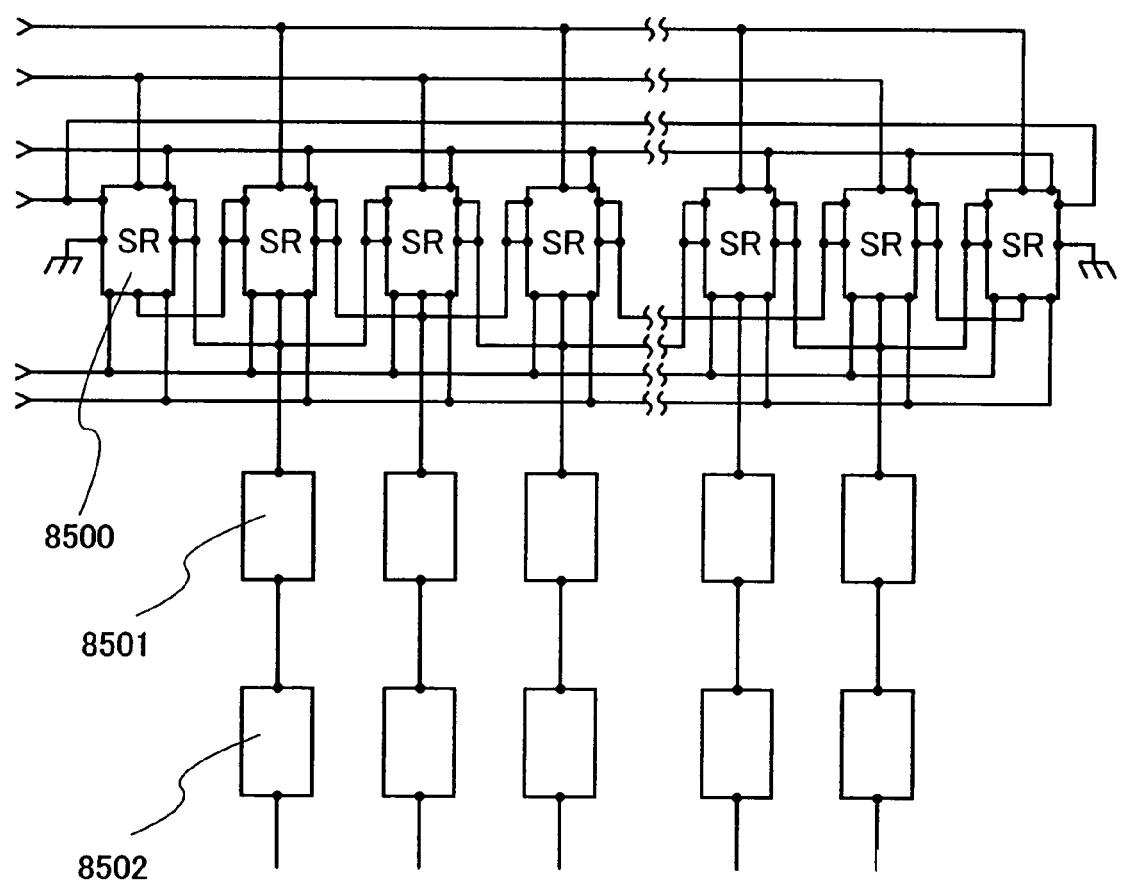
FIG. 31 is a diagram showing a circuit configuration in a case where a scan line driver circuit is formed using a TFT in a display panel of the present invention.

FIG. 31 is a block diagram of a scan line driver circuit formed using an n-channel TFT that uses an SAS with an electron field-effect mobility of 1 to 15 cm$^2$/V·sec.

In FIG. 31, a block 8500 corresponds to a pulse output circuit outputting sampling pulses for one stage. A shift register includes n number of pulse output circuits. Reference numeral 8501 denotes a buffer circuit and a pixel 8502 is connected to the buffer circuit.

Figure 32:
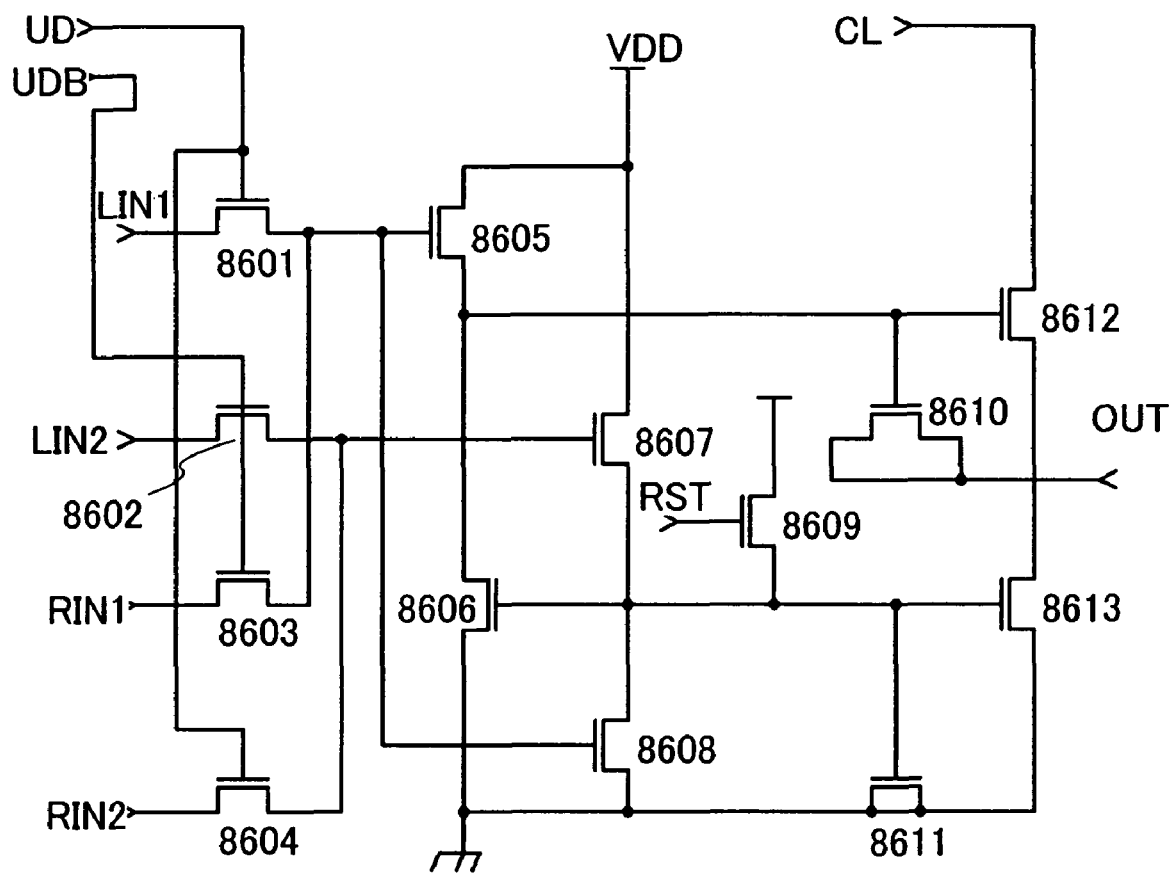
FIG. 32 is a diagram showing a circuit configuration in a case where a scan line driver circuit is formed using a TFT in a display panel of the present invention (shift register circuit).

FIG. 32 shows a specific configuration of the pulse output circuit 8500 including n-channel TFTs 8601 to 8613. In this case, the sizes of the TFTs may be determined in consideration of operation characteristics of the n-channel TFTs using an SAS. For example, when the channel length is set to be 8 μm, the channel width can be set to be in the range of 10 to 80 μm.

Figure 33:
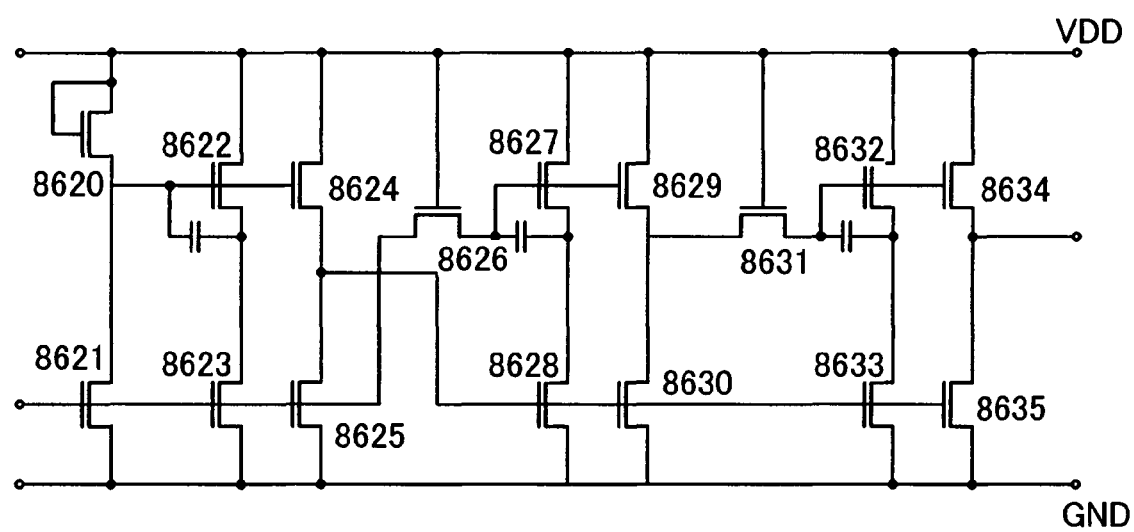
FIG. 33 is a diagram showing a circuit configuration in a case where a scan line driver circuit is formed using a TFT in a display panel of the present invention (buffer circuit).

Further, a specific configuration of the buffer circuit 8501 is shown in FIG. 33. Similarly, the buffer circuit includes n-channel TFTs 8620 to 8635. In this case, the sizes of the TFTs may be determined in consideration of operation characteristics of the n-channel TFTs using an SAS. For example, when the channel length is set to be 10 μm, the channel width can be set to be in the range of 10 to 1800 μm.

In order to realize such a circuit, TFTs are necessary to be connected to one another with a wiring.

Thus, a driver circuit can be incorporated in a display panel.

Embodiment Mode 14

Figure 16:
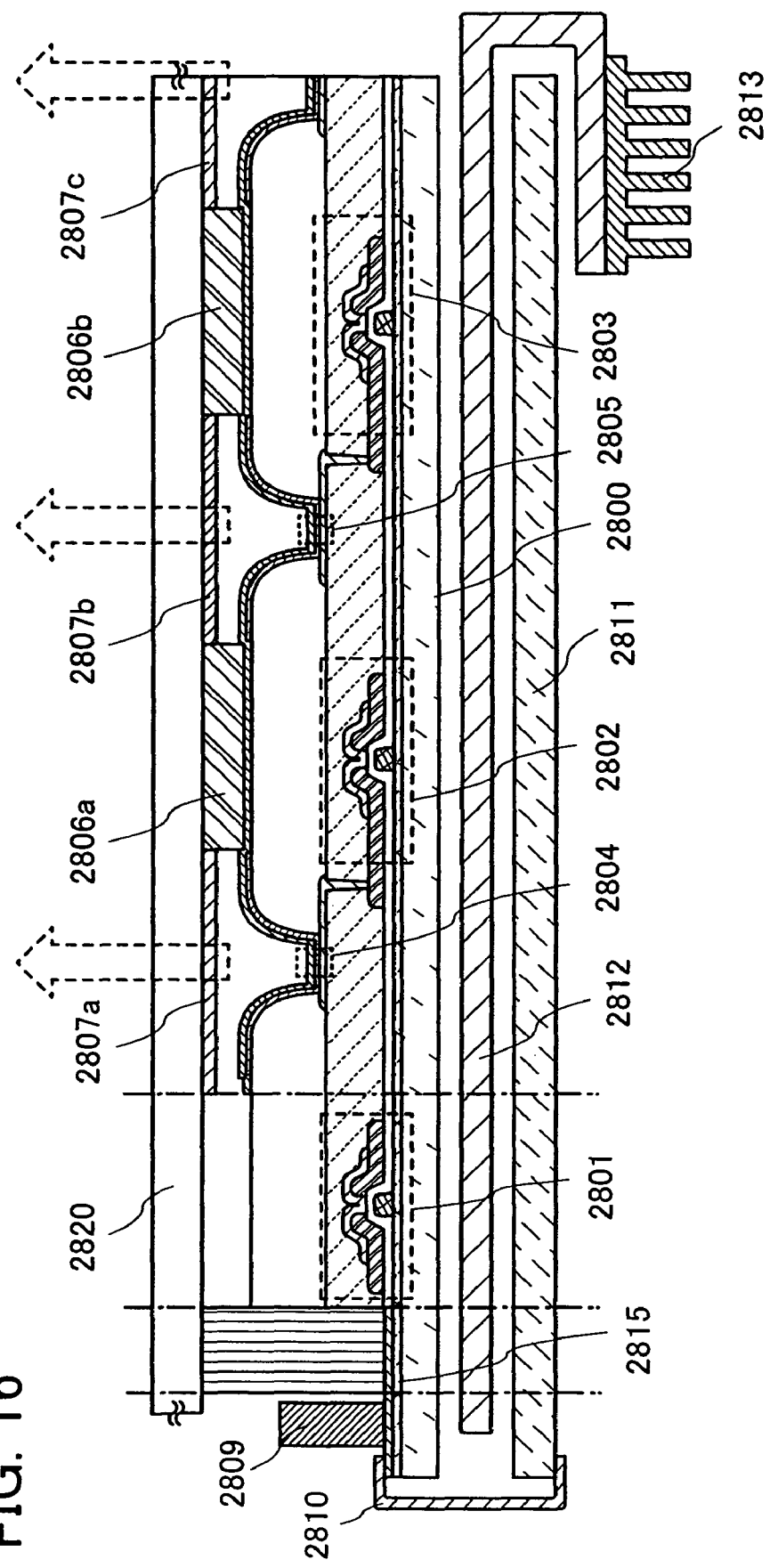
FIG. 16 is a cross-sectional view showing a structural example of a display module of the present invention.

This embodiment mode is described with reference to FIG. 16. FIG. 16 shows an example in which an EL display module is formed using a TFT substrate 2800 which is manufactured by the present invention. In FIG. 16, a pixel portion including pixels is formed over the TFT substrate 2800.

In FIG. 16, outside the pixel portion, a TFT similar to that formed in a pixel or a protective circuit portion 2801 operated similarly to a diode by connection of a gate of the TFT and a source or a drain of the TFT is provided between a driver circuit and the pixel. A driver IC formed using a single crystalline semiconductor, a stick driver IC formed using a polycrystalline semiconductor film over a glass substrate, a driver circuit formed using an SAS, or the like is applied to a driver circuit 2809.

The TFT substrate 2800 is attached firmly to a sealing substrate 2820 with spacers 2806*a* and 2806*b* formed by a droplet discharging method interposed therebetween. The spacers are preferably provided to keep a distance between two substrates constant even when the substrate is thin or an area of the pixel portion is increased. A space between the TFT substrate 2800 and the sealing substrate 2820 over light-emitting elements 2804 and 2805 connected to TFTs 2802 and 2803, respectively, may be filled with a resin material having at least a light-transmitting property of visible light, and the resin material may be solidified. Alternatively, the space may be filled with anhydrous nitrogen or an inert gas.

FIG. 16 shows the case where the light-emitting elements 2804 and 2805 are top-emission type and emit light in the direction of arrows shown in the drawing. Multicolor display can be performed by making each pixel emit light of a different color of red, green, or blue. At this time, color purity of light emitted to an external portion can be improved by formation of colored layers 2807*a*, 2807*b*, and 2807*c* corresponding to respective colors on the sealing substrate 2820 side. Alternatively, pixels as white light-emitting elements may be combined with the colored layers 2807*a*, 2807*b*, and 2807*c*.

The driver circuit 2809 which is an external circuit is connected to a scan line or signal line connection terminal, which is provided at one end of an external circuit board 2811, through a wiring board 2810. In addition, a heat pipe 2813 which is a highly efficient thermal conductive device with a pipe shape and a heat sink 2812, which are used for radiating heat to the external portion of the device, may be provided in contact with or adjacent to the TFT substrate 2800 to increase a heat radiation effect.

It is to be noted that FIG. 16 shows the top-emission EL module; however, a bottom-emission structure may be employed by changing of the structure of the light-emitting element or the position of the external circuit board. It is needless to say that a dual-emission structure in which light is emitted from both of a top surface and a bottom surface may be used. In the case of the top-emission structure, an insulating layer serving as a partition wall may be colored and used as a black matrix. This partition wall can be formed by a droplet discharging method, and it may be formed by mixing of a black resin of a pigment material, carbon black, or the like into a resin material such as polyimide. Instead, a stacked layer thereof may be used.

In addition, in an EL display module, reflected light of light entering from an external portion may be blocked with the use of a retardation plate or a polarizing plate. In a top-emission display device, an insulating layer serving as a partition wall may be colored to be used as a black matrix. This partition wall can be formed by a droplet discharging method or the like. Carbon black or the like may be mixed into a black resin of a pigment material or a resin material such as polyimide to be used, and instead, a stacked layer thereof may be used. By a droplet discharging method, different materials may be discharged to the same region plural times to form the partition wall. A quarter wave plate or a half wave plate may be used as the retardation plate and may be designed to be able to control light. As the structure, the light-emitting element, the sealing substrate (sealing material), the retardation plates (a quarter wave plate ($\lambda/4$) and a half wave plate ($\lambda/2$)), and the polarizing plate are sequentially formed over a TFT substrate, and light emitted from the light-emitting element is transmitted therethrough and is emitted to an external portion from the polarizing plate side. The retardation plate or polarizing plate may be provided on a side to which light is emitted or may be provided on both sides in the case of a dual-emission display device in which light is emitted from the both sides. In addition, an anti-reflective film may be provided on the outer side of the polarizing plate. Accordingly, higher-definition and precise images can be displayed.

As for the TFT substrate 2800, a sealing structure may be formed by attachment of a resin film to the side where the pixel portion is formed, with the use of a sealing material or an adhesive resin. Although glass sealing using a glass substrate is described in this embodiment mode, various sealing methods such as resin sealing using a resin, plastic sealing using plastics, and film sealing using a film may be employed. A gas barrier film which prevents water vapor from penetrating the resin film is preferably provided on the surface of the resin film. By employing a film sealing structure, further reduction in thickness and weight can be achieved.

This embodiment mode can be combined with any of Embodiment Modes 1 to 8, 12, and 13.

Embodiment Mode 15

This embodiment mode is described with reference to FIGS. 20A and 20B. FIGS. 20A and 20B show an example in which a liquid crystal display module is formed using a TFT substrate 2600 manufactured according to the present invention.

FIG. 20A is an example of a liquid crystal display module. The TFT substrate 2600 and a counter substrate 2601 are firmly attached to each other with a sealing material 2602, and a pixel portion 2603 and a liquid crystal layer 2604 are provided therebetween, thereby forming a display region. A colored layer 2605 is necessary for performing color display, and colored layers corresponding to red, green, and blue are provided for each pixel in the case of an RGB mode. A polarizing plate 2606 is provided on an outer side of the counter substrate 2601, and a polarizing plate 2607 and a diffusing plate 2613 are provided on an outer side of the TFT substrate 2600. A light source includes a cold cathode tube 2610 and a reflective plate 2611, and a circuit substrate 2612 is connected to the TFT substrate 2600 through a flexible wiring board 2609 and includes an external circuit such as a control circuit or a power source circuit. In addition, a retardation plate may be provided between the polarizing plate and the liquid crystal layer.

For the liquid crystal display module, a TN (Twisted Nematic) mode, an IPS (In-Plane-Switching) mode, an FFS (Fringe Field Switching) mode, an MVA (Multi-domain Vertical Alignment) mode, a PVA (Patterned Vertical Alignment) mode, an ASM (Axially Symmetric aligned Micro-cell) mode, an OCB (Optical Compensated Birefringence) mode, an FLC (Ferroelectric Liquid Crystal) mode, an AFLC (Anti-Ferroelectric Liquid Crystal) mode, or the like can be used.

FIG. 20B shows an example of an FS-LCD (Field Sequential-LCD) in which an OCB mode is applied to the liquid crystal display module of FIG. 20A. The FS-LCD emits light of red, green, and blue during one frame period and can perform color display by combining images using time division. Light of each color is emitted by a light-emitting diode, a cold cathode tube, or the like; therefore, a color filter is not necessary. Thus, it is not necessary to arrange color filters of three primary colors and restrict the display region of each color, and display of all three colors can be performed in any region. On the other hand, since light of three colors is emitted during one frame period, high-speed response is necessary for a liquid crystal. An FLC mode, an OCB mode, or the like each using an FS method is employed for a display device of the present invention, so that a display device or a liquid crystal television set with high performance and high image quality can be completed.

A liquid crystal layer of an OCB mode has a so-called π-cell structure. In the π-cell structure, liquid crystal molecules are aligned so that their pretilt angles are plane-symmetric with respect to the center plane between an active matrix substrate and a counter substrate. An orientation state in a π-cell structure is splay orientation when a voltage is not applied between the substrates, and then shifts to bend orientation when a voltage is applied therebetween. In this bend orientation state, white display is obtained. When a voltage is applied further, liquid crystal molecules of bend orientation get orientated perpendicular to the both substrates so that light is not transmitted. With the OCB mode, response which is 10 times as rapid as that of a conventional TN mode can be achieved.

Moreover, as a mode for the FS method, an HV (Half-V)-FLC or an SS (Surface stabilized)-FLC using ferroelectric liquid crystal (FLC) capable of high-speed operation, or the like may be used. The OCB mode can use nematic liquid crystal having relatively low viscosity, and the HV-FLC or the SS-FLC can use a smectic liquid crystal having a ferroelectric phase.

Moreover, optical response speed of a liquid crystal display module gets higher by narrowing of the cell gap of the liquid crystal display module. In addition, the optical response speed can also get higher by decrease in viscosity of the liquid crystal material. The increase in response speed is particularly effective when a pixel pitch in a pixel region of a TN mode liquid crystal display module is 30 μm or less. Also, further increase in response speed is possible by an overdrive method in which an applied voltage is increased (or decreased) for a moment.

FIG. 20B shows a transmissive liquid crystal display module, in which a red light source 2910*a*, a green light source 2910*b*, and a blue light source 2910*c* are provided as light sources. The light sources are provided with a control portion 2912 in order to switch on or off of the red light source 2910*a*, the green light source 2910*b*, and the blue light source 2910*c*. The control portion 2912 controls light emission of each color, light enters the liquid crystal, and images are combined using time division, so that color display is performed.

Thus, a high definition and highly reliable liquid crystal display module can be manufactured by the present invention.

This embodiment mode can be combined with any of Embodiment Modes 1 to 3, and 9 to 13.

Embodiment Mode 16

Figure 27:
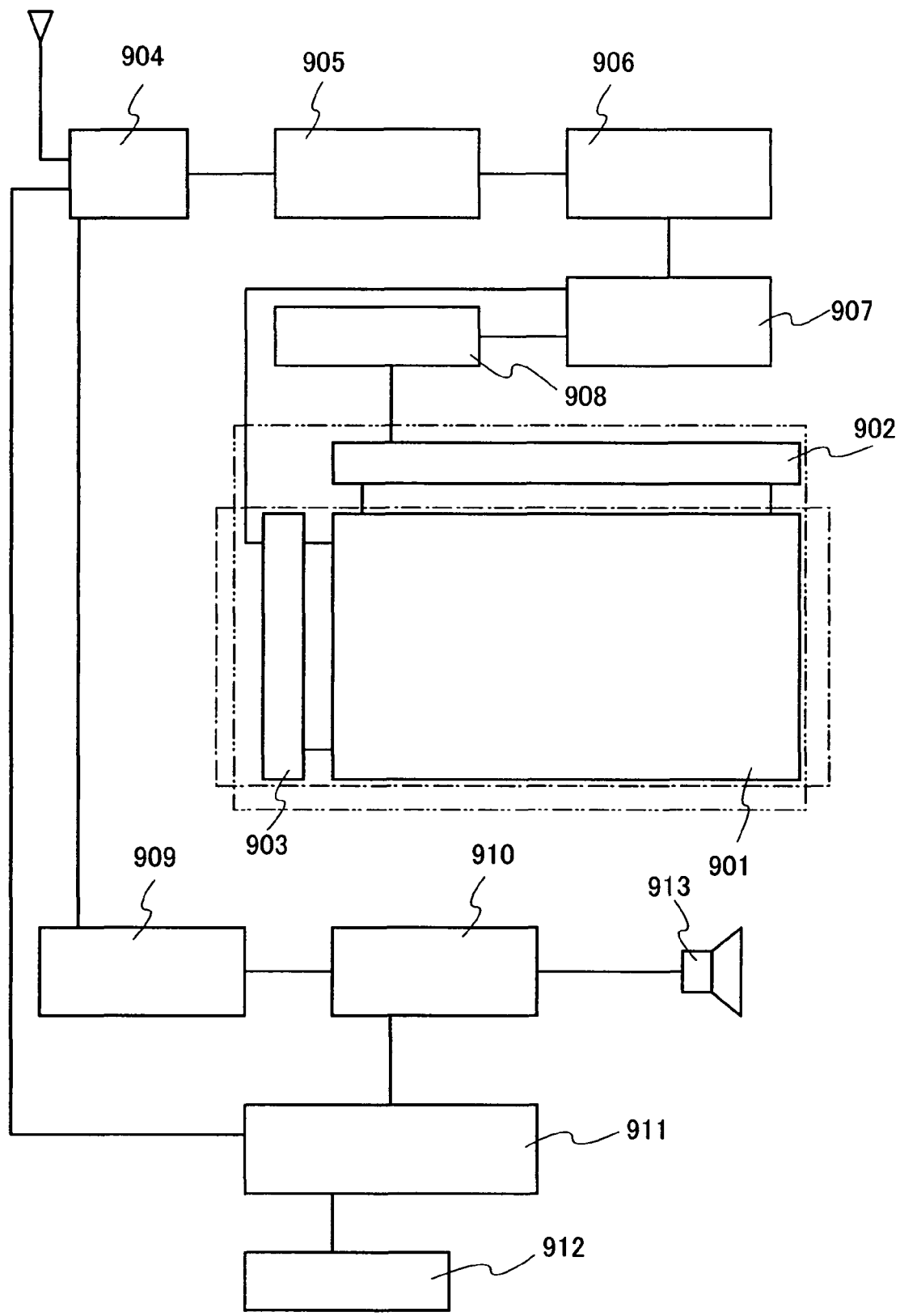
FIG. 27 is a block diagram showing a main structure of an electronic appliance to which the present invention is applied.

A television set (also referred to as a TV simply or a television receiver) can be completed using a display device formed by the present invention. FIG. 27 is a block diagram showing a main structure of a television set.

FIG. 25A is a top plan view showing a structure of a display panel of the present invention, in which a pixel portion 2701 where pixels 2702 are arranged in matrix, a scan line input terminal 2703, and a signal line input terminal 2704 are formed over a substrate 2700 having an insulating surface. The number of pixels may be set in accordance with various standards: the number of pixels of XGA for RGB full-color display may be 1024×768×3 (RGB), that of UXGA for RGB full-color display may be 1600×1200×3 (RGB), and that corresponding to a full-speck high vision for RGB full-color display may be 1920×1080×3 (RGB).

Scan lines which extend from the scan line input terminal 2703 intersects with signal lines which extend from the signal line input terminal 2704, so that the pixels 2702 are arranged in matrix. Each pixel in the pixel portion 2701 is provided with a switching element and a pixel electrode layer connected to the switching element. A typical example of the switching element is a TFT. A gate electrode layer side of the TFT is connected to the scan line, and a source or drain side thereof is connected to the signal line, so that each pixel can be controlled independently by a signal inputted externally.

FIG. 25A shows a structure of the display panel in which signals inputted to a scan line and a signal line are controlled by an external driver circuit. Alternatively, driver ICs 2751 may be mounted on the substrate 2700 by a COG (Chip on Glass) method as shown in FIG. 26A. Alternatively, a TAB (Tape Automated Bonding) method may be employed as shown in FIG. 26B. The driver ICs may be ones formed over a single crystalline semiconductor substrate or may be circuits that are each formed using a TFT over a glass substrate. In FIGS. 26A and 26B, each driver IC 2751 is connected to an FPC (Flexible Printed Circuit) 2750.

Further, in the case where a TFT provided in a pixel is formed using semiconductor having high crystallinity, a scan line driver circuit 3702 may be formed over a substrate 3700 as shown in FIG. 25B. In FIG. 25B, a pixel portion 3701 which is connected to a signal line input terminal 3704 is controlled by an external driver circuit similar to that in FIG. 25A. In the case where a TFT provided in a pixel is formed using a polycrystalline (microcrystalline) semiconductor, a single crystalline semiconductor, or the like with high mobility, a pixel portion 4701, a scan line driver circuit 4702, and a signal line driver circuit 4704 can be formed over a substrate 4700 as shown in FIG. 25C.

In FIG. 27, a display panel can be formed in any mode as follows: as the structure shown in FIG. 25A, only a pixel portion 901 is formed, and a scan line driver circuit 903 and a signal line driver circuit 902 are mounted by a TAB method as shown in FIG. 26B or by a COG method as shown in FIG. 26A; a TFT is formed, and a pixel portion 901 and a scan line driver circuit 903 are formed over a substrate, and a signal line driver circuit 902 is separately mounted as a driver IC as shown in FIG. 25B; a pixel portion 901, a signal line driver circuit 902, and a scan line driver circuit 903 are formed over one substrate as shown in FIG. 25C; and the like.

In FIG. 27, as a structure of other external circuits, a video signal amplifier circuit 905 for amplifying a video signal among signals received by a tuner 904, a video signal processing circuit 906 for converting the signals outputted from the video signal amplifier circuit 905 into chrominance signals corresponding to colors of red, green, and blue respectively, a control circuit 907 for converting the video signal so as to be inputted to a driver IC, and the like are provided on an input side of the video signal. The control circuit 907 outputs signals to both a scan line side and a signal line side. In the case of digital driving, a signal dividing circuit 908 may be provided on the signal line side and an input digital signal may be divided into m pieces to be supplied.

Among signals received by the tuner 904, an audio signal is transmitted to an audio signal amplifier circuit 909, and the output thereof is supplied to a speaker 913 through an audio signal processing circuit 910. A control circuit 911 receives control information on a receiving station (receiving frequency) or sound volume from an input portion 912 and transmits the signal to the tuner 904 or the audio signal processing circuit 910.

Figure 28A:
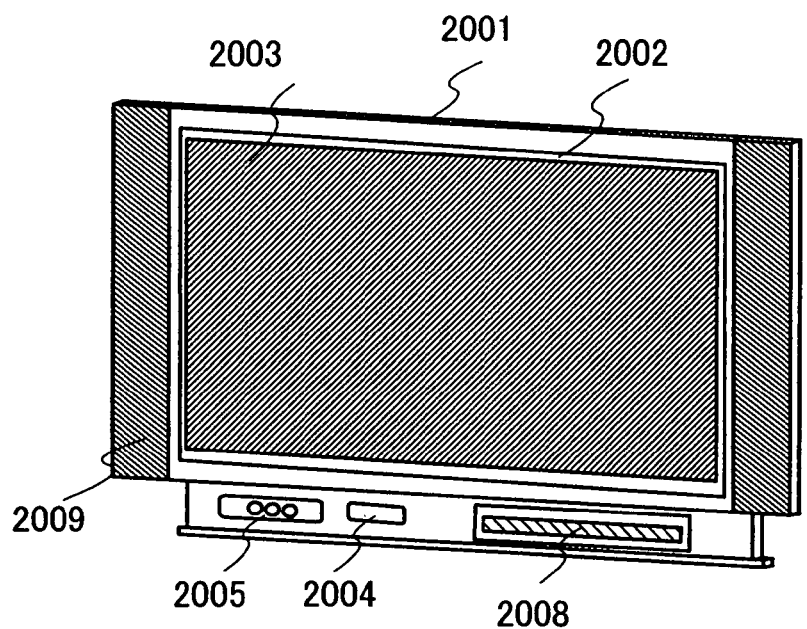
FIGS. 28A and 28B are views each showing an electronic appliance to which the present invention is applied.
Figure 28B:
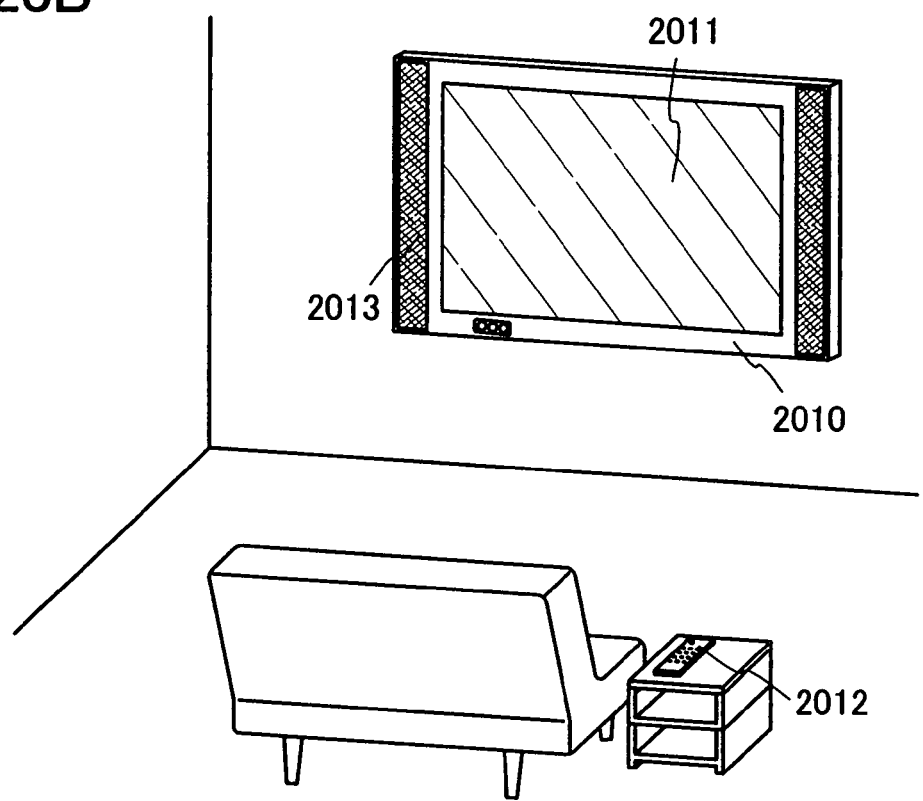

A television set can be completed by incorporating of the display module into a chassis as shown in FIGS. 28A and 28B. When a liquid crystal display module is used as a display module, a liquid crystal television set can be manufactured. When an EL display module is used, an EL television set can be manufactured. Alternatively, a plasma television, electronic paper, or the like can be manufactured. In FIG. 28A, a main screen 2003 is formed using the display module, and a speaker portion 2009, an operation switch, and the like are provided as its accessory equipment. Thus, a television set can be completed by the present invention.

A display panel 2002 is incorporated in a chassis 2001. With the use of a receiver 2005, in addition to reception of general TV broadcast, communication of information can also be performed in one way (from a transmitter to a receiver) or in two ways (between a transmitter and a receiver or between receivers) by connection to a wired or wireless communication network through a modem 2004. The television set can be operated by switches incorporated in the chassis or by a remote control device 2006 separated from the main body. A display portion 2007 that displays information to be outputted may also be provided in this remote control device.

In addition, in the television set, a structure for displaying a channel, sound volume, or the like may be additionally provided by formation of a subscreen 2008 with a second display panel in addition to the main screen 2003. In this structure, the main screen 2003 and the subscreen 2008 can be formed using a liquid crystal display panel of the present invention. Alternatively, the main screen 2003 may be formed using an EL display panel superior in a viewing angle, and the subscreen 2008 may be formed using a liquid crystal display panel capable of displaying with low power consumption. In order to prioritize low power consumption, a structure in which the main screen 2003 is formed using a liquid crystal display panel, the subscreen 2008 is formed using an EL display panel, and the sub-screen is able to flash on and off may be employed. By the present invention, a highly reliable display device can be manufactured even with the use of such a large substrate, many TFTs, and electronic components.

FIG. 28B shows a television set having a large display portion, for example, 20-inch to 80-inch display portion, which includes a chassis 2010, a display portion 2011, a remote control device 2012 which is an operation portion, a speaker portion 2013, and the like. The present invention is applied to manufacture of the display portion 2011. The television set shown in FIG. 28B is a wall-hanging type, and does not need a wide space.

It is necessary to say that the present invention is not limited to the television set and is also applicable to various uses as, in particular, a display medium with a large area, for example, a monitor of a personal computer, an information display board at a train station, an airport, or the like, or an advertisement display board on the street.

This embodiment mode can be freely combined with any of Embodiment Modes 1 to 15 as appropriate.

Embodiment Mode 17

Electronic appliances of the present invention include a television set (also referred to as a TV simply or a television receiver), cameras such as a digital camera and a digital video camera, a mobile phone set (also simply referred to as a mobile phone simply), a portable information terminal such as a PDA, a portable game machine, a monitors for a computer, a computer, an audio reproducing device such as a car audio set, an image reproducing device provided with a recording medium, such as a home-use game machine, and the like. Specific examples thereof is described with reference to FIGS. 29A to 29E.

Figure 29A:
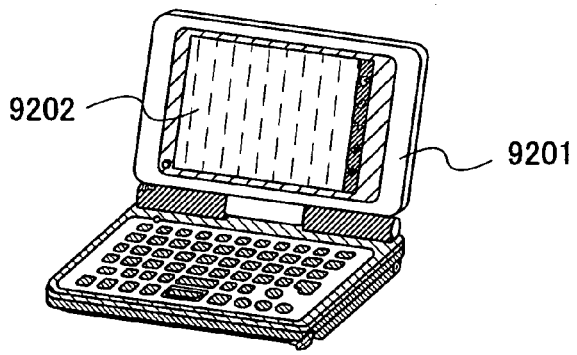
FIGS. 29A to 29E are views each showing an electronic appliance to which the present invention is applied.

A portable information terminal shown in FIG. 29A includes a main body 9201, a display portion 9202, and the like. The display device of the present invention can be applied to the display portion 9202. Accordingly, being manufactured through a simplified process at low cost, a portable information terminal which is highly reliable can be provided at low cost.

Figure 29B:
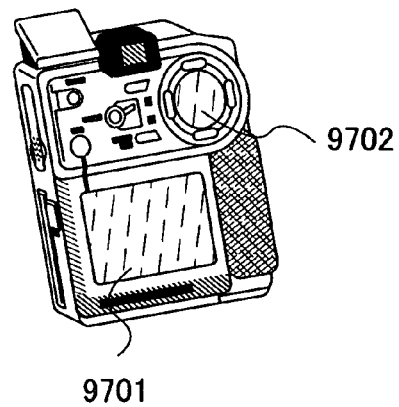

A digital video camera shown in FIG. 29B includes a display portion 9701, a display portion 9702, and the like. The display device of the present invention can be applied to the display portion 9701. Accordingly, being manufactured through a simplified process at low cost, a digital video camera which is highly reliable can be provided at low cost.

Figure 29C:
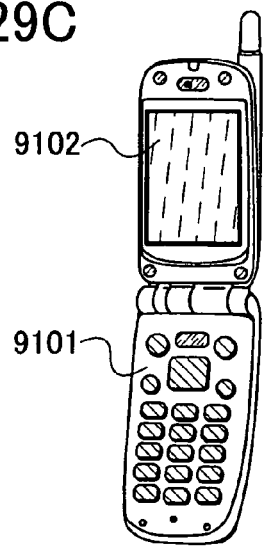

A mobile phone shown in FIG. 29C includes a main body 9101, a display portion 9102, and the like. The display device of the present invention can be applied to the display portion 9102. Accordingly, being manufactured through a simplified process at low cost, a mobile phone which is highly reliable can be provided at low cost.

Figure 29D:
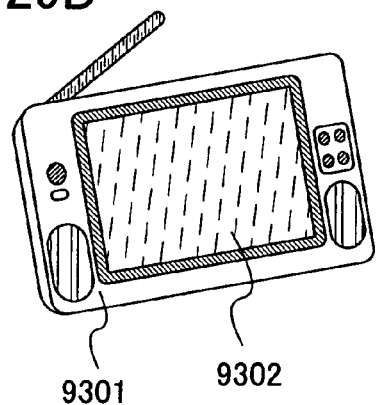

A portable television set shown in FIG. 29D includes a main body 9301, a display portion 9302, and the like. The display device of the present invention can be applied to the display portion 9302. Accordingly, being manufactured through a simplified process at low cost, a portable television set which is highly reliable can be provided at low cost. The display device of the present invention can be applied to various types of television sets including a small-sized one mounted on a portable terminal such as a mobile phone, a medium-sized one that is portable, and a large-sized one (for example, 40 inches or more in size).

Figure 29E:
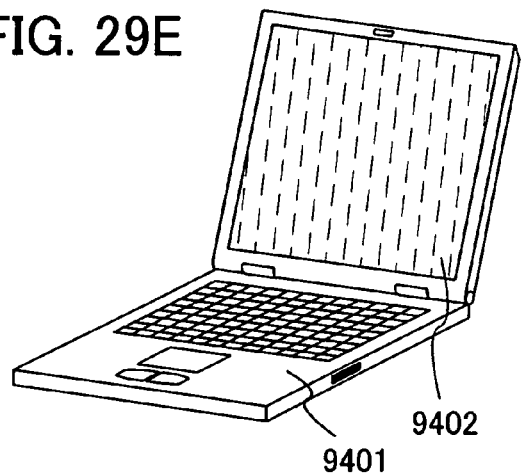

A portable computer shown in FIG. 29E includes a main body 9401, a display portion 9402, and the like. The display device of the present invention can be applied to the display portion 9402. Accordingly, being manufactured through a simplified process at low cost, a portable computer which is highly reliable can be provided at low cost.

As described above, with the use of the display device of the present invention, high-performance electronic appliances that can display an image with high quality and excellent visibility can be provided.

This embodiment mode can be freely combined with any of Embodiment Modes 1 to 16 as appropriate.

Embodiment 1

In this embodiment, an example where an opening is formed in an insulating layer by the present invention.

A conductive layer, a light absorbing layer, an insulating layer were stacked over a glass substrate. A molybdenum film (a thickness of 300 nm) as the conductive layer, a chromium film (a thickness of 20 nm) as the light absorbing layer, a silicon oxinitride film that is a silicon film containing nitride (a thickness of 1000 nm) as the insulating layer were formed using a sputtering method.

Laser light transmitted the insulating layer to be irradiated onto the light absorbing layer. The laser light was absorbed by the light absorbing layer and the heat was transmitted to the insulating layer, so that an opening was formed in the insulating layer. In this embodiment, in the case of using a fundamental wave of a continuous-wave YAG laser or a second or third harmonic of a pulsed YAG laser as laser light, an opening is formed in the insulating layer.

In the case of using a fundamental wave of a continuous-wave YAG laser as laser light, conditions for laser irradiation was that laser output was 480 W and irradiation time was 1.4 ms. A diameter of the opening was 100 μm, which was $3 \times 10^5$ W/cm$^2$ in terms of energy density ($5 \times 10^2$ J/cm$^2$ in the case of Joule conversion).

In the case of using a second or third harmonic of a pulsed YAG laser as laser light, conditions for laser irradiation was that laser output was 2 μJ and laser pulse width was 5 ns. A diameter of the opening was 15 μm, which was approximately $2 \times 10^8$ W/cm$^2$ in terms of energy density (1 J/cm$^2$ in the case of Joule conversion).

As described in this embodiment, it could be confirmed that even when laser light was not absorbed by the insulating layer, by formation of the light absorbing layer below the insulating layer by the present invention, laser light could transmit the insulating layer and is irradiated onto the light absorbing layer, so that an opening could be formed in the insulating layer.

Since the opening can be selectively formed by laser light, a mask layer is not necessary to be formed, and the steps and materials can be reduced. In addition, there are advantages that a conductive layer and an insulating layer to be processed can be formed into a predetermined shape with high precision since the laser light can be condensed into an extremely small spot, and the regions other than the processing region is not necessary to be heated substantially since heating is performed instantaneously.

Thus, an opening (contact hole) which electrically connects conductive layers can be formed in an insulating layer by irradiation with laser light without performing of a complicated photolithography step and formation of a mask layer.

Accordingly, when a display device is manufactured using the present invention, the process can be simplified, and loss of materials and the cost can be reduced. Therefore, a display device can be manufactured with high yield.

This application is based on Japanese Patent Application serial no. 2006-184719 filed in Japan Patent Office on Jul. 4, 2006, the entire contents of which are hereby incorporated by reference.

What is claimed is:

1. A method for manufacturing a display device comprising:
    forming a gate electrode over a first substrate;
    forming a gate insulating film over the gate electrode;
    forming a semiconductor layer over the gate insulating film;
    providing, over the first substrate, a second substrate on which a light absorbing layer is formed, so that the light absorbing layer faces the semiconductor layer;
    selectively transferring the light absorbing layer to form a source electrode and a drain electrode over the semiconductor layer;
    adding an inert gas to the source electrode and the drain electrode;
    forming an insulating layer over the source electrode and the drain electrode;
    selectively irradiating one of the source electrode and the drain electrode and the insulating layer with laser light to remove an irradiated region in the insulating layer, so that an opening is formed in the insulating layer; and
    forming a conductive film in the opening so as to be in contact with one of the source electrode and the drain electrode.

2. A method for manufacturing a display device comprising:
    forming a conductive layer;
    forming a light absorbing layer over the conductive layer;
    adding an inert gas to the light absorbing layer;
    forming an insulating layer over the light absorbing layer;
    selectively irradiating the light absorbing layer and the insulating layer with laser light to remove an irradiated region in the insulating layer, so that an opening is formed in the insulating layer; and
    forming a conductive film in the opening so as to be in contact with the light absorbing layer.

3. The method for manufacturing a display device according to claim 1, wherein the light absorbing layer is formed using a conductive material.

4. The method for manufacturing a display device according to claim 2, wherein the light absorbing layer is formed using a conductive material.

5. The method for manufacturing a display device according to claim 3, wherein the light absorbing layer is formed using one or a plurality of chromium, tantalum, silver, molybdenum, nickel, titanium, cobalt, copper, or aluminum.

6. The method for manufacturing a display device according to claim 4, wherein the light absorbing layer is formed using one or a plurality of chromium, tantalum, silver, molybdenum, nickel, titanium, cobalt, copper, or aluminum.

7. The method for manufacturing a display device according to claim 1, wherein the light absorbing layer is formed using a semiconductor material.

8. The method for manufacturing a display device according to claim 2, wherein the light absorbing layer is formed using a semiconductor material.

9. The method for manufacturing a display device according to claim 7, wherein the light absorbing layer is formed using silicon.

10. The method for manufacturing a display device according to claim 8, wherein the light absorbing layer is formed using silicon.

11. The method for manufacturing a display device according to claim 1, wherein the insulating layer transmits the laser light.

12. The method for manufacturing a display device according to claim 2, wherein the insulating layer transmits the laser light.

13. The method for manufacturing a display device according to claim 1, wherein the inert gas is a gas selected from the group consisting of helium, argon, krypton, neon, and xenon.

14. The method for manufacturing a display device according to claim 2, wherein the inert gas is a gas selected from the group consisting of helium, argon, krypton, neon, and xenon.

* * * * *